(12) United States Patent
Funayama et al.

(10) Patent No.: US 8,633,530 B2
(45) Date of Patent: Jan. 21, 2014

(54) SEMICONDUCTOR DEVICE AND METHOD OF MANUFACTURING THE SAME

(75) Inventors: Kota Funayama, Kanagawa (JP); Hiraku Chakihara, Kanagawa (JP); Yasushi Ishii, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 306 days.

(21) Appl. No.: 13/144,744

(22) PCT Filed: Oct. 23, 2009

(86) PCT No.: PCT/JP2009/068275
§ 371 (c)(1),
(2), (4) Date: Jul. 15, 2011

(87) PCT Pub. No.: WO2010/082389
PCT Pub. Date: Jul. 22, 2010

(65) Prior Publication Data
US 2011/0272753 A1    Nov. 10, 2011

(30) Foreign Application Priority Data

Jan. 15, 2009 (JP) .................... PCT/JP2009/050435

(51) Int. Cl.
*H01L 21/28* (2006.01)
*H01L 29/792* (2006.01)
*H01L 21/336* (2006.01)
*H01L 27/06* (2006.01)

(52) U.S. Cl.
USPC .... 257/299; 257/324; 257/325; 257/E29.309; 257/E27.016; 257/E21.421

(58) Field of Classification Search
USPC ........... 257/299, E29.309, E27.016, E21.421, 257/324, 325; 428/591, 239, 283
See application file for complete search history.

(56) References Cited

U.S. PATENT DOCUMENTS

| | | | |
|---|---|---|---|
| 7,087,955 B2 | 8/2006 | Kawashima et al. | |
| 7,115,954 B2 | 10/2006 | Shimizu et al. | |
| 2003/0198086 A1 | 10/2003 | Shukuri | |
| 2004/0119107 A1 | 6/2004 | Hisamoto et al. | |
| 2004/0166630 A1 | 8/2004 | Ogura et al. | |
| 2005/0269650 A1 | 12/2005 | Pidin | |
| 2005/0272198 A1* | 12/2005 | Hamamura et al. | 438/230 |
| 2006/0028868 A1 | 2/2006 | Okazaki et al. | |

(Continued)

FOREIGN PATENT DOCUMENTS

| | | |
|---|---|---|
| JP | 9-252098 A | 9/1997 |
| JP | 2002-353346 A | 12/2002 |

(Continued)

*Primary Examiner* — Cathy N Lam
(74) *Attorney, Agent, or Firm* — Miles & Stockbridge P.C.

(57) ABSTRACT

In a power feeding region of a memory cell (MC) in which a sidewall-shaped memory gate electrode (MG) of a memory nMIS (Qnm) is provided by self alignment on a side surface of a selection gate electrode (CG) of a selection nMIS (Qnc) via an insulating film, a plug (PM) which supplies a voltage to the memory gate electrode (MG) is embedded in a contact hole (CM) formed in an interlayer insulating film (9) formed on the memory gate electrode (MG) and is electrically connected to the memory gate electrode (MG). Since a cap insulating film (CAP) is formed on an upper surface of the selection gate electrode (CG), the electrical conduction between the plug (PM) and the selection gate electrode (CG) can be prevented.

15 Claims, 37 Drawing Sheets

(56) References Cited

U.S. PATENT DOCUMENTS

| | | |
|---|---|---|
| 2006/0035435 A1 | 2/2006 | Yasui et al. |
| 2007/0201272 A1 | 8/2007 | Okazaki et al. |
| 2007/0262382 A1 | 11/2007 | Ishii et al. |
| 2008/0090350 A1 | 4/2008 | Yan et al. |
| 2008/0142876 A1 | 6/2008 | Arigane et al. |
| 2008/0290401 A1 | 11/2008 | Yasui et al. |
| 2009/0078985 A1 | 3/2009 | Shukuri |
| 2009/0108378 A1 | 4/2009 | Zhu et al. |
| 2009/0122609 A1 | 5/2009 | Okazaki et al. |
| 2009/0179277 A1 | 7/2009 | Nishimura |
| 2009/0206410 A1 | 8/2009 | Mitani |
| 2009/0233431 A1 | 9/2009 | Shukuri |
| 2010/0038700 A1 | 2/2010 | Okazaki et al. |
| 2010/0157689 A1* | 6/2010 | Tanaka et al. ............ 365/185.23 |
| 2010/0200909 A1 | 8/2010 | Kawashima |
| 2010/0320524 A1 | 12/2010 | Shukuri |
| 2012/0299084 A1* | 11/2012 | Saito et al. .................... 257/324 |

FOREIGN PATENT DOCUMENTS

| | | |
|---|---|---|
| JP | 2003-045981 A | 2/2003 |
| JP | 2003-309193 A | 10/2003 |
| JP | 2004-235519 A | 8/2004 |
| JP | 2004-247633 A | 9/2004 |
| JP | 2004-303918 A | 10/2004 |
| JP | 2005-277430 A | 10/2005 |
| JP | 2005-294498 A | 10/2005 |
| JP | 2005-347679 A | 12/2005 |
| JP | 2006-049737 A | 2/2006 |
| JP | 2006-54292 A | 2/2006 |
| JP | 2007-189063 A | 7/2007 |
| JP | 2007-281092 A | 10/2007 |
| JP | 2007-311695 A | 11/2007 |
| JP | 2008-041832 A | 2/2008 |
| JP | 2008-270343 A | 11/2008 |
| JP | 2008-294088 A | 12/2008 |
| JP | 2008-294111 A | 12/2008 |
| JP | 2009-271966 A | 11/2009 |
| WO | WO 2002/043151 A1 | 5/2002 |

* cited by examiner

SEMICONDUCTOR DEVICE AND METHOD OF MANUFACTURING THE SAME

TECHNICAL FIELD

The present invention relates to a semiconductor device and a manufacturing technique of the same, and more particularly relates to a technique effectively applied to a semiconductor device provided with a MONOS (Metal Oxide Nitride Oxide Semiconductor) non-volatile memory cell having a split gate structure and to a manufacture of the same.

BACKGROUND ART

For example, Japanese Unexamined Patent Application Publication No. 2003-309193 (Patent Document 1) discloses a non-volatile memory cell transistor having a first gate electrode (control gate electrode) and a second gate electrode (memory gate electrode) disposed via an insulating film and a charge accumulating region, and the memory cell transistor is processed to have a structure in which the height of the first gate electrode from the surface of a substrate is lower than the height of the second gate electrode from the surface of the substrate or the height of a gate electrode of a transistor formed in a peripheral circuit from the surface of the substrate.

Also, Japanese Unexamined Patent Application Publication No. 2006-54292 (Patent Document 2) discloses a method in which an isolated auxiliary pattern adjacent to a selection gate electrode is disposed in a memory cell having a split gate structure, and the gap therebetween is filled with polysilicon of a sidewall gate, thereby making a contact to a wiring part formed in a self-aligning manner.

Further, Japanese Unexamined Patent Application Publication No. 2006-49737 (Patent Document 3) discloses a memory cell in which a memory gate line has a contact part formed on a sidewall of a selection gate line via an insulating film and extending over from a second part of the selection gate line to a device isolation region in the X direction, and is connected to a wiring via a plug embedded in a contact hole formed in the contact part.

Furthermore, Japanese Unexamined Patent Application Publication No. 2005-347679 (Patent Document 4) discloses a method in which, when a silicon oxide film covering a memory cell selection MISFET is subjected to etching to form connection holes which reach a source and a drain in a manufacturing process of a DRAM, a silicon nitride film is formed on an upper part and a sidewall of a gate electrode of the memory cell selection MISFET, thereby forming the connection holes in a self-aligning manner.

PRIOR ART DOCUMENTS

Patent Documents

Patent Document 1: Japanese Unexamined Patent Application Publication No. 2003-309193
Patent Document 2: Japanese Unexamined Patent Application Publication No. 2006-54292
Patent Document 3: Japanese Unexamined Patent Application Publication No. 2006-49737
Patent Document 4: Japanese Unexamined Patent Application Publication No. 2005-347679

SUMMARY OF THE INVENTION

Problems to be Solved by the Invention

An EEPROM (Electrically Erasable Programmable Read Only Memory) using polycrystalline silicon as a floating electrode has been mainly used as an electrically-rewritable non-volatile memory. In the EEPROM of this structure, however, if a defect is present at any part of an oxide film surrounding the floating gate electrode, the charge stored in an accumulation node is all lost in some cases due to abnormal leakage because a charge accumulating layer is a conductor. Particularly, it is considered that this problem becomes more remarkable when miniaturization further progresses and the integration degree is more increased in the future.

Therefore, a MONOS non-volatile memory cell using a nitride film as a charge accumulating layer has been attracting attention in recent years. In this case, since the charge which contributes to data storage is accumulated in a discrete trap of the nitride film which is an insulator, even if a defect occurs at any part of an oxide film surrounding the accumulation node and causes abnormal leakage, not all of the charge of the charge accumulating layer is lost, and therefore, reliability of data retention can be improved.

A memory cell of a single transistor structure has been proposed as the MONOS non-volatile memory cell. In the case of the memory cell of this structure, the memory cell is likely to be affected by the disturbance as compared with the memory cell of the EEPROM. Therefore, a memory cell having a two-transistor split gate structure in which a selection gate electrode is provided has been further proposed.

However, the MONOS non-volatile memory cell of the split gate structure has various technical problems described below.

The MONOS non-volatile memory cells of the split gate structure include a memory cell in which a sidewall-shaped memory gate electrode is provided on a side surface of a selection gate electrode via an insulating film by self alignment. In this case, since the alignment margin of photolithography is not required and the gate length of the memory gate electrode formed by self alignment can be made to be the minimum resolution dimensions of photolithography or smaller, the memory cell can be more miniaturized as compared with a memory cell in which a memory gate electrode is formed by using a photoresist film.

In the case where the sidewall-shaped memory gate electrode is employed, for example, the electrical extraction to the outside thereof uses a pad electrode 51 made of a conductive film of the same layer as the memory gate electrode MG as shown in FIG. 27. More specifically, the sidewall-shaped memory gate electrode MG is formed on the sidewall of a selection gate electrode CG by self alignment, and at the same time, the pad electrode 51 is formed in a power feeding region (shunt part) of the memory gate electrode MG by using a photoresist mask, and thereafter, a contact hole 52 which reaches the pad electrode 51 is formed in the interlayer insulating film formed on the memory gate electrode MG. Then, the memory gate electrode MG and a conductive film embedded in the contact hole 52 are electrically connected to each other. The pad electrode 51 has the shape that is placed over the selection gate electrode CG in consideration of the alignment margin, dimension variation margin and others of the memory gate electrode MG and the pad electrode 51.

However, since the pad electrode 51 is formed so as to cover an uneven part of the selection gate electrode CG, in the photolithography which forms a photoresist mask, the misfocusing occurs due to the unevenness, and the processing accuracy of the photoresist mask is deteriorated. As a result, the defect in the shape of the pad electrode 51 occurs in some cases. The reduction in the area of the power feeding region is desired for increasing the integration degree of a semiconductor device. However, in order to avoid the defect in the shape of the pad electrode 51, the planar area of the pad electrode 51 cannot be reduced, and it is difficult to reduce the area of the power feeding region.

Moreover, the thickness of the photoresist applied on the upper surface of the conductive film placed over the selection gate electrode CG is generally smaller than the thickness of the photoresist applied on the part other than the upper surface of the conductive film placed over the selection gate electrode CG. Therefore, in dry etching of the conductive film using the photoresist as a mask, the photoresist applied on the upper surface of the conductive film placed over the selection gate electrode CG is removed by etching faster than the photoresist applied on the part other than the upper surface of the conductive film placed over the selection gate electrode CG, and the conductive film placed over the selection gate electrode CG is ground down, which causes the problem of the defect in the shape of the pad electrode 51. If a pad electrode having a predetermined shape cannot be obtained, the resistance between the pad electrode 51 and a plug connected to the pad electrode 51 via the contact hole 52 is increased or electricity is not conducted therebetween, and the manufacturing yield is reduced.

An object of the present invention is to provide the technique capable of increasing the integration degree in a semiconductor device having a non-volatile memory cell of a split gate structure.

Also, another object of the present invention is to provide the technique capable of improving the manufacturing yield in a semiconductor device having a non-volatile memory cell of a split gate structure.

The above and other objects and novel characteristics of the present invention will be apparent from the description of the present specification and the accompanying drawings.

Means for Solving the Problems

The following is a brief description of an outline of the typical invention disclosed in the present application.

A semiconductor device according to the present invention is a semiconductor device having a non-volatile memory cell. The non-volatile memory cell includes: a first gate insulating film formed on a semiconductor substrate; a selection gate electrode made of a first conductive film formed on the first gate insulating film; a cap insulating film formed on the selection gate electrode; a memory gate electrode made of a second conductive film formed in a sidewall shape on one side surface of a stacked film made up of the cap insulating film and the selection gate electrode; and a second gate insulating film formed between the stacked film made up of the cap insulating film and the selection gate electrode and the memory gate electrode and formed also between the memory gate electrode and the semiconductor substrate, and in a region in which a plug supplying a voltage to the memory gate electrode is formed, a contact hole is formed in an interlayer insulating film formed on the cap insulating film and the memory gate electrode, and the plug embedded in the contact hole is electrically connected to the memory gate electrode.

A semiconductor device according to the present invention is a semiconductor device having a memory cell. The memory cell includes: a first gate insulating film formed on a semiconductor substrate; a selection gate electrode made of a first conductive film formed on the first gate insulating film; a cap insulating film formed on the selection gate electrode; a memory gate electrode made of a second conductive film formed in a sidewall shape on one side surface of a stacked film made up of the cap insulating film and the selection gate electrode; a second gate insulating film formed between the stacked film made up of the cap insulating film and the selection gate electrode and the memory gate electrode and formed also between the memory gate electrode and the semiconductor substrate; and a drain region formed in the semiconductor substrate on a side of the selection gate electrode opposite to the memory gate electrode, and in a region in which the memory cell is formed, a contact hole is formed in an interlayer insulating film formed on the cap insulating film and the drain region, and the plug embedded in the contact hole is electrically connected to the drain region.

A method of manufacturing a semiconductor device according to the present invention is a method of manufacturing a semiconductor device having a memory cell. A process of forming the memory cell includes: (a) a step of forming a first gate insulating film on a semiconductor substrate; (b) a step of forming a first conductive film on the first gate insulating film; (c) a step of forming a second insulating film on the first conductive film; (d) a step of sequentially processing the second insulating film and the first conductive film to form a selection gate electrode made of the first conductive film and a cap insulating film made of the second insulating film on the selection gate electrode; (e) a step of removing the cap insulating film on the selection gate electrode of a region in which a second plug supplying a voltage to the selection gate electrode is formed, while leaving the cap insulating film on the selection gate electrode of a region in which the memory cell is formed; (f) after the step (e), a step of forming a second gate insulating film on the semiconductor substrate; (g) a step of forming a second conductive film on the second gate insulating film; (h) a step of subjecting the second conductive film to anisotropic etching to form a memory gate electrode in a sidewall shape on a side surface of a stacked film made up of the cap insulating film and the selection gate electrode; (i) after the step (h), a step of forming a source region and a drain region in the semiconductor substrate in a region in which the memory cell is formed; and (j) after the step (i), a step of forming a silicide layer on an upper surface of the memory gate electrode, an upper surface of the selection gate electrode from which the cap insulating film is removed in the step (e), and upper surfaces of the source region and the drain region.

A method of manufacturing a semiconductor device according to the present invention is a method of manufacturing a semiconductor device having a memory cell. A process of forming the memory cell includes: (a) a step of forming a first gate insulating film on a semiconductor substrate; (b) a step of forming a first conductive film on the first gate insulating film; (c) a step of forming a second insulating film on the first conductive film; (d) a step of sequentially processing the second insulating film and the first conductive film to form a selection gate electrode made of the first conductive film and a cap insulating film made of the second insulating film on the selection gate electrode; (e) after the step (d), a step of forming a second gate insulating film on the semiconductor substrate; (f) a step of forming a second conductive film on the second gate insulating film; (g) a step of subjecting the second conductive film to anisotropic etching to form a memory gate electrode in a sidewall shape on a side surface of a stacked film made up of the cap insulating film and the selection gate electrode; (h) after the step (g), a step of forming a source region and a drain region in the semiconductor substrate; (i) after the step (h), a step of forming a silicide layer on upper surfaces of the memory gate electrode, the source region and the drain region; (j) a step of forming an interlayer insulating film on the semiconductor substrate, the cap insulating film and the memory gate electrode; (k) a step of forming a contact hole in the interlayer insulating film; and (l) a step of embedding a third conductive film in the contact hole to form a third plug connected to the silicide layer on the upper surface of the drain region, and the third plug is formed also on the cap insulating film.

Effects of the Invention

The effects obtained by typical embodiments of the invention disclosed in the present application will be briefly described below.

The integration degree can be increased in a semiconductor device having a non-volatile memory cell of a split gate structure.

The manufacturing yield can be improved in a semiconductor device having a non-volatile memory cell of a split gate structure.

BRIEF DESCRIPTIONS OF THE DRAWINGS

Figure 36:
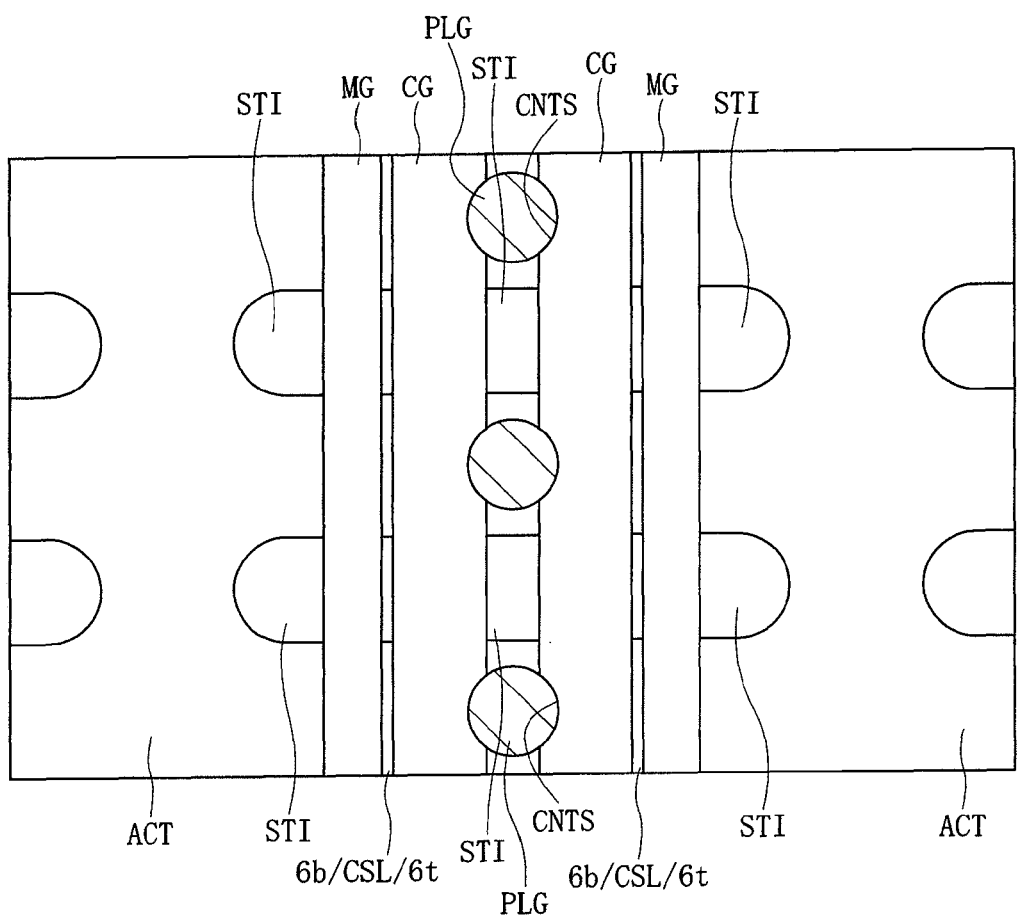
Figure 37:
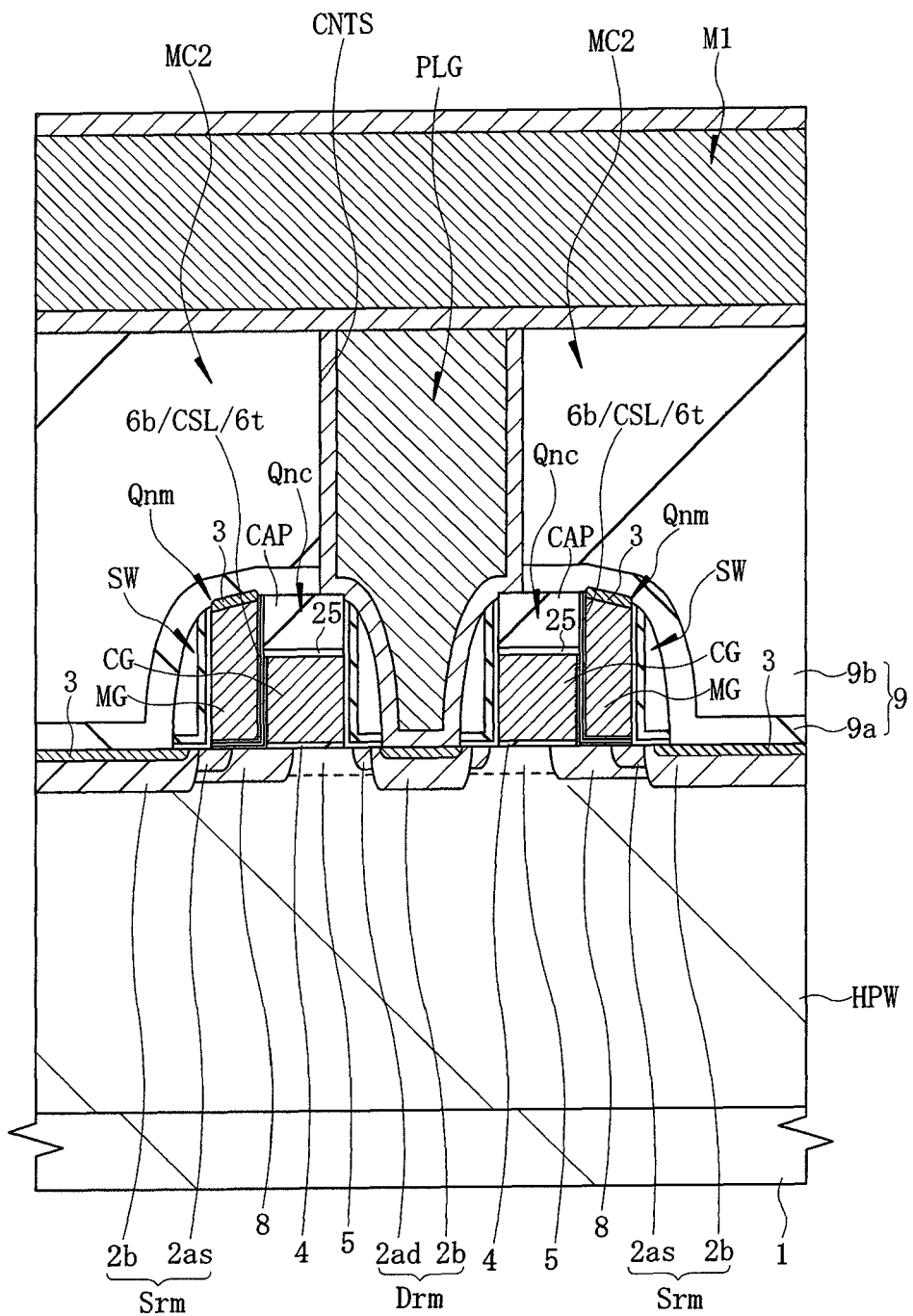

FIG. 36 is a plan view of a main part showing a second modification example of a contact hole formed in the memory region of the non-volatile memory cell according to the third embodiment of the present invention; and FIG. 37 is a cross-sectional view of a main part showing a third modification example of a contact hole formed in the memory region of the non-volatile memory cell according to the third embodiment of the present invention.

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, in the drawings used in the embodiments, hatching is used even in a plan view so as to make the drawings easy to see. In the following embodiments, a metal insulator semiconductor field effect transistor (MISFET) representing a field effect transistor is abbreviated as "MIS", a p-channel type MISFET is abbreviated as "pMIS", and an n-channel type MISFET is abbreviated as "nMIS". Also, it goes without saying that the MONOS memory cell described in the following embodiments is also included in the narrower concept of the MIS mentioned above. Further, when silicon nitride is mentioned in the following embodiments, it of course includes $Si_3N_4$ and also an insulating film made of nitride of silicon having similar composition. Furthermore, in the following embodiments, the term "wafer" mainly indicates a silicon (Si) single-crystal wafer and it indicates not only the same but also a silicon on insulator (SOI) wafer, an insulating film substrate for forming an integrated circuit thereon and the like. The shape of the wafer includes not only a circular shape or a substantially circular shape but also a square shape, a rectangular shape, and the like.

Note that components having the same function are denoted by the same reference symbols throughout the drawings for describing the embodiments, and the repetitive description thereof will be omitted. Hereinafter, embodiments of the present invention will be described in detail with reference to the accompanying drawings.

First Embodiment

Figure 1:
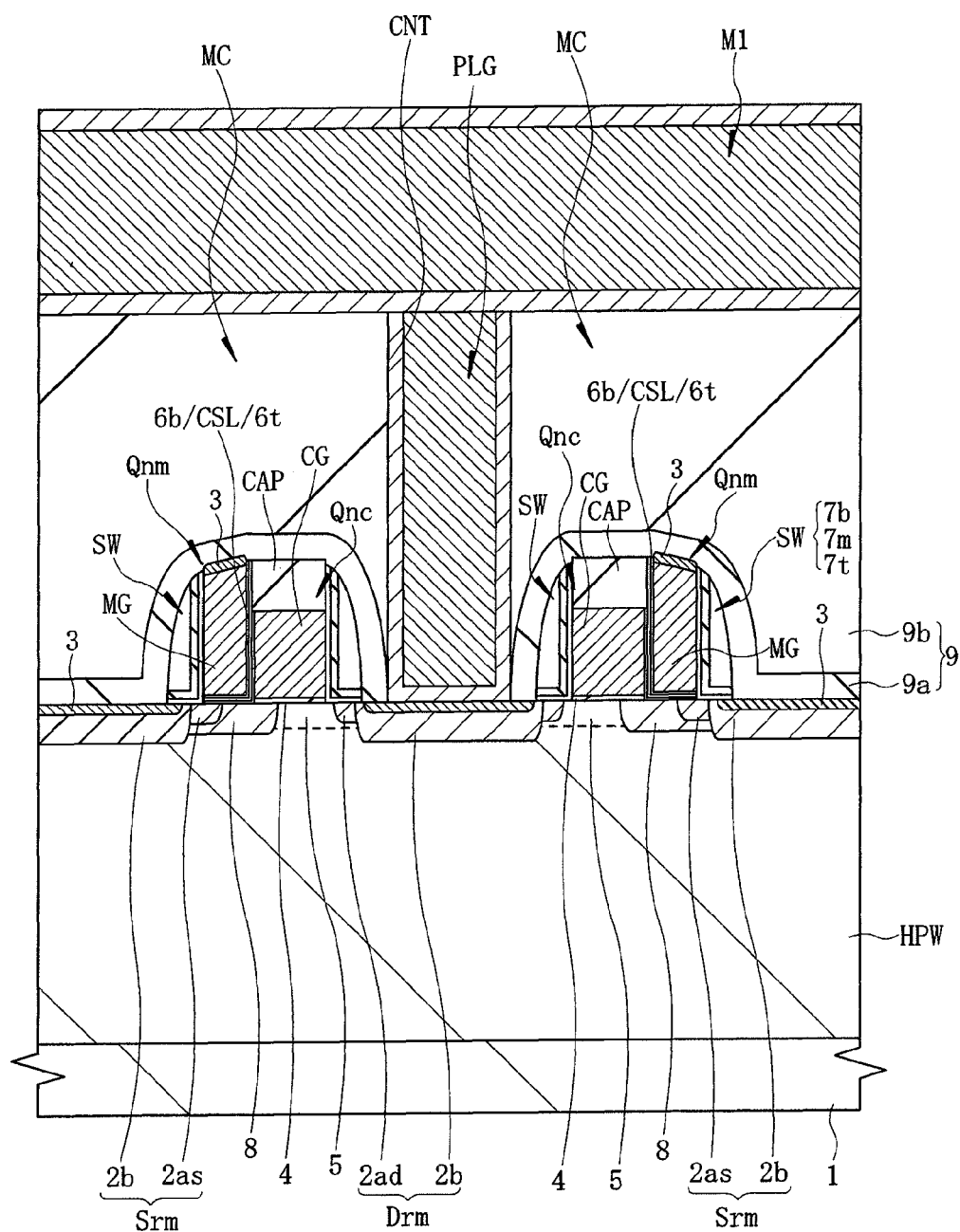
FIG. 1 is a cross-sectional view of a main part of a non-volatile memory cell according to a first embodiment of the present invention showing a section taken by cutting a channel of the non-volatile memory cell along the direction that intersects with a memory gate electrode.
Figure 2:
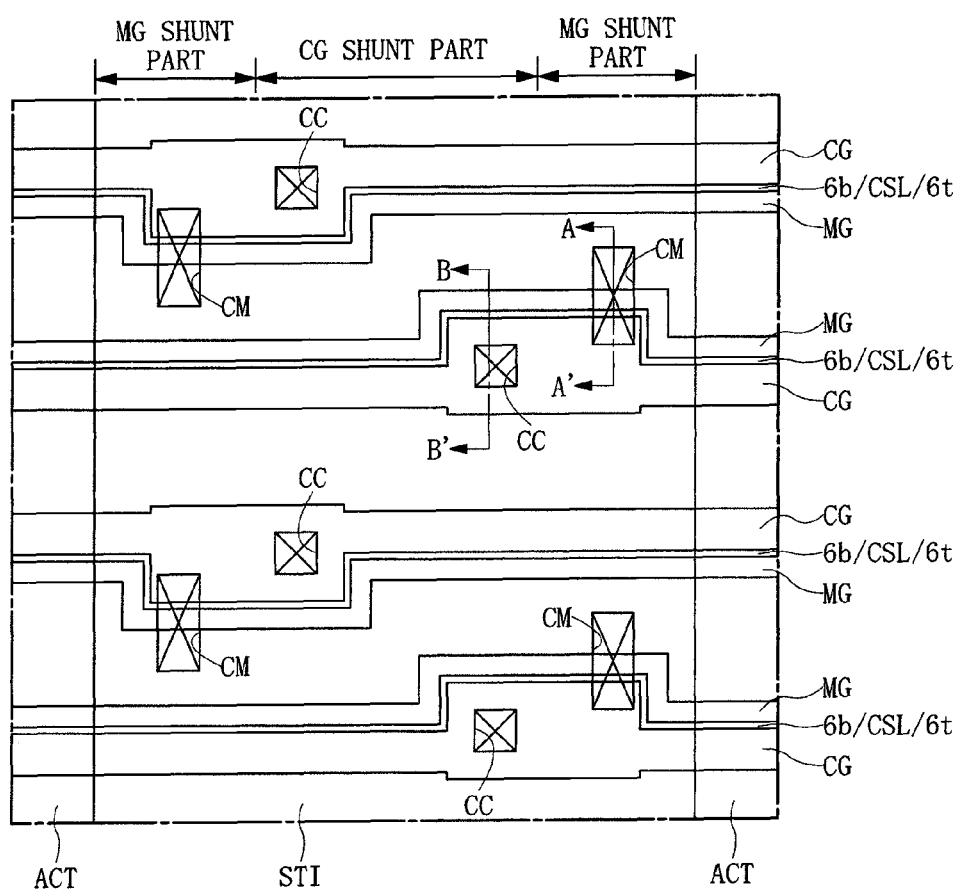
FIG. 2 is a plan view of a main part of a power feeding region of the non-volatile memory cell according to the first embodiment of the present invention.

An example of the structure of a non-volatile memory cell according to a first embodiment of the present invention will be described with reference to FIG. 1, and an example of the structure of a power feeding region of a memory gate electrode and a selection gate electrode constituting the non-volatile memory cell will be described with reference to FIG. 2 and FIG. 3. FIG. 1 is a cross-sectional view of a main part of the non-volatile memory cell showing a section taken by cutting a channel along the direction that intersects with a memory gate electrode, FIG. 2 is a plan view of a main part of the power feeding region, and FIGS. 3A and 3B are a cross-sectional view of a main part taken along the line A-A' of FIG. 2 (cross-sectional view of the main part of a shunt part of the memory gate electrode) and a cross-sectional view of a main part taken along the line B-B' of FIG. 2 (cross-sectional view of the main part of the shunt part of the selection gate electrode), respectively. Here, a MONOS non-volatile memory cell of a split gate structure employing a sidewall-shaped memory gate electrode is shown as an example.

First, the structure of the non-volatile memory cell formed in a memory region (region in which memory cells are formed) will be described.

As shown in FIG. 1, a semiconductor substrate 1 is made of, for example, p-type single crystalline silicon, and in an active region of a main surface (device formation surface) thereof, a selection nMIS (Qnc) and a memory nMIS (Qnm) of a memory cell MC are disposed. A drain region Drm of the memory cell MC has, for example, an $n^-$-type semiconductor region 2ad having a relatively low concentration and a relatively-high-concentration $n^+$-type semiconductor region 2b having an impurity concentration higher than that of the $n^-$-type semiconductor region 2ad (LDD (Lightly Doped Drain) structure). Also, a source region Srm of the memory cell MC has, for example, an $n^-$-type semiconductor region 2as having a relatively low concentration and a relatively-high-concentration $n^+$-type semiconductor region 2b having an impurity concentration higher than that of the $n^-$-type semiconductor region 2as (LDD structure). The $n^-$-type semiconductor regions 2ad and 2as are disposed on the channel region side of the memory cell MC, and the $n^+$-type semiconductor regions 2b are disposed at the positions away from the channel region side of the memory cell MC by the distance corresponding to the $n^-$-type semiconductor regions 2ad and 2as, respectively.

On the main surface of the semiconductor substrate 1 between the drain region Drm and the source region Srm, a selection gate electrode CG of the selection nMIS (Qnc) and a memory gate electrode MG of the memory nMIS (Qnm) extend adjacent to each other, and in the extending direction, the plurality of memory cells MC are adjacent to each other via a device isolation part STI (Shallow Trench Isolation) formed in the semiconductor substrate 1. A cap insulating film CAP is formed on the upper surface of the selection gate electrode CG. The memory gate electrode MG is formed in a sidewall shape on one side surface of the stacked film made up of the cap insulating film CAP and the selection gate electrode CG. The selection gate electrode CG is made of a first conductive film, for example, n-type low-resistance polycrystalline silicon, and the gate length of the selection gate electrode CG is, for example, about 80 to 120 nm. Also, the memory gate electrode MG is made of a second conductive film, for example, n-type low-resistance polycrystalline silicon, and the gate length of the memory gate electrode MG is, for example, about 50 to 100 nm. The cap insulating film CAP is made of a second insulating film, for example, silicon nitride, silicon oxide, silicon oxide containing nitrogen or silicon carbide containing nitrogen and has a thickness of, for example, about 50 nm. Further, the height of the selection gate electrode CG from the main surface of the semiconductor substrate 1 is, for example, about 140 nm, and the height of the memory gate electrode MG from the main surface of the semiconductor substrate 1 is formed to be higher by about 50 nm than the height of the selection gate electrode CG from the main surface of the semiconductor substrate 1.

Furthermore, a silicide layer 3 such as nickel silicide (NiSi) or cobalt silicide ($CoSi_2$) is formed on the upper surface of the memory gate electrode MG. The thickness of the silicide layer 3 is, for example, about 20 nm. In the non-volatile memory cell of a split-gate structure, electric potential has to be supplied to both the selection gate electrode CG and the memory gate electrode MG, and the operating speed thereof largely depends on the resistance values of the selection gate electrode CG and the memory gate electrode MG. Therefore, it is desired to reduce the resistance of the selection gate electrode CG and the memory gate electrode MG by forming the silicide layer 3. In the present embodiment, the silicide layer 3 is formed only on the upper surface of the memory gate electrode MG, and is not formed on the upper surface of the selection gate electrode CG. However, a desired operating speed can be obtained by, for example, reducing the resistance of the first conductive film constituting the selection gate electrode CG. The above-described silicide layer 3 is formed also on the upper surface of the $n^+$-type semiconductor region 2b constituting the source region Srm or the drain region Drm.

A gate insulating film (first gate insulating film) 4 is provided between the selection gate electrode CG and the main surface of the semiconductor substrate 1. The gate insulating film 4 is made of a first insulating film, for example, silicon oxide and has a thickness of, for example, about 1 to 5 nm. Therefore, the selection gate electrode CG is disposed on the device isolation part and on a first region of the semiconductor substrate 1 via the gate insulating film 4. A p-type semiconductor region 5 is formed by introducing, for example, boron into the main surface of the semiconductor substrate 1 (p-well HPW) below the gate insulating film 4. The semiconductor region 5 is a semiconductor region for forming the channel of the selection nMIS (Qnc), and the threshold voltage of the selection nMIS (Qnc) is set to a predetermined value by this semiconductor region 5.

The memory gate electrode MG is provided on the side surface of the selection gate electrode CG via a gate insulating film (second gate insulating film). This gate insulating film which insulates the selection gate electrode CG from the memory gate electrode MG is composed of a stacked film made up of an insulating film (fourth insulating film) 6b, a charge accumulating layer CSL and an insulating film (fifth insulating film) 6t (hereinafter, referred to as the insulating films 6b and 6t and the charge accumulating layer CSL). Also, the memory gate electrode MG is disposed on a second region of the semiconductor substrate 1 via the insulating films 6b and 6t and the charge accumulating layer CSL. Note that, in FIG. 1, the symbol of the insulating films 6b and 6t and the charge accumulating layer CSL is expressed as 6b/CSL/6t.

The charge accumulating layer CSL is made of, for example, silicon nitride and has a thickness of, for example, about 5 to 20 nm. The insulating films 6b and 6t are made of, for example, silicon oxide, and the thickness of the insulating film 6b is, for example, about 1 to 10 nm and the thickness of the insulating film 6t is, for example, about 4 to 15 nm. It is also possible to form the insulating films 6b and 6t from silicon oxide containing nitrogen.

Sidewalls SW are formed respectively on one side surface of the selection gate electrode CG (the side surface on the side opposite to the memory gate electrode MG or the side surface on the side of the drain region Drm) and one side surface of the memory gate electrode MG (the side surface on the side opposite to the selection gate electrode CG or the side surface on the side of the source region Srm). The sidewall SW is composed of, for example, a stacked film made up of a silicon oxide film 7b, a silicon nitride film 7m and a silicon oxide film 7t. The thickness of the silicon oxide film 7b is, for example, 20 nm, the thickness of the silicon nitride film 7m is, for example, 25 nm and the thickness of the silicon oxide film 7t is, for example, 50 nm.

Below the above-described insulating film 6b and in the semiconductor substrate 1 (p-well HPW) between the p-type semiconductor region 5 and the source region Srm, an n-type semiconductor region 8 is formed by introducing, for example, arsenic or phosphorous. The semiconductor region 8 is a semiconductor region for forming the channel of the memory nMIS (Qnm), and the threshold voltage of the memory nMIS (Qnm) is set to a predetermined value by this semiconductor region 8.

The memory cells MC are covered with an interlayer insulating film 9, and a contact hole (third contact hole) CNT which reaches the drain region Drm is formed in the interlayer insulating film 9. The interlayer insulating film 9 is made of a third insulating film and is composed of, for example, a stacked film made up of a silicon nitride film 9a and a silicon oxide film 9b. A first-layer wiring M1 extending in the direction intersecting with the memory gate electrode MG (or the selection gate electrode CG) is connected to the drain region Drm via a plug (third plug) PLG embedded in the contact hole CNT. The plug PLG is made of a third conductive film and is composed of, for example, a stacked film made up of a relatively-thin barrier film composed of a stacked film of titanium and titanium nitride and a relatively-thick conductive film composed of tungsten, aluminum or the like formed so as to be surrounded by the barrier film.

Next, the structures of the shunt part of the memory gate electrode and the shunt part of the selection gate electrode formed in the power feeding region will be described.

Figure 3A:
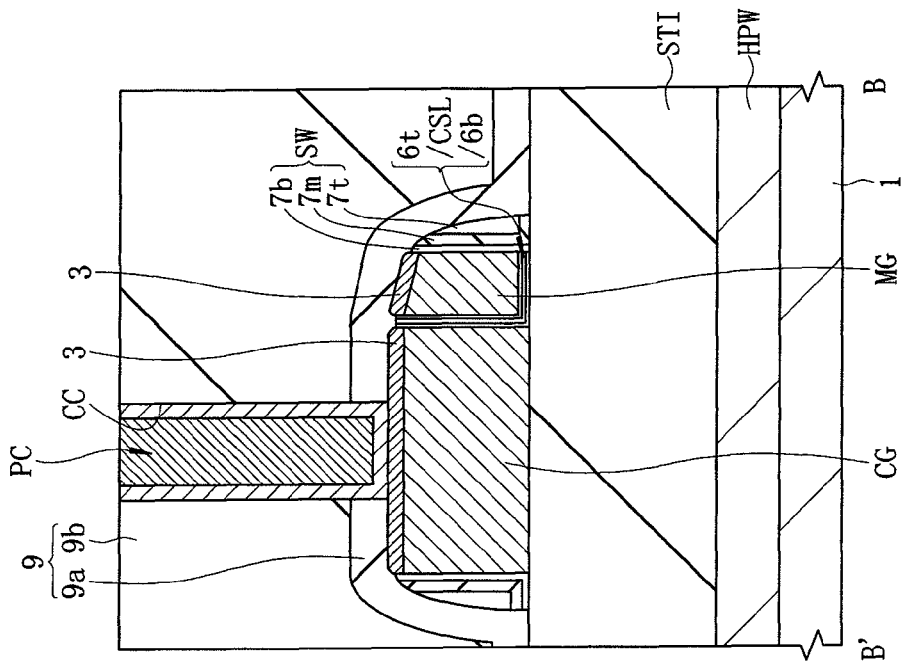
FIG. 3A is a cross-sectional view of a main part taken along the line A-A' of FIG. 2 (cross-sectional view of a main part of a shunt part of a memory gate electrode)

As shown in FIG. 2 and FIG. 3A, the structure of the shunt part of the memory gate electrode MG (hereinafter, referred to as MG shunt part) formed in the power feeding region is approximately the same as the structure of the selection nMIS (Qnc) and the memory nMIS (Qnm) formed in the memory region except that the memory gate electrode MG and the selection gate electrode CG are formed on the device isolation part STI. Further, a contact hole (first contact hole) CM which reaches the silicide layer 3 formed on the upper surface of the memory gate electrode MG formed on the side surface of the selection gate electrode CG via the insulating films 6b and 6t and the charge accumulating layer CSL is formed in the interlayer insulating film 9 of the power feeding region. This contact hole CM is formed on the device isolation part STI, the sidewall SW, the memory gate electrode MG, the insulating films 6b and 6t and the charge accumulating layer CSL of the power feeding region. Furthermore, the contact hole CM has the shape that is placed over the selection gate electrode CG, but since the cap insulating film CAP is formed on the upper surface of the selection gate electrode CG, the contact hole CM is not connected to the selection gate electrode CG. Moreover, since the contact hole CM is formed on the device isolation part STI, the contact hole CM is not connected to the semiconductor substrate 1. The memory gate electrode MG of the power feeding region is connected to the first-layer wiring (illustration omitted) via a plug (first plug) PM made of the third conductive film embedded in the contact hole CM.

Figure 3B:
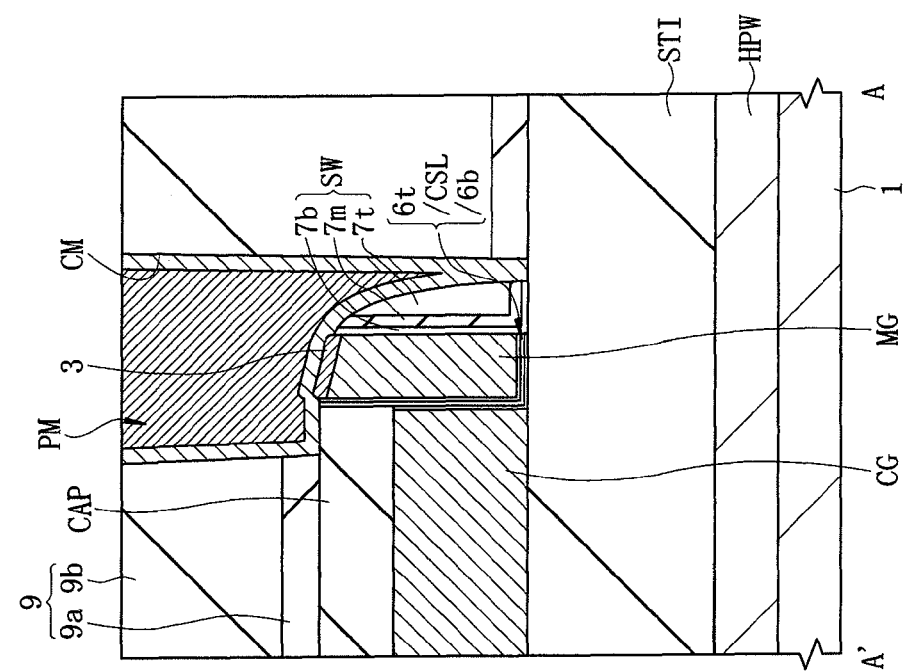
FIG. 3B is a cross-sectional view of a main part taken along the line B-B' of FIG. 2 (cross-sectional view of a main part of a shunt part of a selection gate electrode)

On the other hand, as shown in FIG. 2 and FIG. 3B, the structure of the shunt part of the selection gate electrode CG (hereinafter, CG shunt part) formed in the power feeding region is different from the structure of the selection nMIS (Qnc) formed in the memory region. In the selection nMIS (Qnc) formed in the memory region, the cap insulating film CAP is formed on the upper surface of the selection gate electrode CG thereof. However, the cap insulating film CAP is not formed on the upper surface of the selection gate electrode CG formed in the power feeding region, and the silicide layer 3 is formed on the upper surface of the selection gate electrode CG. Also, in the interlayer insulating film 9 of the power feeding region, a contact hole (second contact hole) CC which reaches the silicide layer 3 formed on the upper surface of the selection gate electrode CG is formed. The selection gate electrode CG of the power feeding region is connected to the first-layer wiring (illustration omitted) via a plug (second plug) PC made of the third conductive film embedded in the contact hole CC.

Further, in the shunt part of the selection gate electrode CG, the height of the memory gate MG is formed to be same as the height of the control gate electrode CG or lower than the height of the control gate electrode CG. Here, if the height of the memory gate is formed to be lower than the height of the control gate electrode CG, the probability of short-circuit of the silicide layer 3 formed on the memory gate MG and on the selection gate electrode CG can be reduced.

Figure 27:
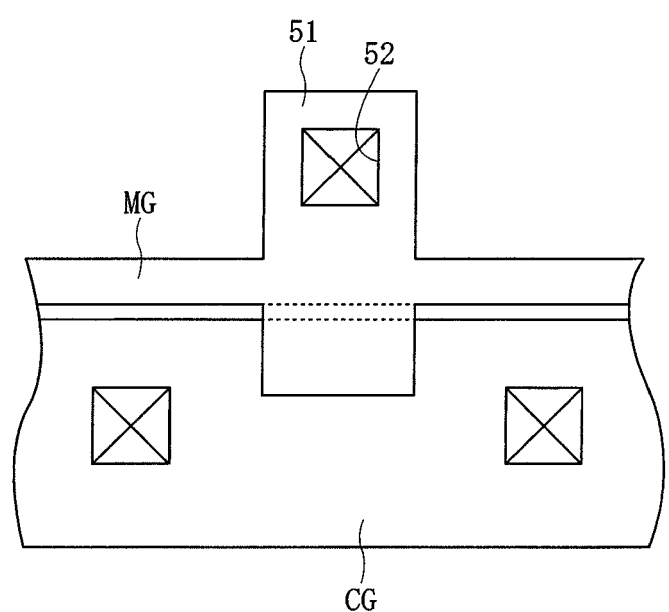
FIG. 27 is a plan view of a main part of a power feeding region of a non-volatile memory cell studied by the inventors of the present invention.

In this manner, according to the present embodiment, in the MG shunt part of the power feeding region, the memory gate electrode MG and the plug PM are electrically connected to each other by forming the contact hole CM formed in the interlayer insulating film 9 so as to reach the memory gate electrode MG of the memory nMIS (Qnm) of the power feeding region and embedding the plug PM in the contact hole CM. Therefore, since it becomes unnecessary to form the above-described pad electrode 51 shown in FIG. 27, the area of the power feeding region can be reduced, and good electrical connection can be obtained between the memory gate electrode MG and the plug PM. By this means, the area of a semiconductor device having the non-volatile memory cells can be reduced. Moreover, the manufacturing yield of the semiconductor device having the non-volatile memory cells can be improved.

Moreover, in the MG shunt part of the power feeding region, the cap insulating film CAP is formed on the upper surface of the selection gate electrode CG of the selection nMIS (Qnc), and therefore, the above-described contact hole CM does not reach the selection gate electrode CG. Accordingly, the electrical connection between the plug PM embedded in the contact hole CM and the selection gate electrode CG can be prevented. On the other hand, in the CG shunt part of the power feeding region, the cap insulating film CAP is not formed on the upper surface of the selection gate electrode CG of the selection nMIS (Qnc), but the silicide layer 3 is formed thereon. Therefore, since the contact hole CC which is formed in the interlayer insulating film 9 in the same step as the above-described contact hole CM easily reaches the silicide layer 3 on the upper surface of the selection gate electrode CG, good electrical connection can be obtained between the plug PC embedded in the contact hole CC and the selection gate electrode CG.

Moreover, since the cap insulating film CAP is formed on the upper surface of the selection gate electrode CG, it is unnecessary to consider the failure of short-circuit between the memory gate MG and the selection gate electrode CG when forming the silicide layer 3. Here, as described above, the silicide layer 3 is formed on the selection gate electrode CG in the shunt part of the selection gate electrode CG. At this time, no particular problem occurs because the insulating films 6b and 6t and the charge accumulating layer CSL are formed between the memory gate MG and the control gate electrode CG, but it is also possible to form the height of the memory gate MG to be lower than the height of the control gate electrode CG in the above-described manner in order to solve the failure of short-circuit.

Next, a method of manufacturing the semiconductor device having the non-volatile memory cell according to the first embodiment of the present invention will be described in order of steps with reference to FIG. 4 to FIG. 26. FIG. 4, FIG. 6 to FIG. 8, FIG. 10 to FIG. 12 and FIG. 14 to FIG. 25 are cross-sectional views of a main part of the memory region, the power feeding regions (the MG shunt part and the CG shunt part), a capacitive element region and peripheral circuit regions (a low-voltage nMIS region, a low-voltage pMIS region, a high-voltage nMIS region and a high-voltage pMIS region) in the manufacturing process of the semiconductor device, and FIG. 5, FIG. 9, FIG. 13 and FIG. 26 are plan views of a main part of the power feeding region in the manufacturing process of the semiconductor device.

Figure 4:
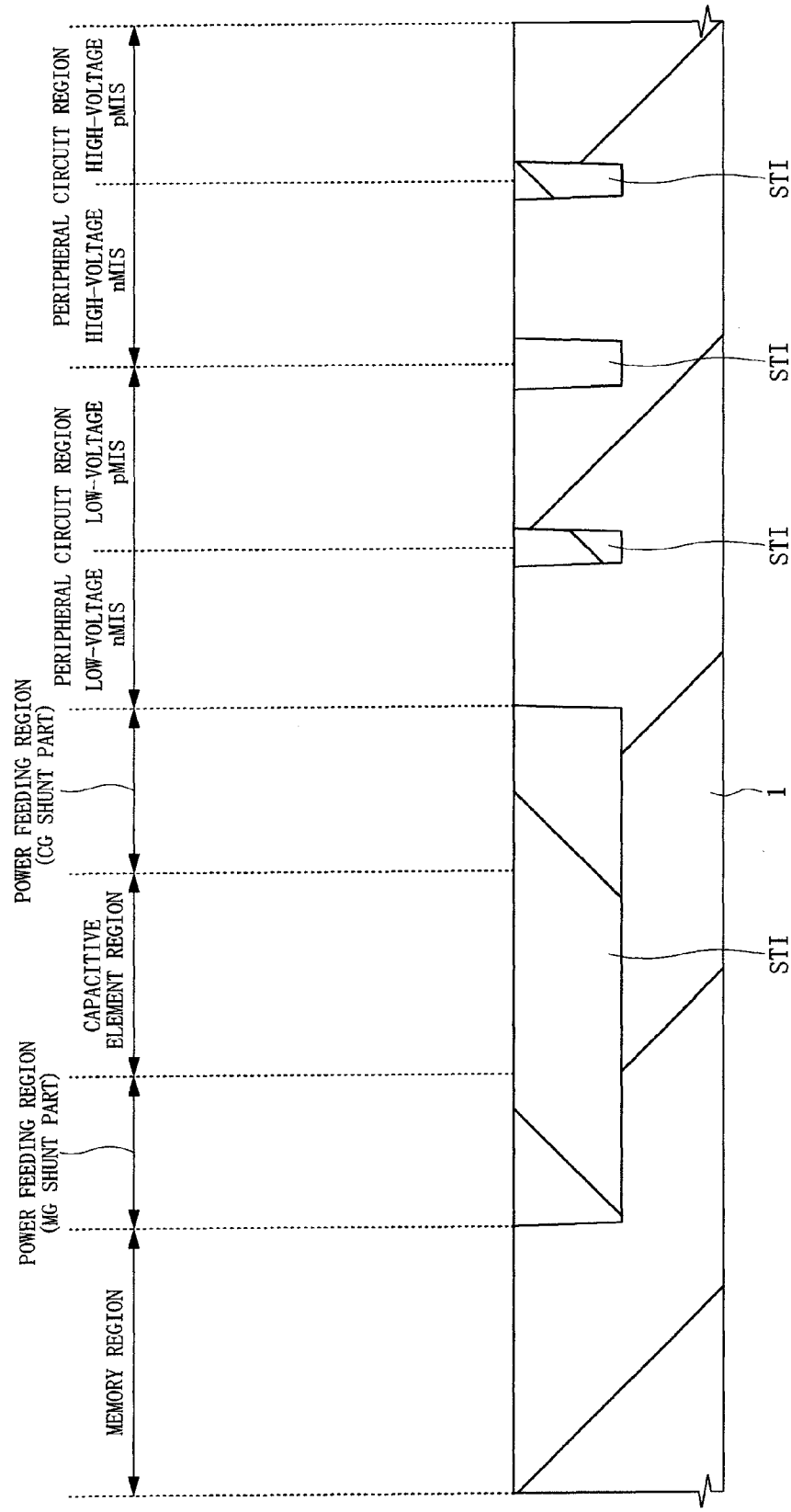
FIG. 4 is a cross-sectional view of a main part of semiconductor substrate showing a manufacturing process of a semiconductor device having the non-volatile memory cell according to the first embodiment of the present invention.
Figure 5:
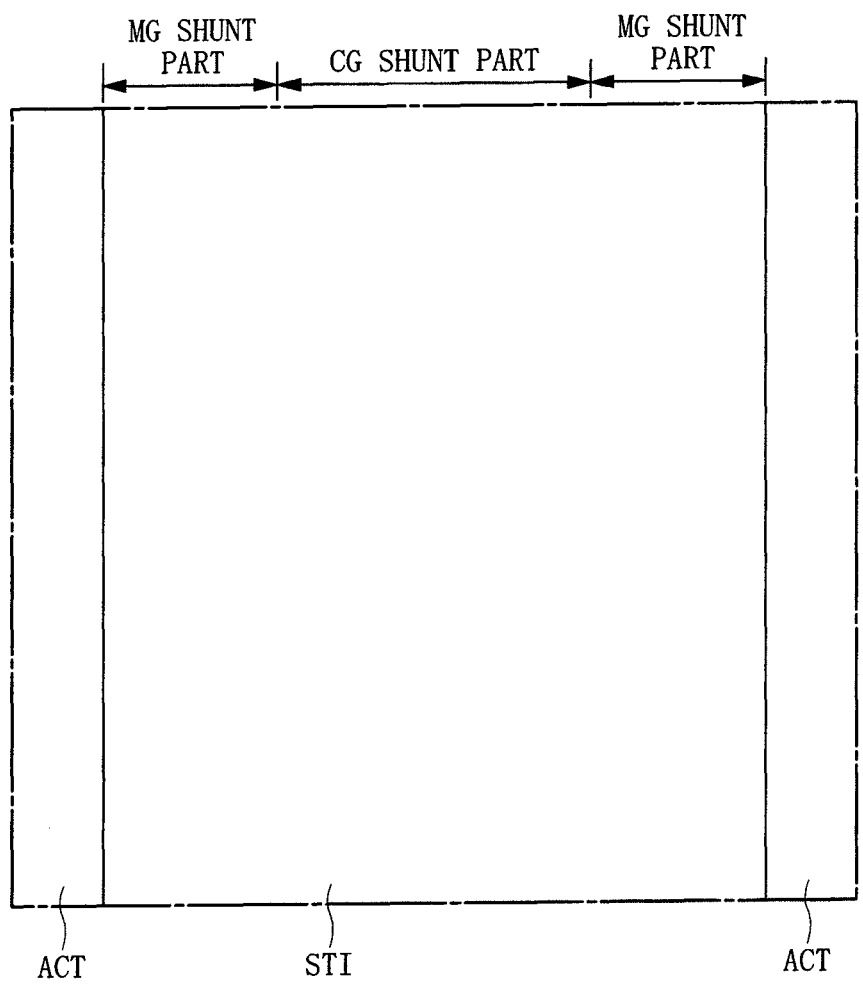
FIG. 5 is a plan view of a main part of the power feeding region in the same manufacturing process as that of FIG. 4 of the semiconductor device having the non-volatile memory cell.

First, as shown in FIG. 4 and FIG. 5, for example, the trench-shaped device isolation parts STI and the active regions ACT and others disposed to be surrounded by device isolation parts STI are formed in the main surface of the semiconductor substrate (at this stage, a semiconductor thin plate called a semiconductor wafer having an approximately circular planar shape) 1. More specifically, after isolation trenches are formed at predetermined positions of the semiconductor substrate 1, an insulating film such as silicon oxide is deposited on the main surface of the semiconductor substrate 1, and the insulating film is polished by the CMP (Chemical Mechanical Polishing) method or the like so that the insulating film remains only in the isolation trenches, thereby embedding the insulating film in the isolation trenches. In this manner, the device isolation parts STI are formed. The device isolation part STI is formed also in the semiconductor substrate 1 of the power feeding regions and the capacitive element region.

Figure 6:
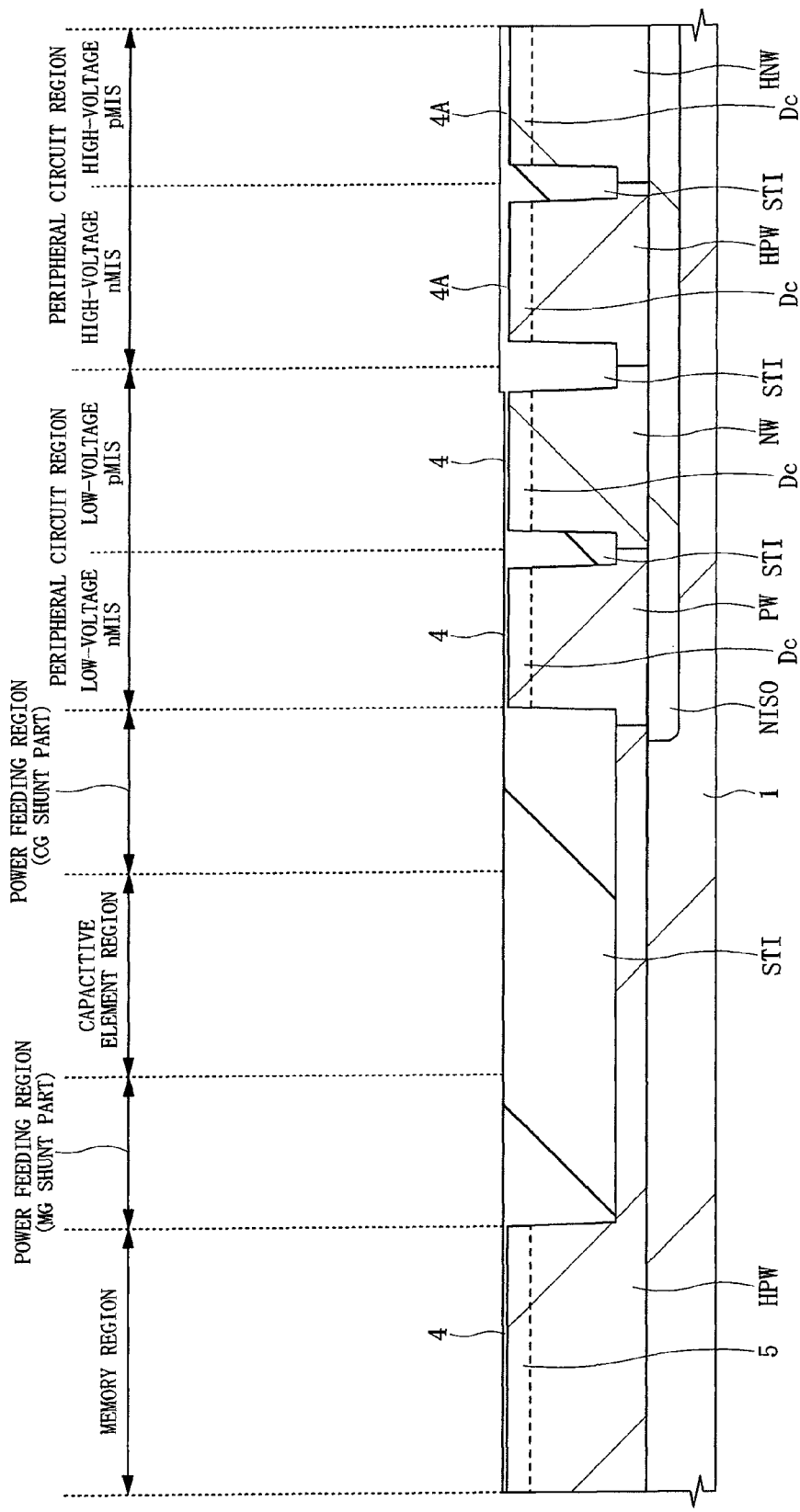
FIG. 6 is a cross-sectional view of a main part showing the same part as that of FIG. 4 in the manufacturing process of the semiconductor device having the non-volatile memory cell continued from FIG. 4 and FIG. 5.

Next, as shown in FIG. 6, an embedded n-well NISO is formed by selectively ion-implanting an n-type impurity into the semiconductor substrate 1 of the peripheral circuit regions. Subsequently, p-wells HPW are formed by selectively ion-implanting a p-type impurity into the semiconductor substrate 1 of the memory region and the high-voltage nMIS region, and an n-well HNW is formed by selectively ion-implanting an n-type impurity into the semiconductor substrate 1 of the high-voltage pMIS region. Similarly, a p-well PW is formed by selectively ion-implanting a p-type impurity into the semiconductor substrate 1 of the low-voltage nMIS region, and an n-well NW is formed by selectively ion-implanting an n-type impurity into the semiconductor substrate 1 of the low-voltage pMIS region.

Next, a p-type impurity such as boron is selectively ion-implanted into the semiconductor substrate 1 of the memory region. By this means, the p-type semiconductor region 5 for forming the channel of the selection nMIS (Qnc) is formed in the semiconductor substrate 1 of the memory region. Similarly, predetermined impurities are ion-implanted into the semiconductor substrate 1 of the low-voltage nMIS region, the low-voltage pMIS region, the high-voltage nMIS region and the high-voltage pMIS region of the peripheral circuit regions, respectively. By this means, semiconductor regions Dc for forming channels are formed in the semiconductor substrate 1 of the low-voltage nMIS region, the low-voltage pMIS region, the high-voltage nMIS region and the high-voltage pMIS region of the peripheral circuit regions, respectively.

Next, the semiconductor substrate 1 is subjected to oxidizing treatment, thereby forming a gate insulating film 4A, which is made of, for example, silicon oxide and has a thickness of about 20 nm, on the main surface of the semiconductor substrate 1. Subsequently, after the gate insulating film 4A of the memory region, the low-voltage nMIS region and the low-voltage pMIS region is removed, the semiconductor substrate 1 is subjected to oxidizing treatment. By this means, the gate insulating film (first gate insulating film) 4, which is made of, for example, silicon oxide and has a thickness of about 1 to 5 nm, is formed on the main surface of the semiconductor substrate 1 of the memory region, and at the same time, the gate insulating film (third gate insulating film) 4, which is made of, for example, silicon oxide and has a thickness of about 1 to 5 nm, is formed on the main surface of the semiconductor substrate 1 of the low-voltage nMIS region and the low-voltage pMIS region.

Figure 7:
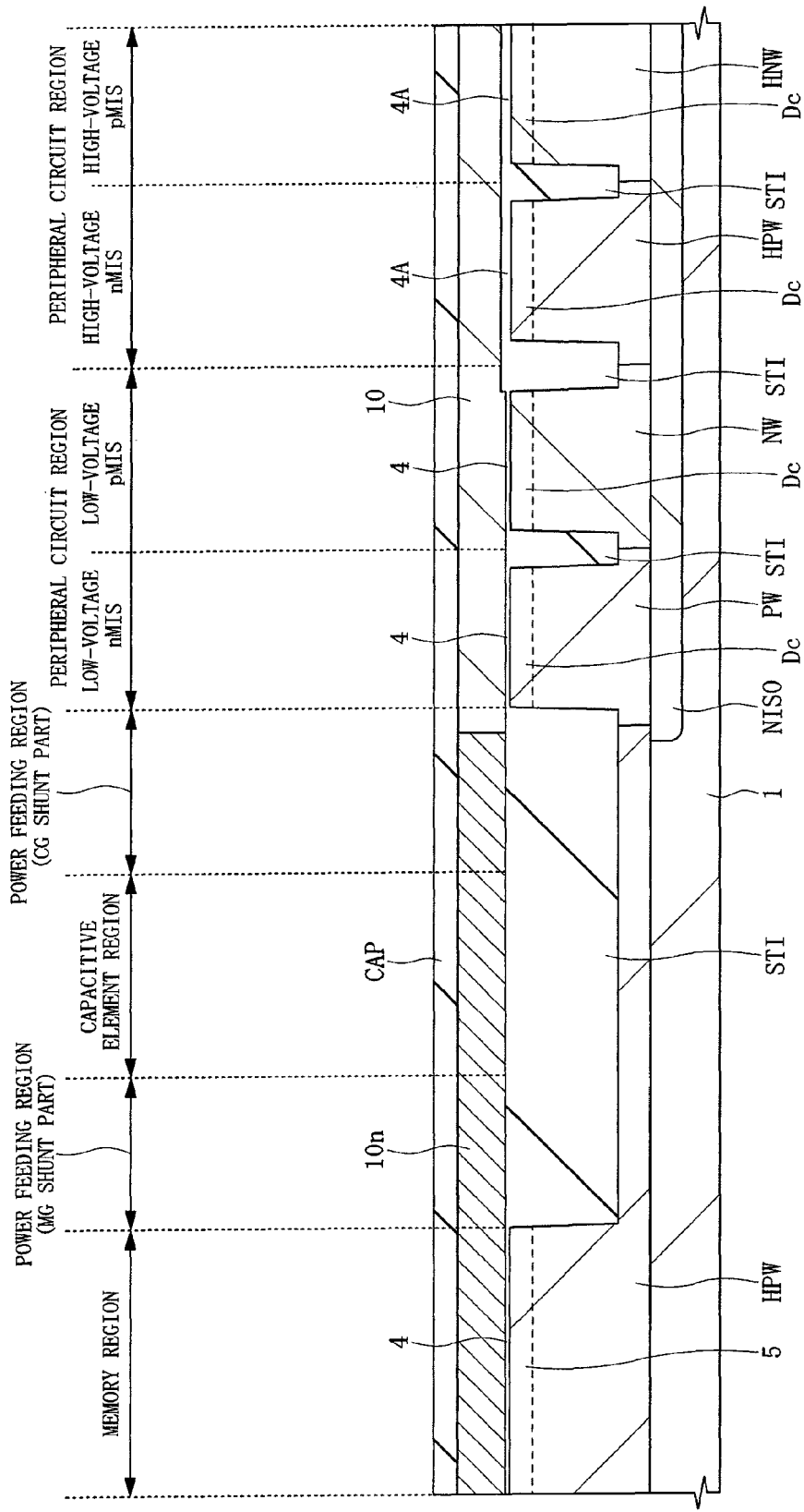
FIG. 7 is a cross-sectional view of a main part showing the same part as that of FIG. 4 in the manufacturing process of the semiconductor device having the non-volatile memory cell continued from FIG. 6.

Next, as shown in FIG. 7, after a conductive film 10 made of, for example, amorphous silicon is deposited on the main surface of the semiconductor substrate 1 by the CVD (Chemical Vapor Deposition) method, an n-type impurity is introduced into the conductive film 10 of the memory region, the power feeding regions and the capacitive element region by the ion implantation method or the like, thereby forming an n-type conductive film (first conductive film) 10n. The thicknesses of the conductive films 10 and 10n are, for example, about 140 nm. Subsequently, the cap insulating film CAP is deposited on the conductive films 10 and 10n by the CVD method. The cap insulating film CAP is made of, for example, silicon nitride, silicon oxide, silicon oxide containing nitrogen or silicon carbide and has a thickness of, for example, 50 nm.

Figure 8:
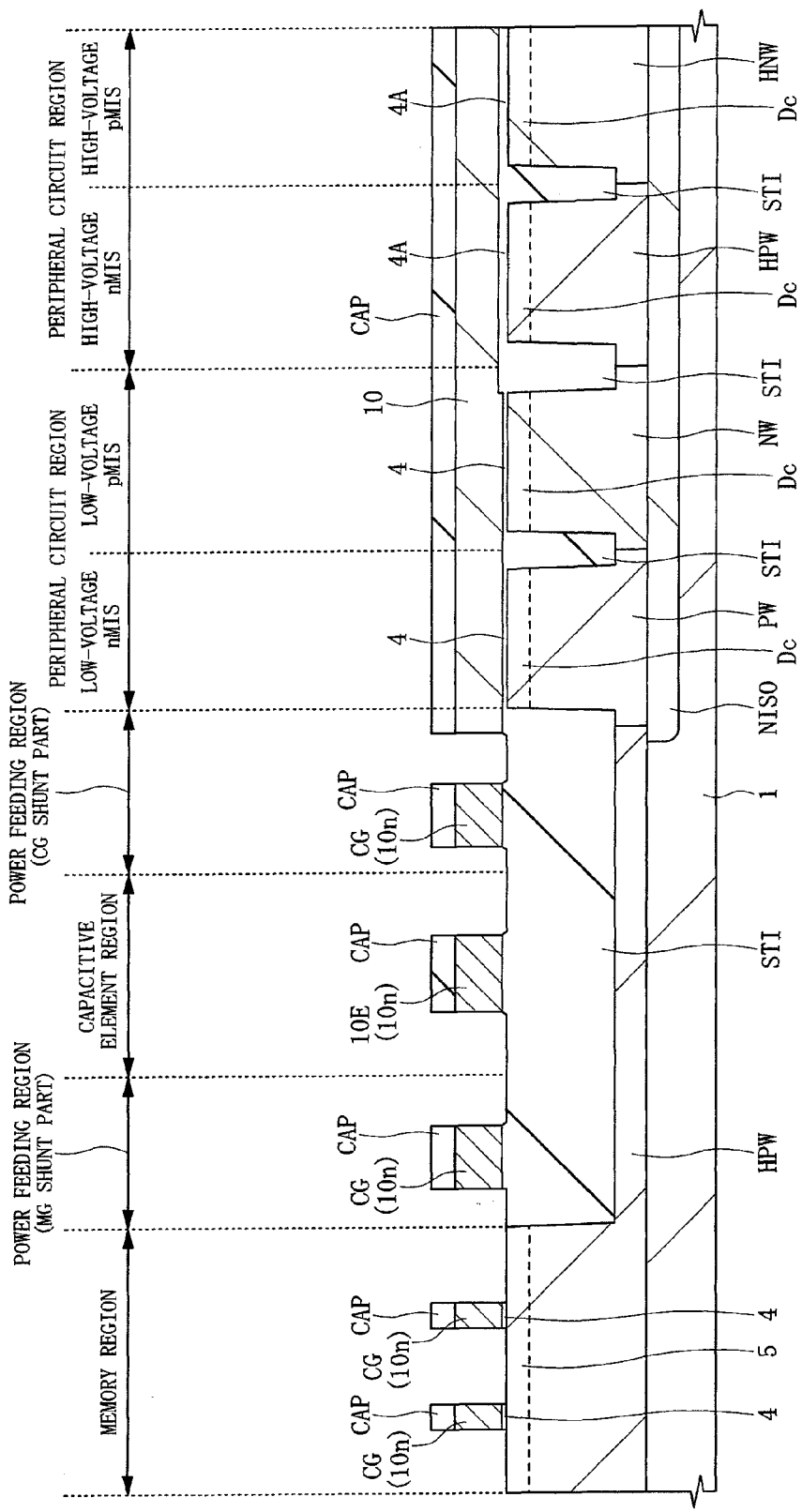
FIG. 8 is a cross-sectional view of a main part showing the same part as that of FIG. 4 in the manufacturing process of the semiconductor device having the non-volatile memory cell continued from FIG. 7.

Next, as shown in FIG. 8, the cap insulating film CAP and the n-type conductive film 10n of the memory region, the power feeding regions and the capacitive element region are sequentially patterned by lithography techniques and dry etching techniques. By this means, the selection gate electrodes CG of the selection nMIS (Qnc) made of the n-type conductive film 10n are formed in the memory region and the power feeding regions. The gate length of the selection gate electrode CG of the memory region is, for example, about 100 nm. At the same time, a lower electrode 10E made of the n-type conductive film 10n is formed in the capacitive element region.

Figure 9:
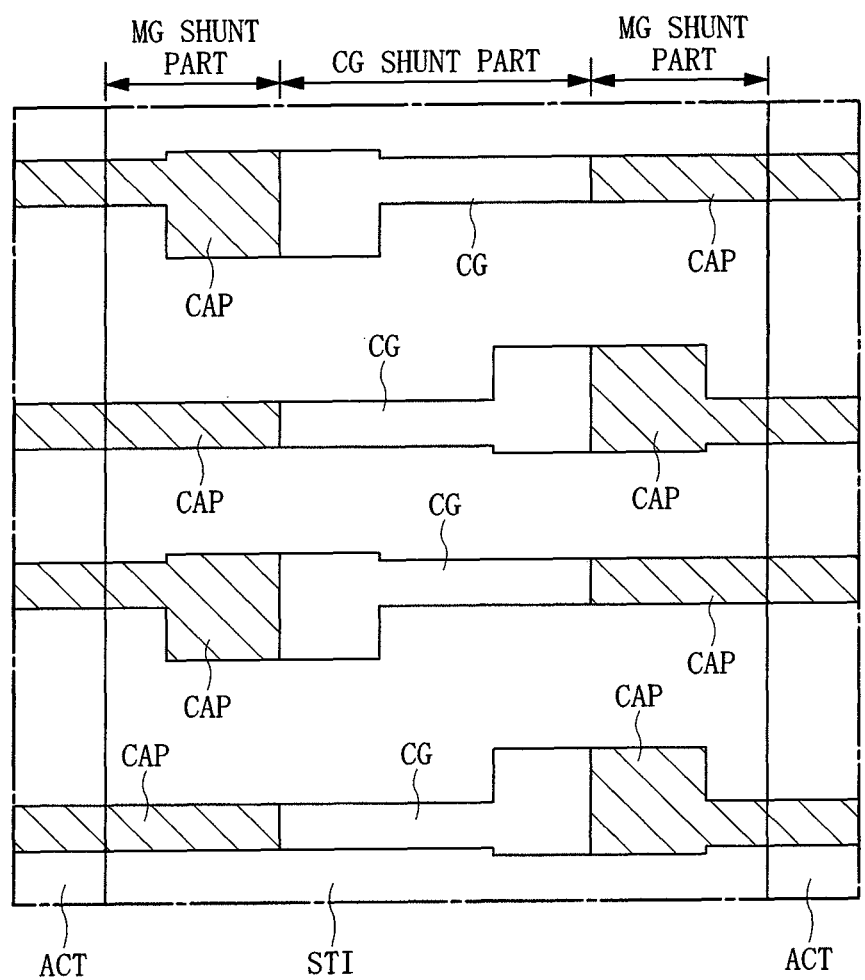
FIG. 9 is a plan view of a main part showing the same part as that of FIG. 5 in the manufacturing process of the semiconductor device having the non-volatile memory cell continued from FIG. 7.
Figure 10:
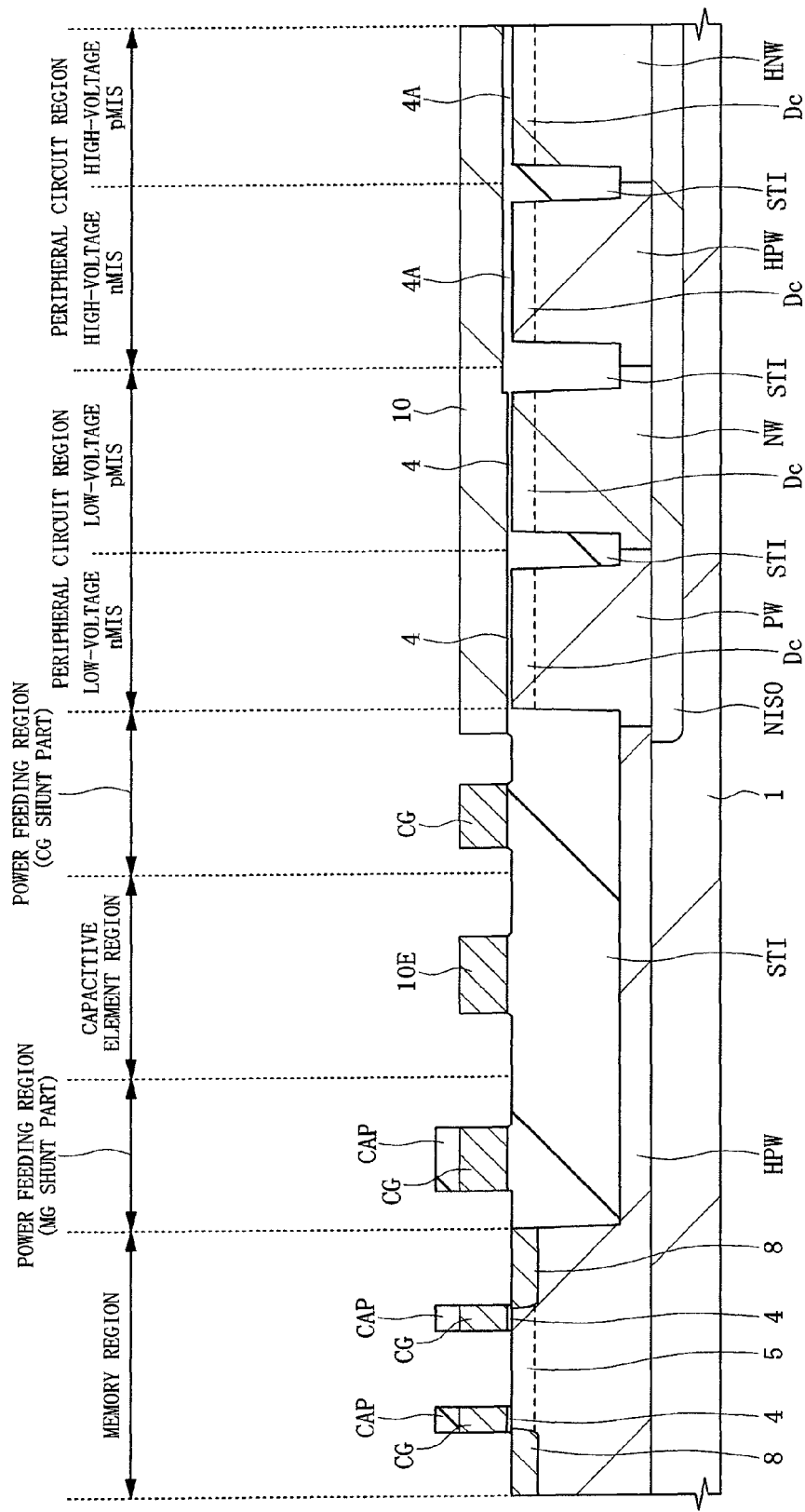
FIG. 10 is a cross-sectional view of a main part showing the same part as that of FIG. 4 in the manufacturing process of the semiconductor device having the non-volatile memory cell continued from FIG. 8 and FIG. 9.

Next, as shown in FIG. 9 and FIG. 10, the cap insulating film CAP of the CG shunt part of the power feeding region, the capacitive element region and the peripheral circuit regions is removed. In FIG. 9, the cap insulating films CAP remaining on the selection gate electrodes CG of the power feeding regions are shown by hatching. Here, in the peripheral circuit regions, the silicide layer 3 needs to be formed on the respective gate electrodes of the low-voltage nMIS, the low-voltage pMIS, the high-voltage nMIS and the high-voltage pMIS which are formed in later steps. Therefore, the cap insulating film CAP of the peripheral circuit regions has to be removed in this step. Also, if the cap insulating film CAP remains in the capacitive element region, a dielectric film between the lower electrode 10E and an upper electrode formed in a later step becomes too thick, and the capacitance value thereof is reduced. Therefore, the cap insulating film CAP of the capacitive element region has to be removed in this step.

Next, an n-type impurity such as arsenic or phosphorous is ion-implanted into the main surface of the semiconductor substrate 1 of the memory region with using the cap insulating film CAP, the selection gate electrodes CG of the selection nMIS (Qnc) and a resist pattern as a mask, thereby forming the n-type semiconductor region 8 for forming the channels of the memory nMIS (Qnm).

Figure 11:
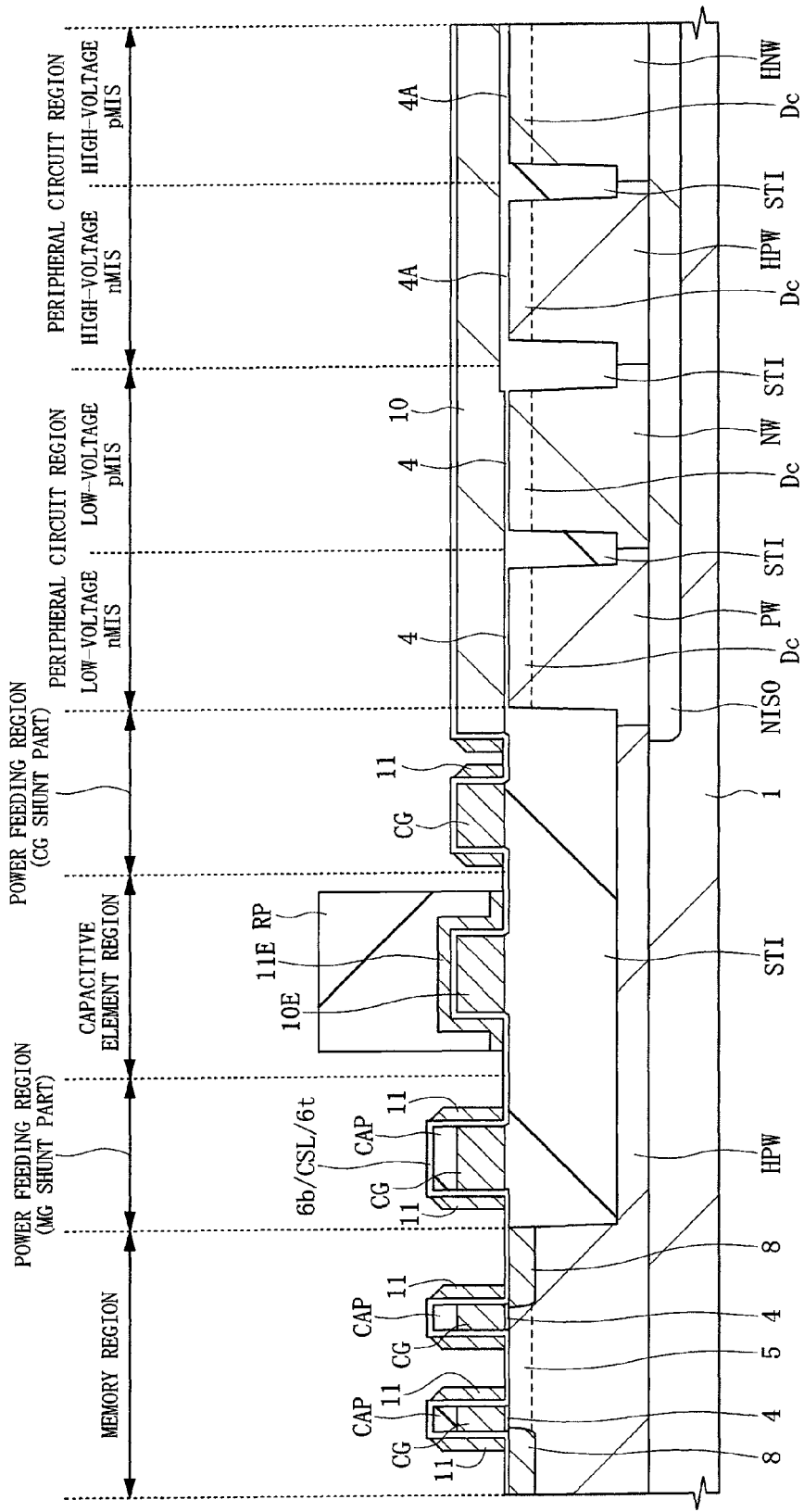
FIG. 11 is a cross-sectional view of a main part showing the same part as that of FIG. 4 in the manufacturing process of the semiconductor device having the non-volatile memory cell continued from FIG. 10.

Next, as shown in FIG. 11, for example, the insulating film (fourth insulating film) 6b made of silicon oxide, the charge accumulating layer CSL made of silicon nitride and the insulating film (fifth insulating film) 6t made of silicon oxide are sequentially formed on the main surface of the semiconductor substrate 1. The insulating film 6b is formed by, for example, the thermal oxidation method or the ISSG oxidation method and has a thickness of, for example, about 1 to 10 nm, the charge accumulating layer CSL is formed by the CVD method and has a thickness of, for example, about 5 to 20 nm, and the insulating film 6t is formed by, for example, the CVD method or the ISSG oxidation method and has a thickness of, for example, about 4 to 15 nm. Also, the insulating films 6b and 6t may be formed of silicon oxide containing nitrogen.

Next, a conductive film (second conductive film) for forming a memory gate, which is made of low-resistance polycrystalline silicon, is deposited on the main surface of the semiconductor substrate 1. The conductive film is formed by the CVD method and has a thickness of, for example, about 50 to 100 nm. Subsequently, the conductive film is etched back by the anisotropic dry etching method using lithography techniques and dry etching techniques. By this means, in the memory region and the MG shunt part of the power feeding region, sidewalls 11 are formed on the both side surfaces of the stacked films, which are made up of the cap insulating films CAP and the selection gate electrodes CG of the selection nMIS (Qnc), via the insulating films 6b and 6t and the charge accumulating layer CSL (second gate insulating film). At the same time, in the CG shunt part of the power feeding region, the sidewalls 11 are formed on the both side surfaces of the selection gate electrode CG of the selection nMIS (Qnc) via the insulating films 6b and 6t and the charge accumulating layer CSL. Furthermore, in the capacitive element region, an upper electrode 11E is formed with using a resist pattern RP as a mask so as to cover the lower electrode 10E.

Figure 12:
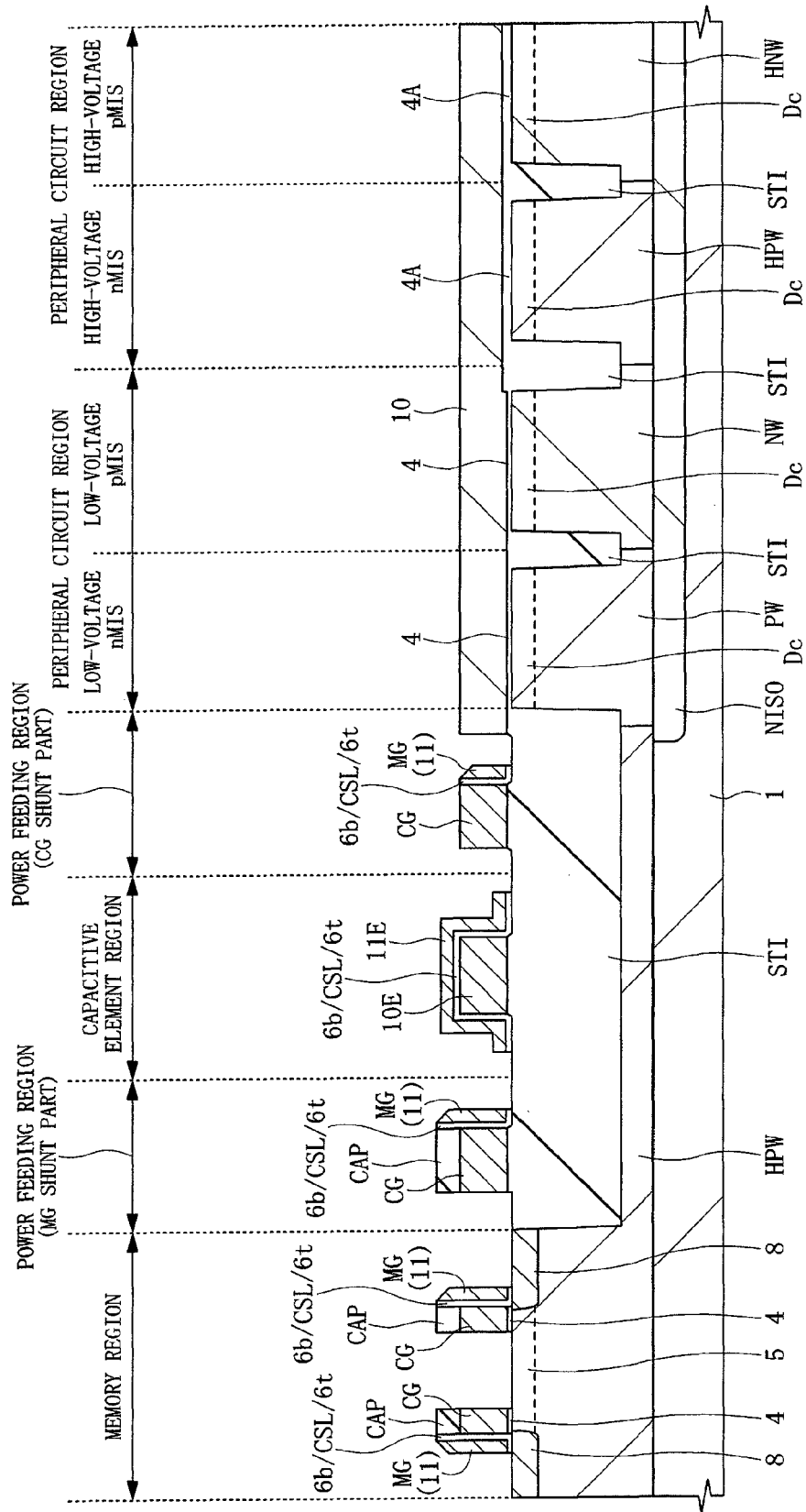
FIG. 12 is a cross-sectional view of a main part showing the same part as that of FIG. 4 in the manufacturing process of the semiconductor device having the non-volatile memory cell continued from FIG. 11.
Figure 13:
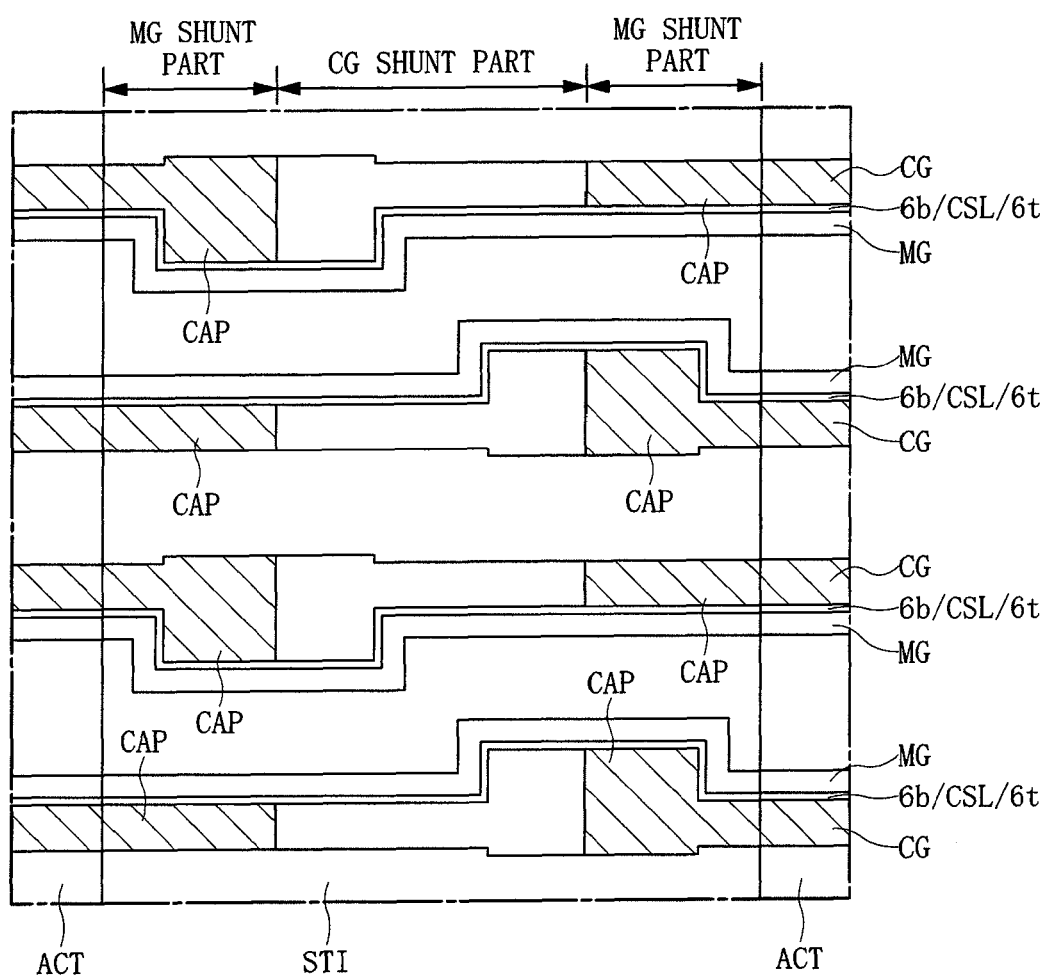
FIG. 13 is a plan view of a main part showing the same part as that of FIG. 5 in the manufacturing process of the semiconductor device having the non-volatile memory cell continued from FIG. 11.

Next, as shown in FIG. 12 and FIG. 13, with using a resist pattern as a mask, the sidewalls 11 exposed therefrom are etched. By this means, in the memory region and the MG shunt part of the power feeding region, the memory gate electrodes MG (sidewalls 11) of the memory nMIS (Qnm) are formed only on the one side surfaces of the stacked films made up of the cap insulating films CAP and the selection gate electrodes CG of the selection nMIS (Qnc). The gate length of the memory gate electrode MG is, for example, about 65 nm. At the same time, in the CG shunt part of the power feeding region, the memory gate electrode MG (sidewall 11) of the memory nMIS (Qnm) is formed only on the one side surface of the selection gate electrode CG of the selection nMIS (Qnc).

Next, the insulating films 6b and 6t and the charge accumulating layer CSL are selectively etched except the insulating films 6b and 6t and the charge accumulating layer CSL between the stacked films made up of the cap insulating films CAP and the selection gate electrodes CG and the memory gate electrodes MG and between the semiconductor substrate 1 and the memory gate electrodes MG in the memory region, the insulating films 6b and 6t and the charge accumulating layer CSL between the stacked film made up of the cap insulating film CAP and the selection gate electrode CG and the memory gate electrode MG and between the device isolation part STI and the memory gate electrode MG in the MG shunt part of the power feeding region, the insulating films 6b and 6t and the charge accumulating layer CSL between the selection gate electrode CG and the memory gate electrode MG and between the device isolation part STI and the memory gate electrode MG in the CG shunt part of the power feeding region, and the insulating films 6b and 6t and the charge accumulating layer CSL between the lower electrode 10E and the upper electrode 11E in the capacitive element region.

In the memory region, the sidewalls 11 are formed on the both side surfaces of the stacked films made up of the cap insulating films CAP and the selection gate electrodes CG via the insulating films 6b and 6t and the charge accumulating layer CSL. Therefore, the height of the memory gate electrode MG from the main surface of the semiconductor substrate 1 is formed to be higher than the height of the selection gate electrode CG from the main surface of the semiconductor substrate 1 and be equal to or lower than the height of the cap insulating film CAP. Also, since the insulating films 6b and 6t and the charge accumulating layer CSL (second gate insulating film) are formed between the stacked film made up of the cap insulating film CAP and the selection gate electrode CG and the memory gate electrode MG, the height of the insulating films 6b and 6t and the charge accumulating layer CSL is formed to be higher than the height of the selection gate electrode CG from the main surface of the semiconductor substrate 1.

Similarly, also in the MG shunt part of the power feeding region, the sidewalls 11 are formed on the both side surfaces of the stacked film made up of the cap insulating film CAP and the selection gate electrode CG via the insulating films 6b and 6t and the charge accumulating layer CSL. Therefore, the height of the memory gate electrode MG from the main surface of the semiconductor substrate 1 is formed to be higher than the height of the selection gate electrode CG from the main surface of the semiconductor substrate 1 and be equal to or lower than the height of the cap insulating film CAP. Also, since the insulating films 6b and 6t and the charge accumulating layer CSL (second gate insulating film) are formed between the stacked film made up of the cap insulating film CAP and the selection gate electrode CG and the memory gate electrode MG, the height of the insulating films 6b and 6t and the charge accumulating layer CSL is formed to be higher than the height of the selection gate electrode CG from the main surface of the semiconductor substrate 1.

However, in the CG shunt part of the power feeding region, the sidewalls 11 are formed on the both side surfaces of the selection gate electrode CG via the insulating films 6b and 6t and the charge accumulating layer CSL. Therefore, the height of the memory gate electrode MG from the main surface of the semiconductor substrate 1 is formed to be approximately equal to or lower than the height of the selection gate electrode CG from the main surface of the semiconductor substrate 1. Furthermore, the height of the memory gate electrode MG of the CG shunt part of the power feeding region is formed to be lower than the height of the memory gate electrode MG of the memory region from the main surface of the semiconductor substrate 1.

In the capacitive element region, a capacitive element, which is made up of the lower electrode 10E made of the conductive film of the same layer as the selection gate electrode CG of the selection nMIS (Qnc) and the upper electrode 11E made of the conductive film of the same layer as the memory gate electrode MG of the memory nMIS (Qmc), is formed with using the insulating films 6b and 6t and the charge accumulating layer CSL as a capacitor insulating film (dielectric film). The capacitive element constitutes, for example, a charge pump circuit used for a power supply circuit which outputs a voltage higher than an input voltage. The charge pump circuit can increase the voltage by switching the connection state of a plurality of capacitive elements by using switches and others. Further, since the capacitive element is formed on the device isolation part STI formed in the semiconductor substrate 1 and the parasitic capacitance composed of the substrate part and the lower electrode 10E is so small that it can be ignored, the capacitive element can stably carry out the operation described above. Furthermore, even if the position of the contact hole which is formed in a later step and reaches the upper electrode 11E and the position of the contact hole which reaches the lower electrode 10E are misaligned due to the photomask misalignment or the like, the holes are misaligned onto the device isolation part STI. Therefore, the short-circuit between the wiring and the semiconductor substrate 1 via the contact holes does not occur.

Figure 14:
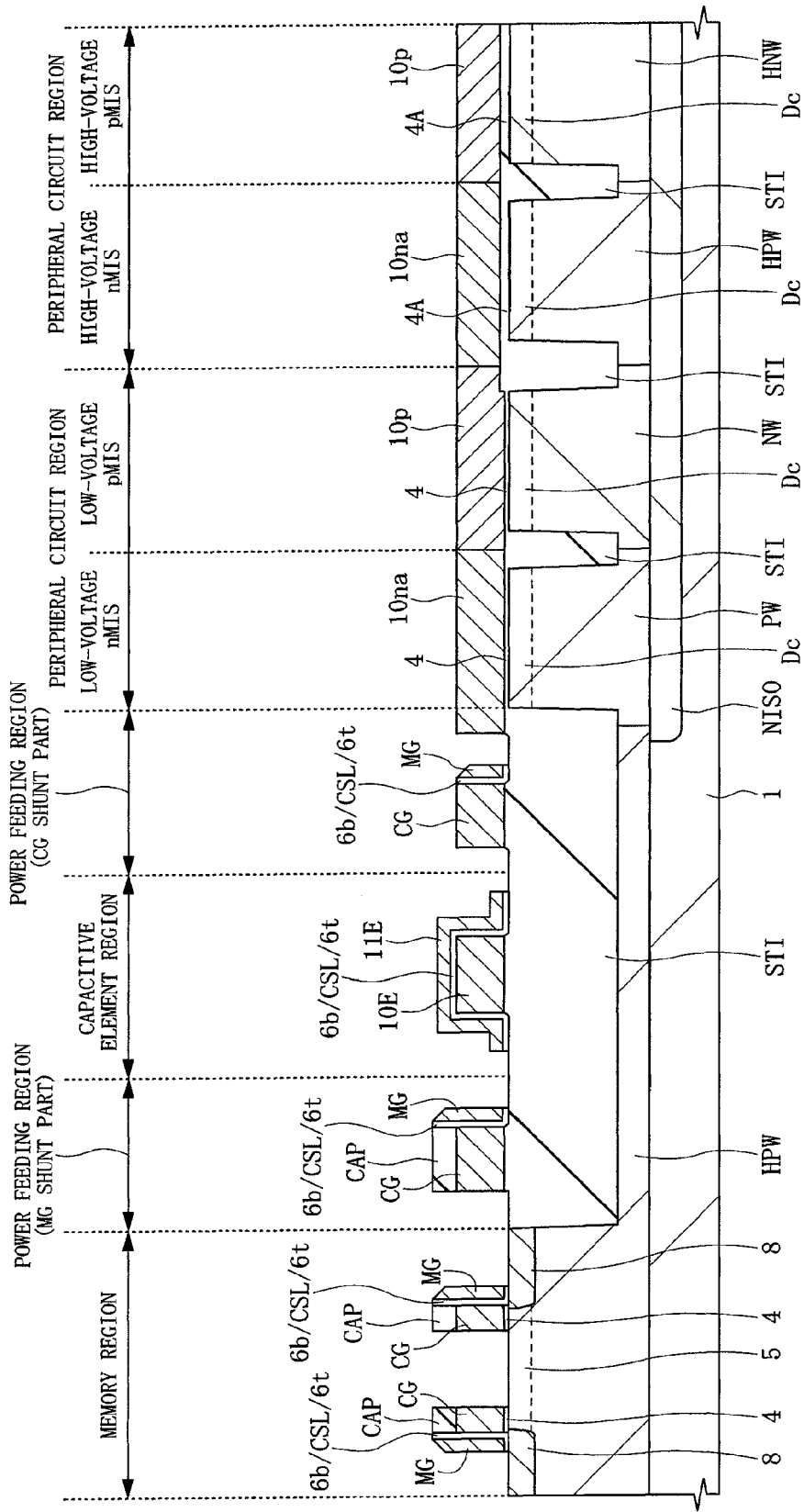
FIG. 14 is a cross-sectional view of a main part showing the same part as that of FIG. 4 in the manufacturing process of the semiconductor device having the non-volatile memory cell continued from FIG. 12 and FIG. 13.

Next, as shown in FIG. 14, an n-type impurity is introduced into the conductive film 10 of the low-voltage nMIS region and the high-voltage nMIS region of the peripheral circuit regions by the ion implantation method or the like, thereby forming n-type conductive films 10na. Moreover, a p-type impurity is introduced into the conductive film 10 of the low-voltage pMIS region and the high-voltage pMIS region of the peripheral circuit regions by the ion implantation method or the like, thereby forming p-type conductive films 10p.

Figure 15:
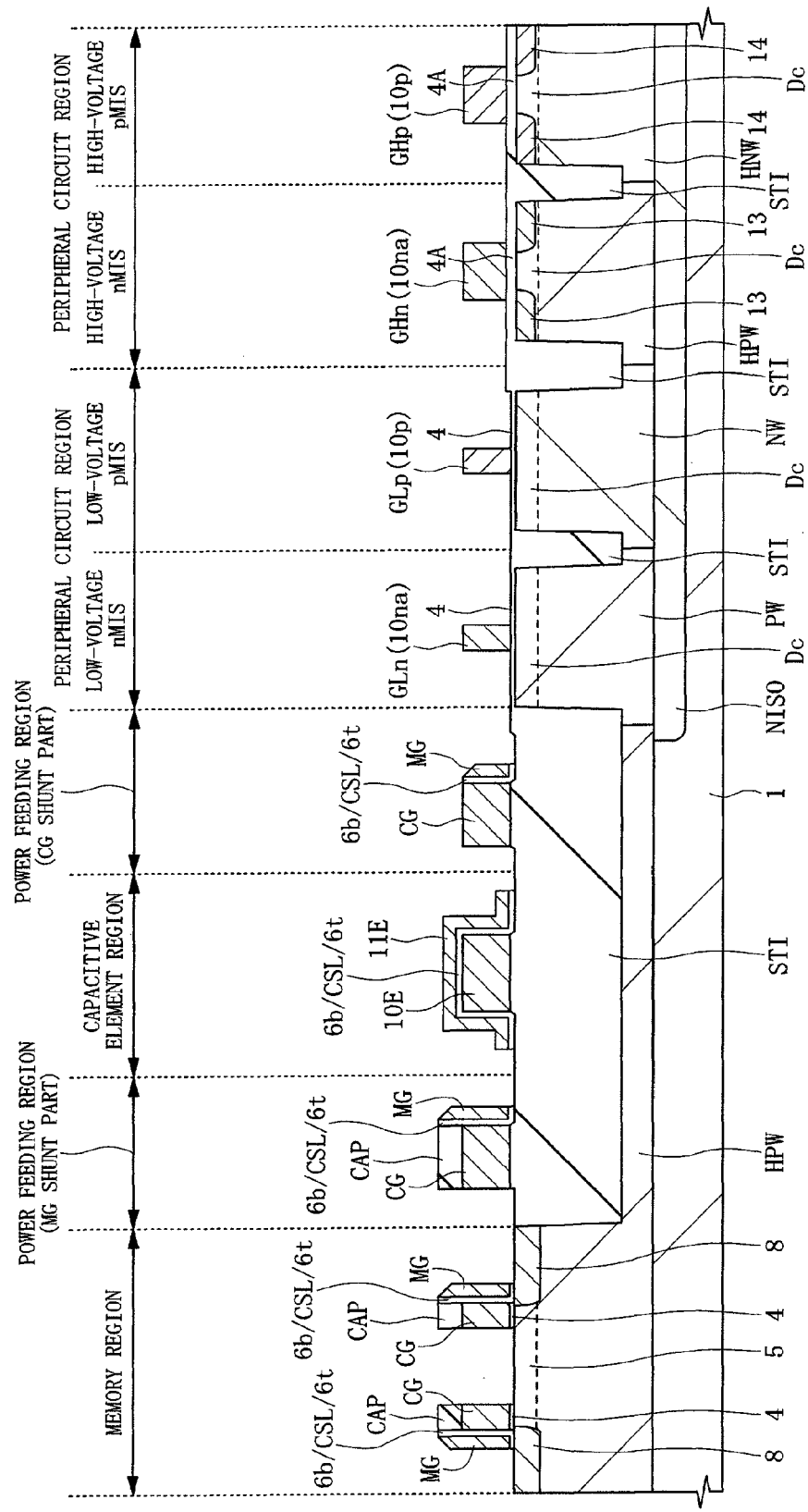
FIG. 15 is a cross-sectional view of a main part showing the same part as that of FIG. 4 in the manufacturing process of the semiconductor device having the non-volatile memory cell continued from FIG. 14.

Next, as shown in FIG. 15, the conductive films 10na and 10p of the peripheral circuit regions are patterned by lithography techniques and dry etching techniques, thereby forming a gate electrode GLn of the low-voltage nMIS made of the conductive film 10na, a gate electrode GLp of the low-voltage pMIS made of the conductive film 10p, a gate electrode GHn of the high-voltage nMIS made of the conductive film 10na and a gate electrode GHp of the high-voltage pMIS made of the conductive film 10p. In the active region, the gate lengths of the gate electrode GLn of the low-voltage nMIS and the gate electrode GLp of the low-voltage pMIS are, for example, about 100 nm, and the gate lengths of the gate electrode GHn of the high-voltage nMIS and the gate electrode GHp of the high-voltage pMIS are, for example, about 400 nm.

Next, an n-type impurity such as arsenic is ion-implanted into the main surface of the semiconductor substrate 1 of the high-voltage nMIS region of the peripheral circuit region with using a resist pattern as a mask, thereby forming $n^-$-type semiconductor regions 13 in the main surface of the semiconductor substrate 1 of the high-voltage nMIS region of the peripheral circuit region in a self-aligning manner with respect to the gate electrode GHn. Similarly, a p-type impurity such as boron fluoride is ion-implanted into the main surface of the semiconductor substrate 1 of the high-voltage pMIS region of the peripheral circuit region with using a resist pattern as a mask, thereby forming p⁻-type semiconductor regions 14 in the main surface of the semiconductor substrate 1 of the high-voltage pMIS region of the peripheral circuit region in a self-aligning manner with respect to the gate electrode GHp.

Figure 16:
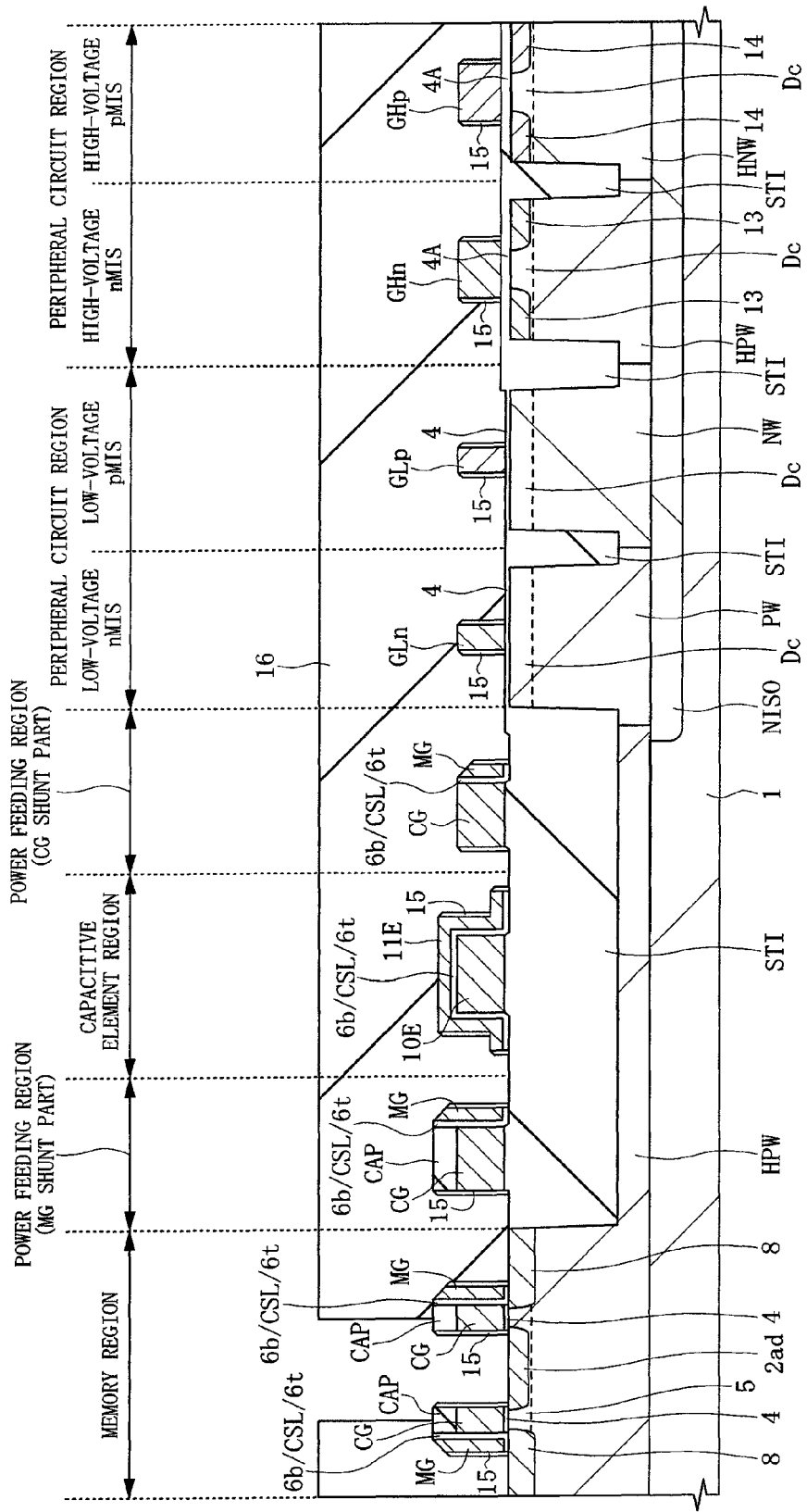
FIG. 16 is a cross-sectional view of a main part showing the same part as that of FIG. 4 in the manufacturing process of the semiconductor device having the non-volatile memory cell continued from FIG. 15.

Next, as shown in FIG. 16, for example, an insulating film made of silicon oxide and having a thickness of about 10 nm is deposited on the main surface of the semiconductor substrate 1 by the CVD method, and then, the insulating film is etched back by the anisotropic dry etching method. By this means, sidewalls 15 are formed on the side surfaces of the stacked films made up of the cap insulating films CAP and the selection gate electrodes CG on the side opposite to the memory gate electrode MG and on the side surfaces of the memory gate electrodes MG in the memory region and the power feeding regions, on the side surfaces of the upper electrode 11E in the capacitive element region and on the both side surfaces of the gate electrode GLn of the low-voltage nMIS, the gate electrode GLp of the low-voltage pMIS, the gate electrode GHn of the high-voltage nMIS and the gate electrode GHp of the high-voltage pMIS in the peripheral circuit regions. The spacer length of the sidewall 15 is, for example, about 6 nm. By this means, the side surface on which the gate insulating film 4 between the selection gate electrode CG of the selection nMIS (Qnc) and the semiconductor substrate 1 is exposed and the side surface on which the insulating films 6b and 6t and the charge accumulating layer CSL between the memory gate electrode MG of the memory nMIS (Qnm) and the semiconductor substrate 1 are exposed can be covered with the sidewalls 15. As a result of forming the sidewalls 15, in a step of forming an n⁻-type semiconductor region in the low-voltage nMIS region of the peripheral circuit region and a step of forming a p⁻-type semiconductor region in the low-voltage pMIS region described later, the effective channel lengths in the n⁻-type semiconductor region and the p⁻-type semiconductor region can be increased, and the short channel effect of the low-voltage nMIS and the low-voltage pMIS can be suppressed.

Next, a resist pattern 16 whose ends are located at the upper surfaces of the selection gate electrodes CG of the selection nMIS (Qnc) of the memory region and which covers a part of the selection gate electrodes CG on the side of the memory gate electrode MG of the memory nMIS (Qnm) and the memory gate electrodes MG is formed, and then, an n-type impurity such as arsenic is ion-implanted into the main surface of the semiconductor substrate 1 with using the selection gate electrodes CG, the memory gate electrodes MG and the resist pattern 16 as a mask, thereby forming an n⁻-type semiconductor region 2ad in the main surface of the semiconductor substrate 1 in a self-aligning manner with respect to the selection gate electrode CG.

Figure 17:
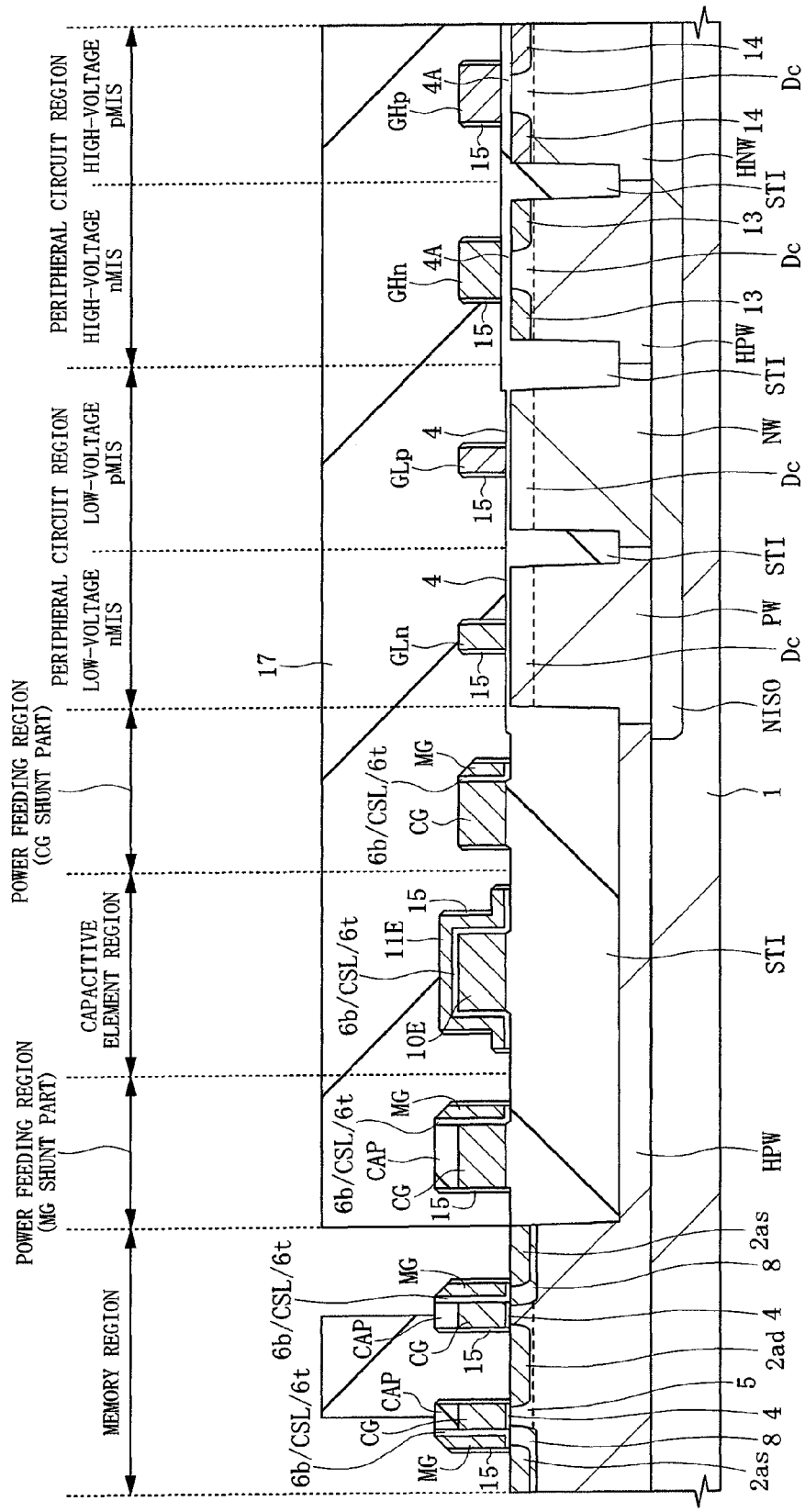
FIG. 17 is a cross-sectional view of a main part showing the same part as that of FIG. 4 in the manufacturing process of the semiconductor device having the non-volatile memory cell continued from FIG. 16.

Next, as shown in FIG. 17, after the resist pattern 16 is removed, a resist pattern 17 whose ends are located at the upper surfaces of the selection gate electrodes CG of the selection nMIS (Qnc) of the memory region and which covers a part of the selection gate electrodes CG on the side opposite to the memory gate electrode MG of the memory nMIS (Qnm) is formed, and then, an n-type impurity such as arsenic is ion-implanted into the main surface of the semiconductor substrate 1 with using the selection gate electrodes CG, the memory gate electrodes MG and the resist pattern 17 as a mask, thereby forming n⁻-type semiconductor regions 2as in the main surface of the semiconductor substrate 1 in a self-aligning manner with respect to the memory gate electrodes MG.

The case where the n⁻-type semiconductor region 2ad is formed first and the n⁻-type semiconductor regions 2as are then formed has been described here. However, the n⁻-type semiconductor regions 2as may be formed first and the n⁻-type semiconductor region 2ad may be then formed. Moreover, subsequent to the ion implantation of the n-type impurity that forms the n⁻-type semiconductor region 2ad, a p-type impurity such as boron may be ion-implanted into the main surface of the semiconductor substrate 1 to form a p-type semiconductor region so as to surround the lower part of the n⁻-type semiconductor region 2ad.

Figure 18:
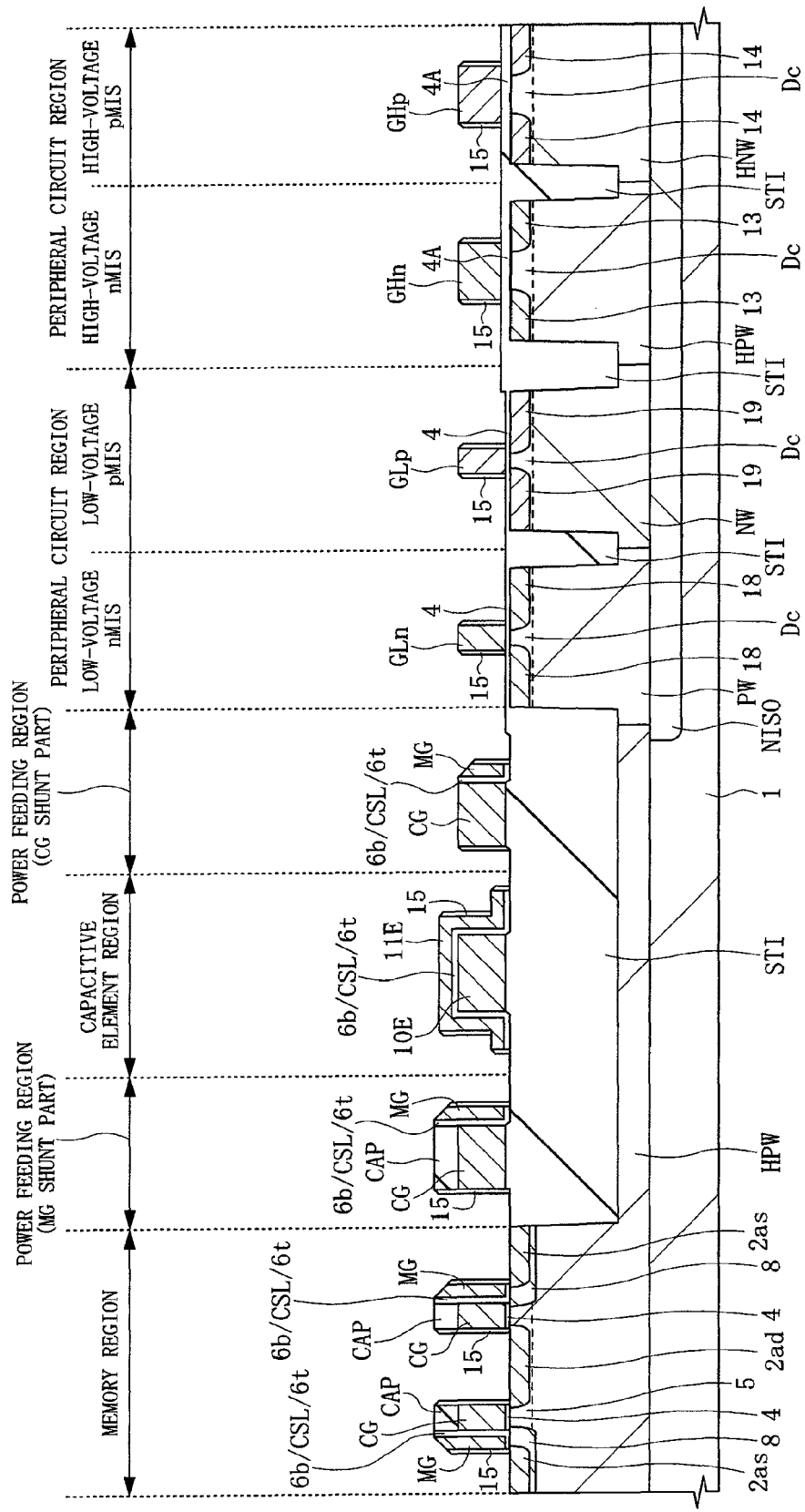
FIG. 18 is a cross-sectional view of a main part showing the same part as that of FIG. 4 in the manufacturing process of the semiconductor device having the non-volatile memory cell continued from FIG. 17.

Next, as shown in FIG. 18, an n-type impurity such as arsenic is ion-implanted into the main surface of the semiconductor substrate 1 of the low-voltage nMIS region of the peripheral circuit region with using a resist pattern as a mask, thereby forming n⁻-type semiconductor regions 18 in the main surface of the semiconductor substrate 1 of the low-voltage nMIS region of the peripheral circuit region in a self-aligning manner with respect to the gate electrode GLn. Similarly, a p-type impurity such as boron fluoride is ion-implanted into the main surface of the semiconductor substrate 1 of the low-voltage pMIS region of the peripheral circuit region with using a resist pattern as a mask, thereby forming p⁻-type semiconductor regions 19 in the main surface of the semiconductor substrate 1 of the low-voltage pMIS region of the peripheral circuit region in a self-aligning manner with respect to the gate electrode GLp.

Figure 19:
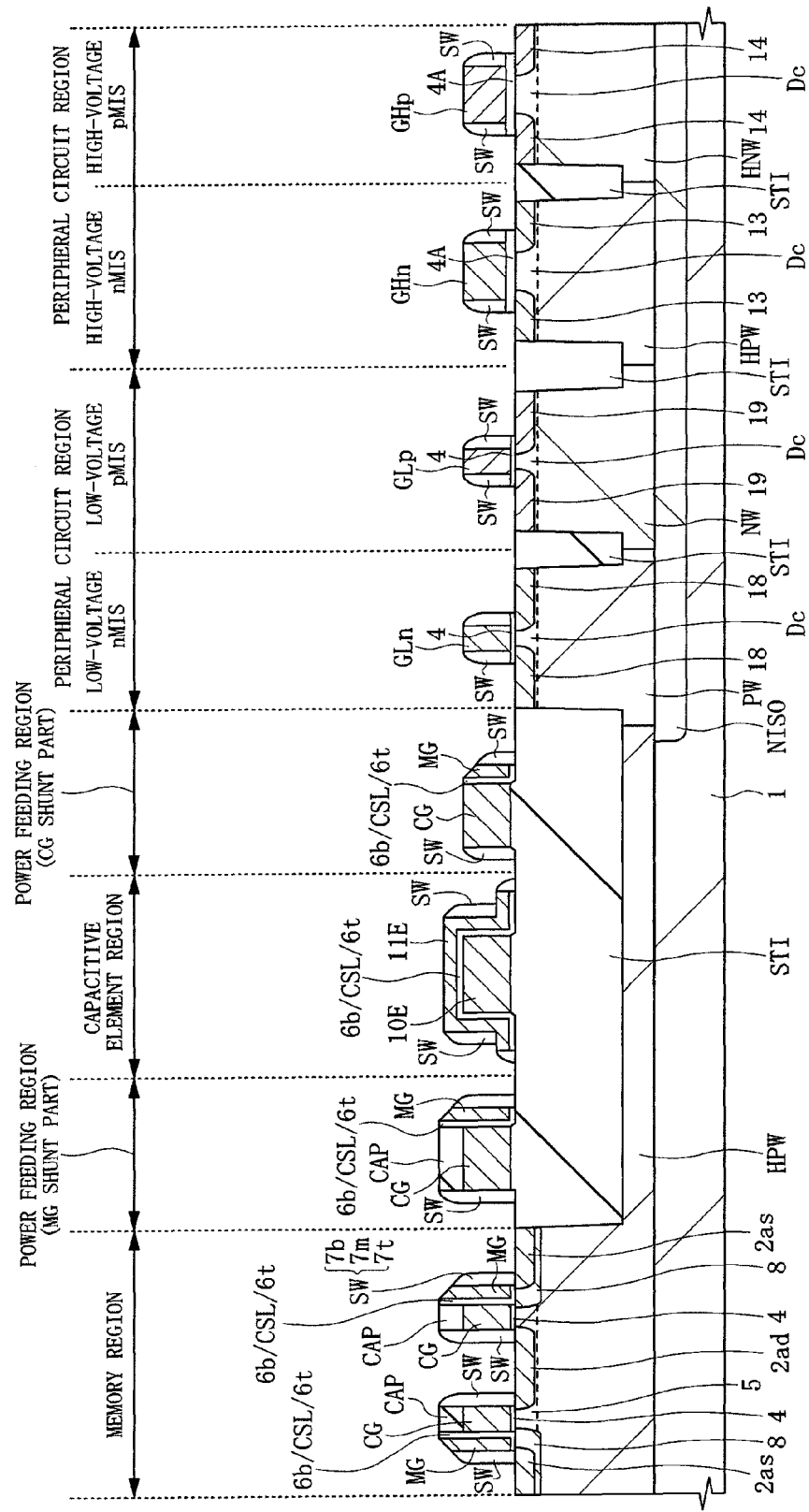
FIG. 19 is a cross-sectional view of a main part showing the same part as that of FIG. 4 in the manufacturing process of the semiconductor device having the non-volatile memory cell continued from FIG. 18.

Next, as shown in FIG. 19, for example, the silicon oxide film 7b, the silicon nitride film 7m and the silicon oxide film 7t are sequentially deposited on the main surface of the semiconductor substrate 1 by the CVD method, and these films are etched back by the anisotropic dry etching method. By this means, the sidewalls SW are formed on the side surfaces of the stacked films made up of the cap insulating films CAP and the selection gate electrodes CG on the side opposite to the memory gate electrode MG and on the side surfaces of the memory gates MG in the memory region and the power feeding regions, on the side surfaces of the upper electrode 11E in the capacitive element region and on the both side surfaces of the gate electrode GLn of the low-voltage nMIS, the gate electrode GLp of the low-voltage pMIS, the gate electrode GHn of the high-voltage nMIS and the gate electrode GHp of the high-voltage pMIS in the peripheral circuit regions. The thickness of the silicon oxide film 7b is, for example, about 20 nm, the thickness of the silicon nitride film 7m is, for example, about 25 nm, and the thickness of the silicon oxide film 7t is, for example, about 50 nm.

Figure 20:
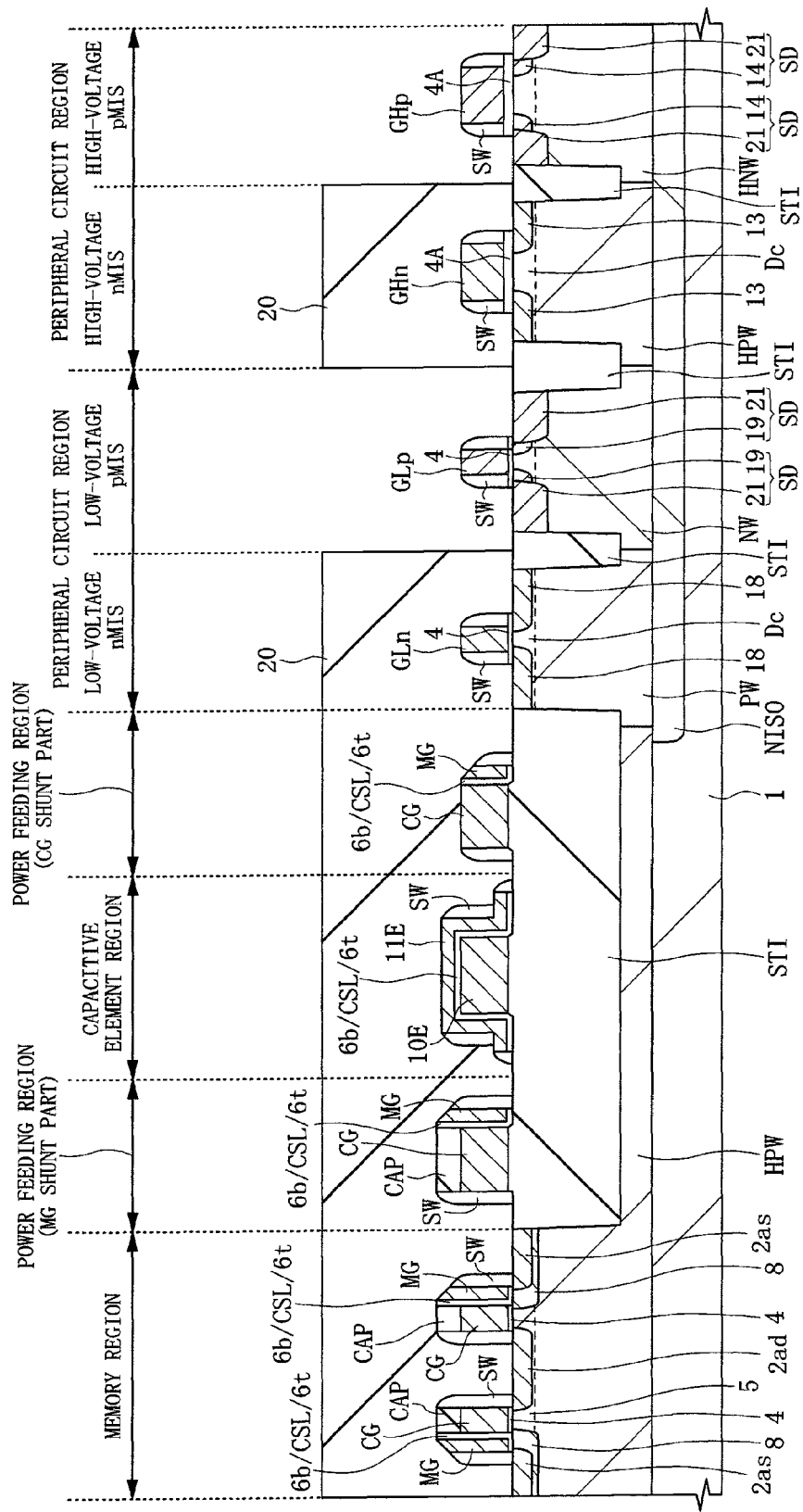
FIG. 20 is a cross-sectional view of a main part showing the same part as that of FIG. 4 in the manufacturing process of the semiconductor device having the non-volatile memory cell continued from FIG. 19.

Next, as shown in FIG. 20, a p-type impurity such as boron or boron fluoride is ion-implanted into the main surface of the semiconductor substrate 1 of the low-voltage pMIS region and the high-voltage pMIS region of the peripheral circuit regions with using a resist pattern 20 as a mask, thereby forming p⁺-type semiconductor regions 21 in a self-aligning manner with respect to the gate electrode GLp of the low-voltage pMIS and the gate electrode GHp of the high-voltage pMIS. By this means, source/drain regions SD of the high-voltage pMIS made up of the p⁻-type semiconductor regions 14 and the p⁺-type semiconductor regions 21 are formed, and source/drain regions SD of the low-voltage pMIS made up of the p⁻-type semiconductor regions 19 and the p⁺-type semiconductor regions 21 are formed.

Figure 21:
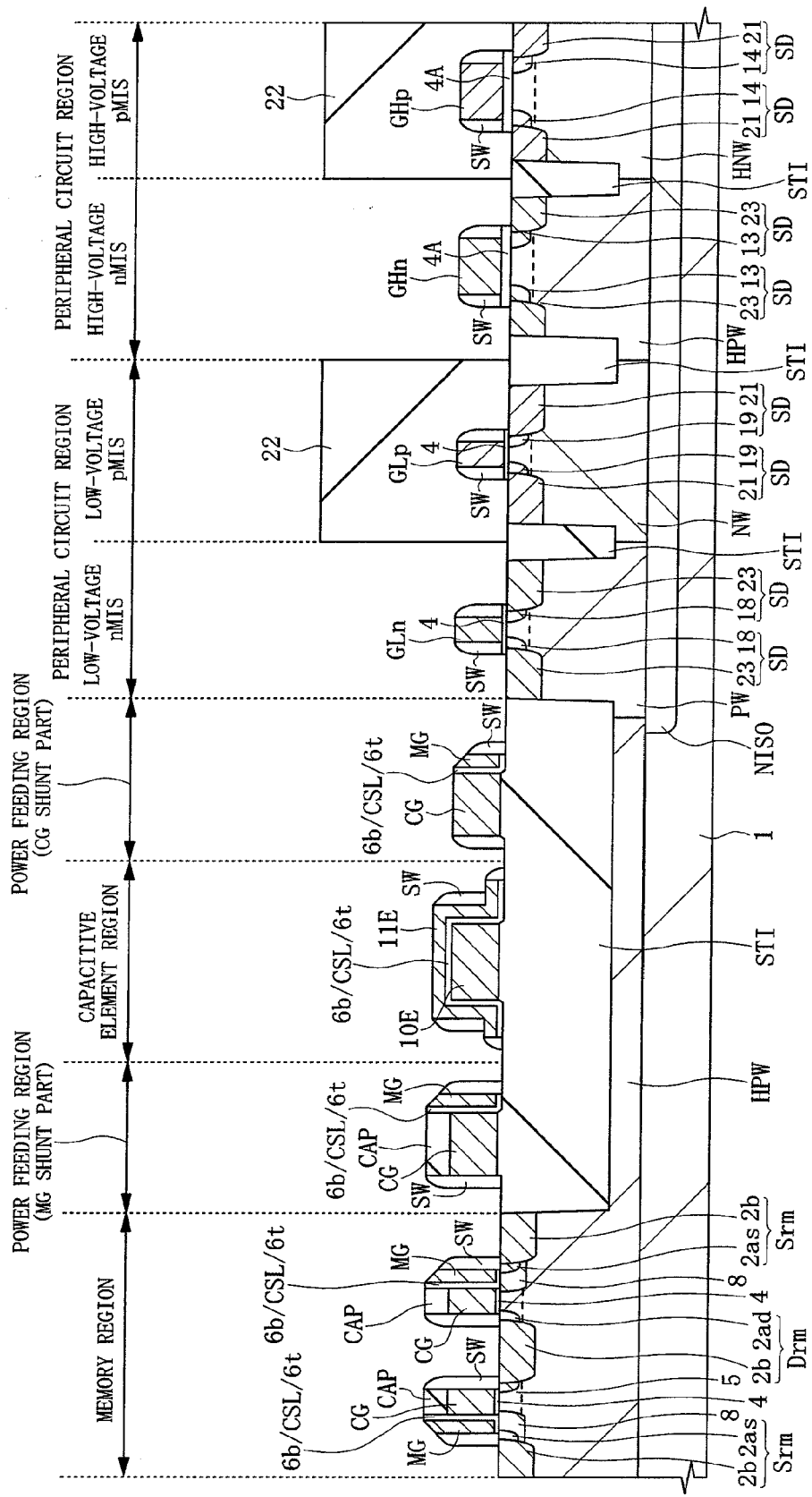
FIG. 21 is a cross-sectional view of a main part showing the same part as that of FIG. 4 in the manufacturing process of the semiconductor device having the non-volatile memory cell continued from FIG. 20.

Next, as shown in FIG. 21, an n-type impurity such as arsenic and phosphorous is ion-implanted into the main surface of the semiconductor substrate 1 of the memory region and the low-voltage nMIS region and the high-voltage nMIS region of the peripheral circuit regions with using a resist pattern 22 as a mask, thereby forming $n^+$-type semiconductor regions 2b in the memory region in a self-aligning manner with respect to the selection gate electrodes CG of the selection nMIS (Qnc) and the memory gate electrodes MG of the memory nMIS (Qnm) and forming $n^+$-type semiconductor regions 23 in the peripheral circuit regions in a self-aligning manner with respect to the gate electrode GLn of the low-voltage nMIS and the gate electrode GHn of the high-voltage nMIS. By this means, in the memory region, the drain region Drm made up of the $n^-$-type semiconductor regions 2ad and the $n^+$-type semiconductor region 2b and the source regions Srm made up of the $n^-$-type semiconductor regions 2as and the $n^+$-type semiconductor regions 2b are formed. Moreover, in the peripheral circuit regions, the source/drain regions SD of the high-voltage nMIS made up of the $n^-$-type semiconductor regions 13 and the $n^+$-type semiconductor regions 23 are formed, and the source/drain regions SD of the low-voltage nMIS made up of the $n^-$-type semiconductor regions 18 and the $n^+$-type semiconductor regions 23 are formed.

Figure 22:
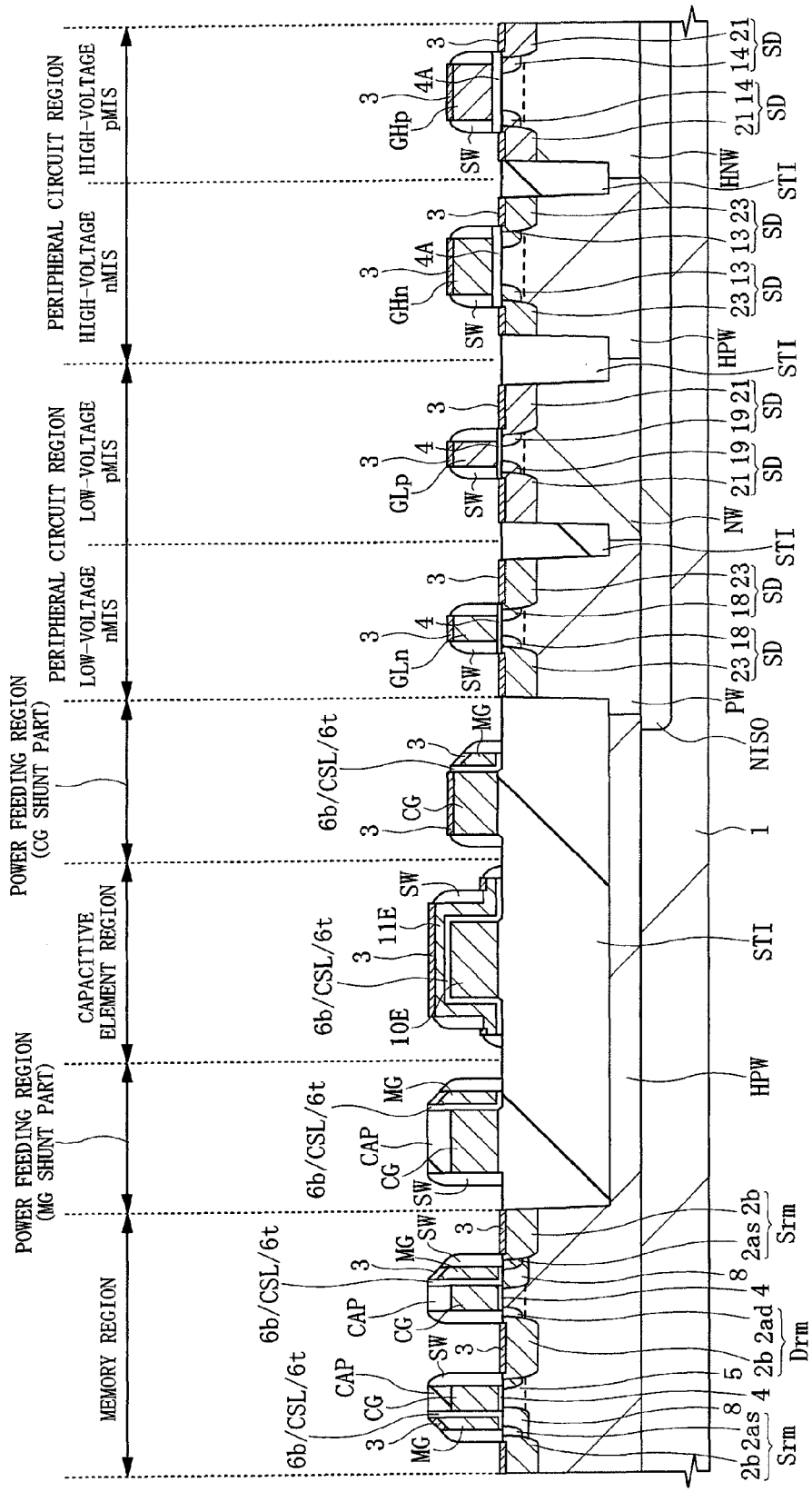
FIG. 22 is a cross-sectional view of a main part showing the same part as that of FIG. 4 in the manufacturing process of the semiconductor device having the non-volatile memory cell continued from FIG. 21.

Next, as shown in FIG. 22, the silicide layer 3 is formed by a salicide (Self Align silicide) process on the upper surfaces of the memory gate electrodes MG and the upper surfaces of the $n^+$-type semiconductor regions 2b of the memory nMIS (Qnm) in the memory region, on the upper surface of the memory gate electrode MG of the memory nMIS (Qnm) of the MG shunt part and on the upper surface of the selection gate electrode CG of the selection nMIS (Qnc) and the upper surface of the memory gate electrode MG of the memory nMIS (Qnm) of the CG shunt part in the power feeding regions, on the upper surface of the gate electrode GLn and the upper surfaces of the $n^+$-type semiconductor regions 23 of the low-voltage nMIS, on the upper surface of the gate electrode GLp and the upper surfaces of the $p^+$-type semiconductor regions 21 of the low-voltage pMIS, on the upper surface of the gate electrode GHn and the upper surfaces of the $n^+$-type semiconductor regions 23 of the high-voltage nMIS and on the upper surface of the gate electrode GHp and the upper surfaces of the $p^+$-type semiconductor regions 21 of the high-voltage pMIS in the peripheral circuit regions, and on the upper surface of the part of the upper electrode 11E which is not planarly overlapped with the selection gate electrode CG and the sidewalls SW in the capacitive element region. For example, nickel silicide or cobalt silicide is used as the silicide layer 3.

By forming the silicide layers 3, the contact resistance between the silicide layers 3 and the plugs and others formed on the silicide layers 3 can be reduced. Moreover, in the memory region, the resistances of the memory gate electrode MG, the source regions Srm and the drain region Drm of the memory nMIS (Qnm) themselves can be reduced. Furthermore, in the peripheral circuit regions, the resistances of the gate electrode GLn of the low-voltage nMIS, the gate electrode GLp of the low-voltage pMIS, the gate electrode GHn of the high-voltage nMIS and the gate electrode GHp of the high-voltage pMIS themselves and the resistances of the source/drain regions SD themselves can be reduced.

Figure 23:
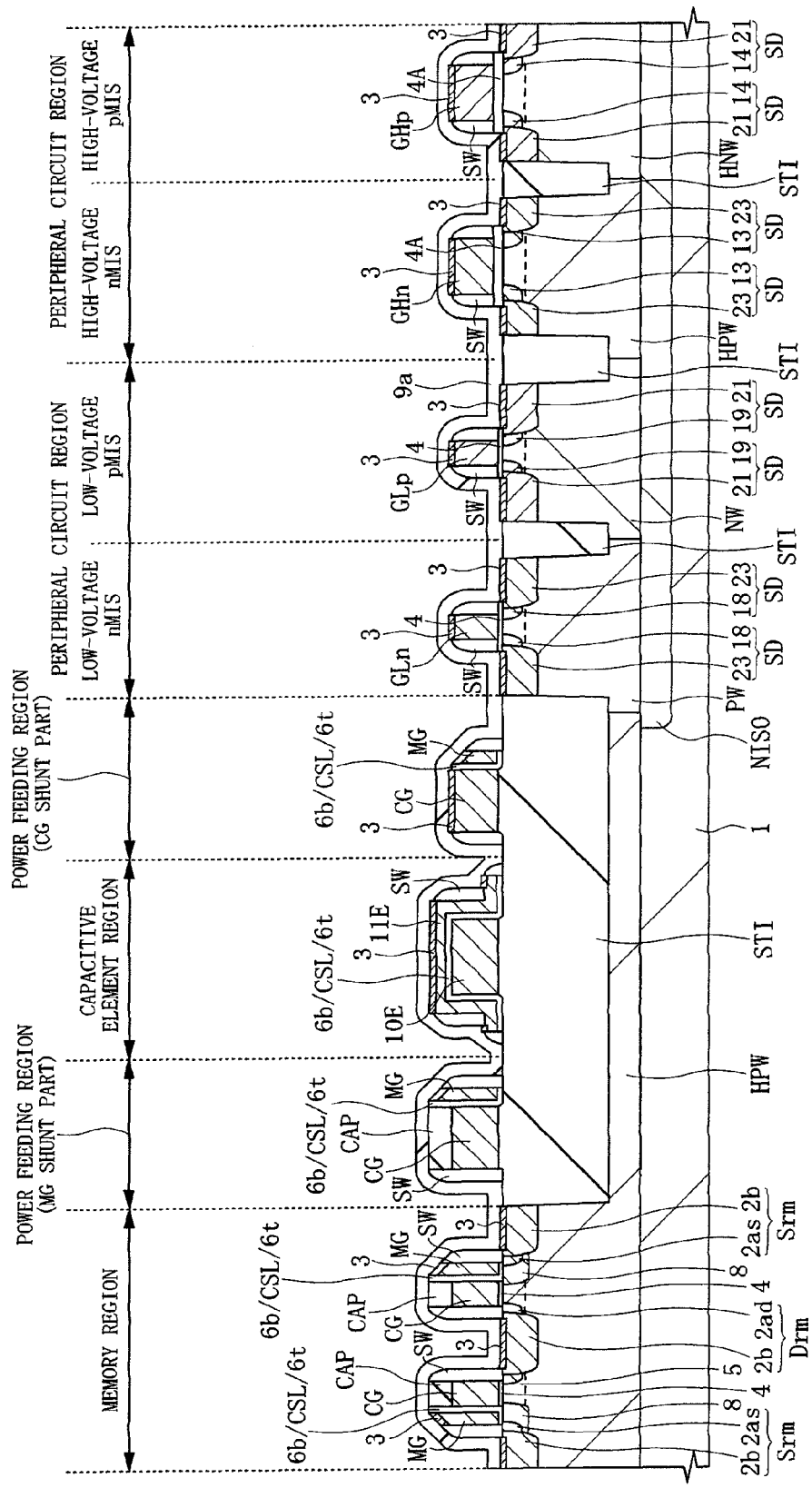
FIG. 23 is a cross-sectional view of a main part showing the same part as that of FIG. 4 in the manufacturing process of the semiconductor device having the non-volatile memory cell continued from FIG. 22.

Next, as shown in FIG. 23, the silicon nitride film 9a is deposited as an insulating film on the main surface of the semiconductor substrate 1 by the CVD method. The silicon nitride film 9a functions as an etching stopper in the formation of contact holes described later.

Figure 24:
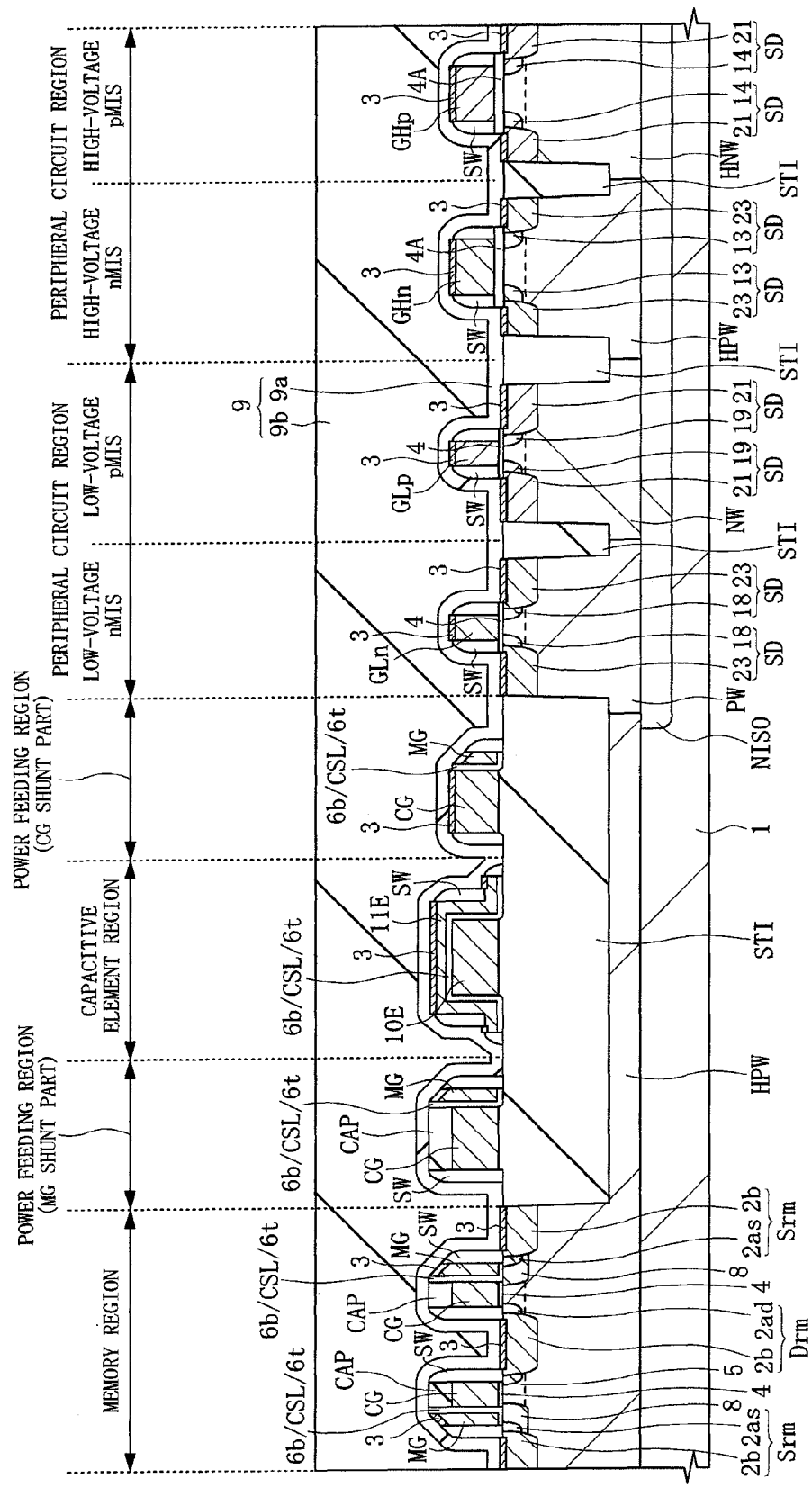
FIG. 24 is a cross-sectional view of a main part showing the same part as that of FIG. 4 in the manufacturing process of the semiconductor device having the non-volatile memory cell continued from FIG. 23.

Subsequently, as shown in FIG. 24, the silicon oxide film 9b is deposited as an insulating film by the CVD method, thereby forming the interlayer insulating film 9 made up of the silicon nitride film 9a and the silicon oxide film 9b.

Figure 25:
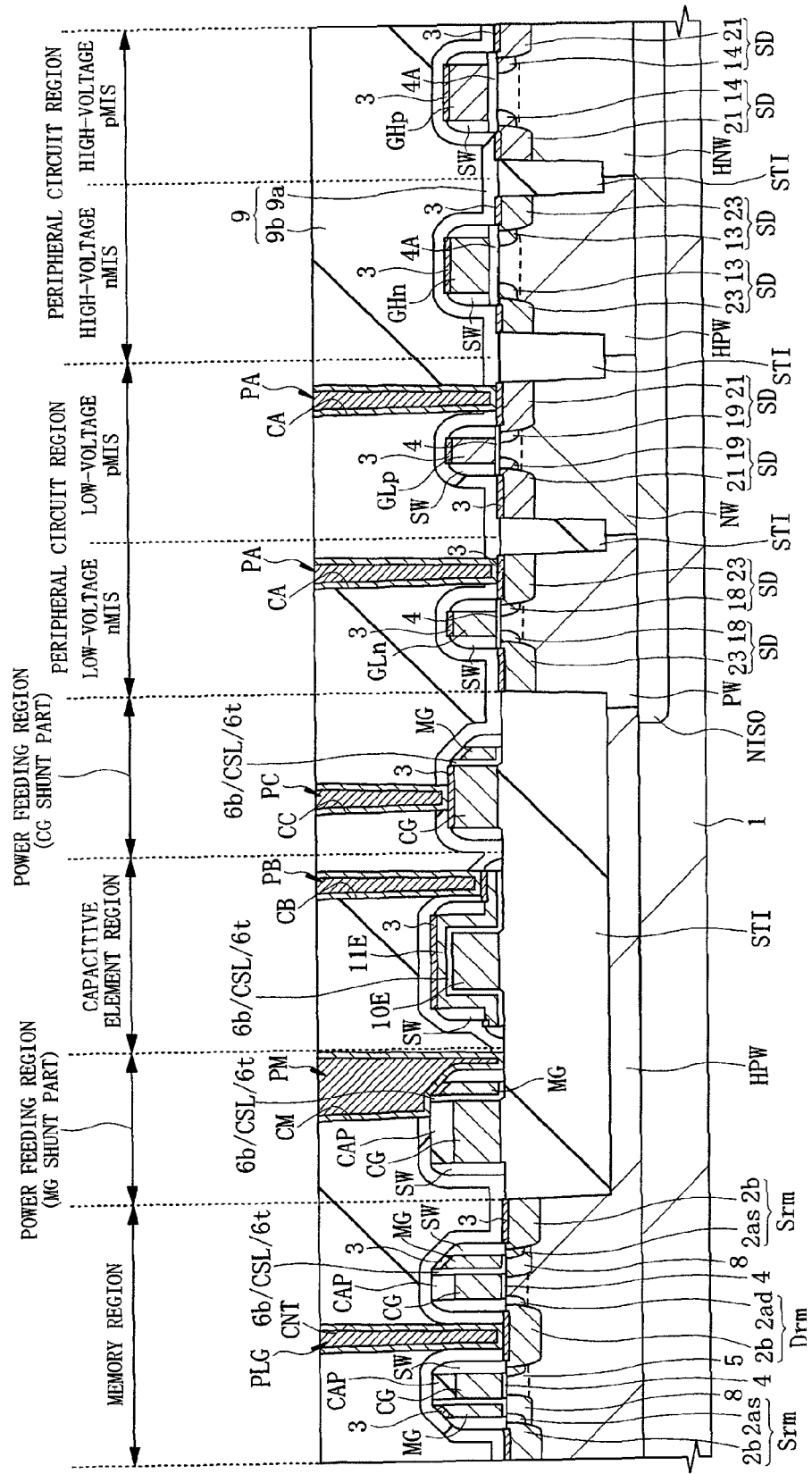
FIG. 25 is a cross-sectional view of a main part showing the same part as that of FIG. 4 in the manufacturing process of the semiconductor device having the non-volatile memory cell continued from FIG. 24.
Figure 26:
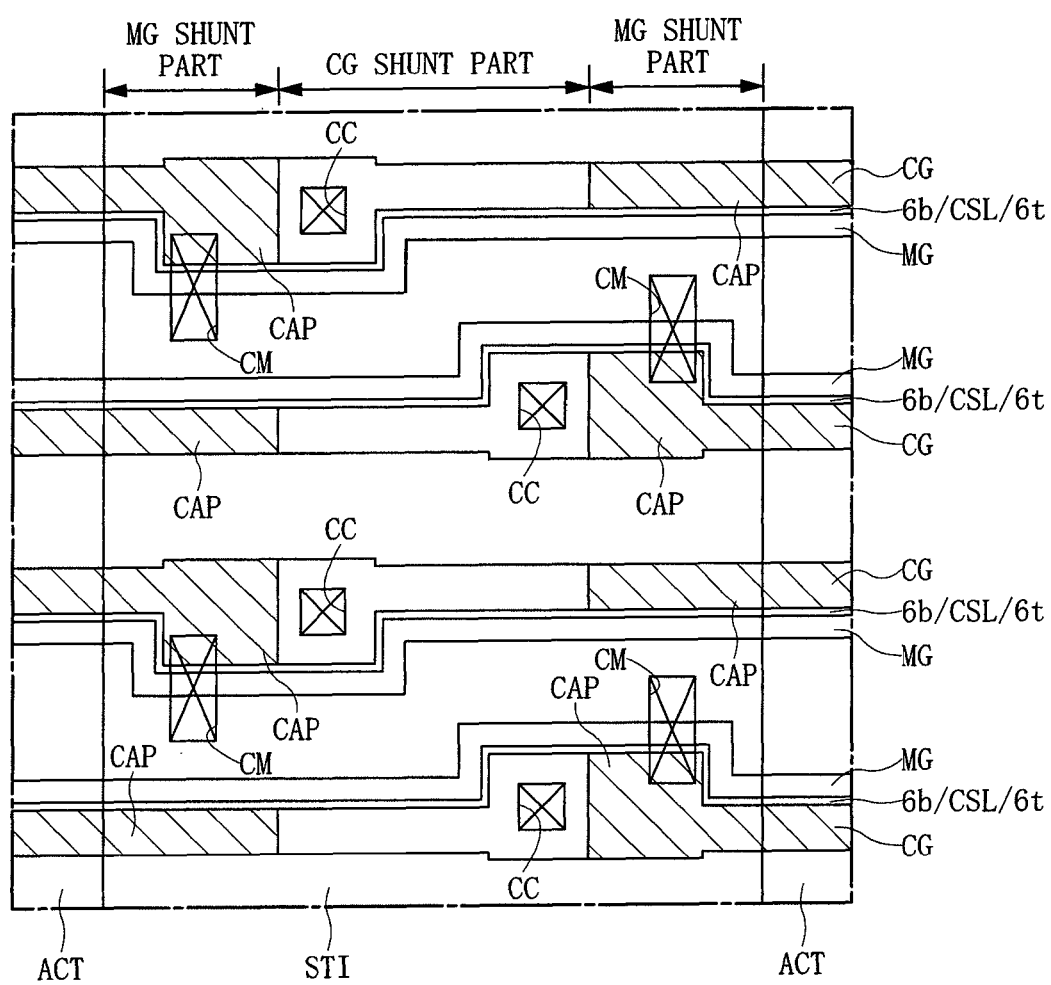
FIG. 26 is a plan view of a main part showing the same part as that of FIG. 5 in the manufacturing process of the semiconductor device having the non-volatile memory cell continued from FIG. 24.

Next, as shown in FIG. 25 and FIG. 26, in the memory region, the contact hole (third contact hole) CNT which reaches the silicide layer 3 on the drain region Drm is formed in the interlayer insulating film 9. At the same time, in the power feeding regions, the contact hole (second contact hole) CC which reaches the silicide layer 3 on the selection gate electrode CG of the selection nMIS (Qnc) of the CG shunt part is formed and the contact hole (first contact hole) CM which reaches the silicide layer 3 on the memory gate electrode MG of the memory nMIS (Qnm) of the MG shunt part is formed in the interlayer insulating film 9. The contact hole CM formed in the MG shunt part has the shape that is placed over the selection gate electrode CG in consideration of the alignment margin, dimension variation margin and others of the memory gate electrode MG and the contact hole CM. However, since the cap insulating film CAP is formed on the upper surface of the selection gate electrode CG, the contact hole CM is not connected to the selection gate electrode CG.

Furthermore, in the peripheral circuit regions, contact holes CA which reach the silicide layers 3 on the respective gate electrodes (GHn, GHp, GLn and GLp) and source/drain regions SD of the high-voltage nMIS, the high-voltage pMIS, the low-voltage nMIS and the low-voltage pMIS are formed. In FIG. 25, in order to simplify the description, the contact holes CA which reach the source/drain regions SD of the low-voltage nMIS and the low-voltage pMIS are shown as examples.

Moreover, in the capacitive element region, contact holes CB which reach the silicide layers 3 on the respective upper surfaces of the upper electrode 11E and the lower electrode 10E are formed in the parts in which the upper electrode 11E and the lower electrode 10E are not planarly overlapped with each other. In FIG. 25, in order to simplify the description, the contact hole CB which reaches the upper electrode 11E is shown as an example.

Next, the plug PLG (third plug) is formed in the contact hole CNT, the plug PC (second plug) is formed in the contact hole CC, the plug PM (first plug) is formed in the contact hole CM, a plug PA is formed in the contact hole CA, and a plug PB is formed in the contact hole CB. The plugs PLG, PC, PM, PA and PB are composed of, for example, a stacked film made up of a relatively-thin barrier film which is made of a stacked film of titanium and titanium nitride and a relatively-thick conductive film which is formed so as to be surrounded by the barrier film and is made of tungsten, aluminum or the like. Then, the first-layer wiring (illustration omitted) containing, for example, copper or aluminum as a main component is formed on the interlayer insulating film 9. In this manner, memory cells, capacitive elements and the low-voltage nMIS, the low-voltage pMIS, the high-voltage nMIS and the high-voltage nMIS formed in the peripheral circuit regions are approximately completed.

Thereafter, the semiconductor device having the non-volatile memory is manufactured through the normal manufacturing process of a semiconductor device.

Second Embodiment

A point different from the above-described first embodiment is that a thermal oxidation film is formed between the selection gate electrode CG and the cap insulating film CAP of the MG shunt part. More specifically, in the above-described first embodiment, the cap insulating film CAP is formed to be in contact with the selection gate electrode CG of the MG shunt part. However, in the present second embodiment, the thermal oxidation film which has a thickness of, for example, about 5 to 10 nm and is made of silicon oxide is formed between the selection gate electrode CG and the cap insulating film CAP made of, for example, silicon nitride, silicon oxide, silicon oxide containing nitrogen or silicon carbide of the MG shunt part. The thermal oxidation film is formed by subjecting the conductive film 10n constituting the selection gate electrode CG to thermal oxidation treatment, and the cap insulating film CAP is formed by the CVD method. Therefore, the etching rate of the thermal oxidation film and the etching rate of the cap insulating film CAP can be set to mutually different values. Therefore, even if the cap insulating film CAP on the selection gate electrode CG is ground down due to over-etching of the silicon nitride film 9a when the contact hole CM which reaches the silicide layer 3 on the memory gate electrode MG is to be formed in the interlayer insulating film 9 in the MG shunt part, since it is possible to make the thermal oxidation film function as an etching stopper film, it is possible to prevent the contact hole CM from reaching the selection gate electrode CG and to prevent the electrical connection between the plug PM in the contact hole CM and the selection gate electrode CG.

Particularly, in the case where the cap insulating film CAP is formed of silicon nitride, the cap insulating film CAP and the silicon nitride film 9a are both made of silicon nitride. Therefore, it is supposed that the cap insulating film CAP is further ground down by the etching in the formation of the contact hole CM. Even in this case, however, selectivity in the etching can be obtained between silicon nitride and silicon oxide, and therefore, by forming the thermal oxidation film made of silicon oxide on the selection gate electrode CG, the thermal oxidation film effectively works as an etching stopper film even when the cap insulating film CAP on the selection gate electrode CG is ground down due to over-etching.

Next, a method of manufacturing a semiconductor device having a non-volatile memory cell according to the second embodiment of the present invention will be described in order of steps with reference to FIG. 28 to FIG. 32. FIG. 28 to FIG. 32 are cross-sectional views of a main part of the memory region, the power feeding regions (MG shunt part and CG shunt part), the capacitive element region and the peripheral circuit regions (low-voltage nMIS region, low-voltage pMIS region, high-voltage nMIS region and high-voltage pMIS region) in the manufacturing process of the semiconductor device. Note that, since the manufacturing process up to the formation of the gate insulating film 4 on the main surface of the semiconductor substrate 1 of the memory region and the main surface of the semiconductor substrate 1 of the low-voltage nMIS region and the low-voltage pMIS region is similar to that of the above-described first embodiment, the description thereof is omitted.

Figure 28:
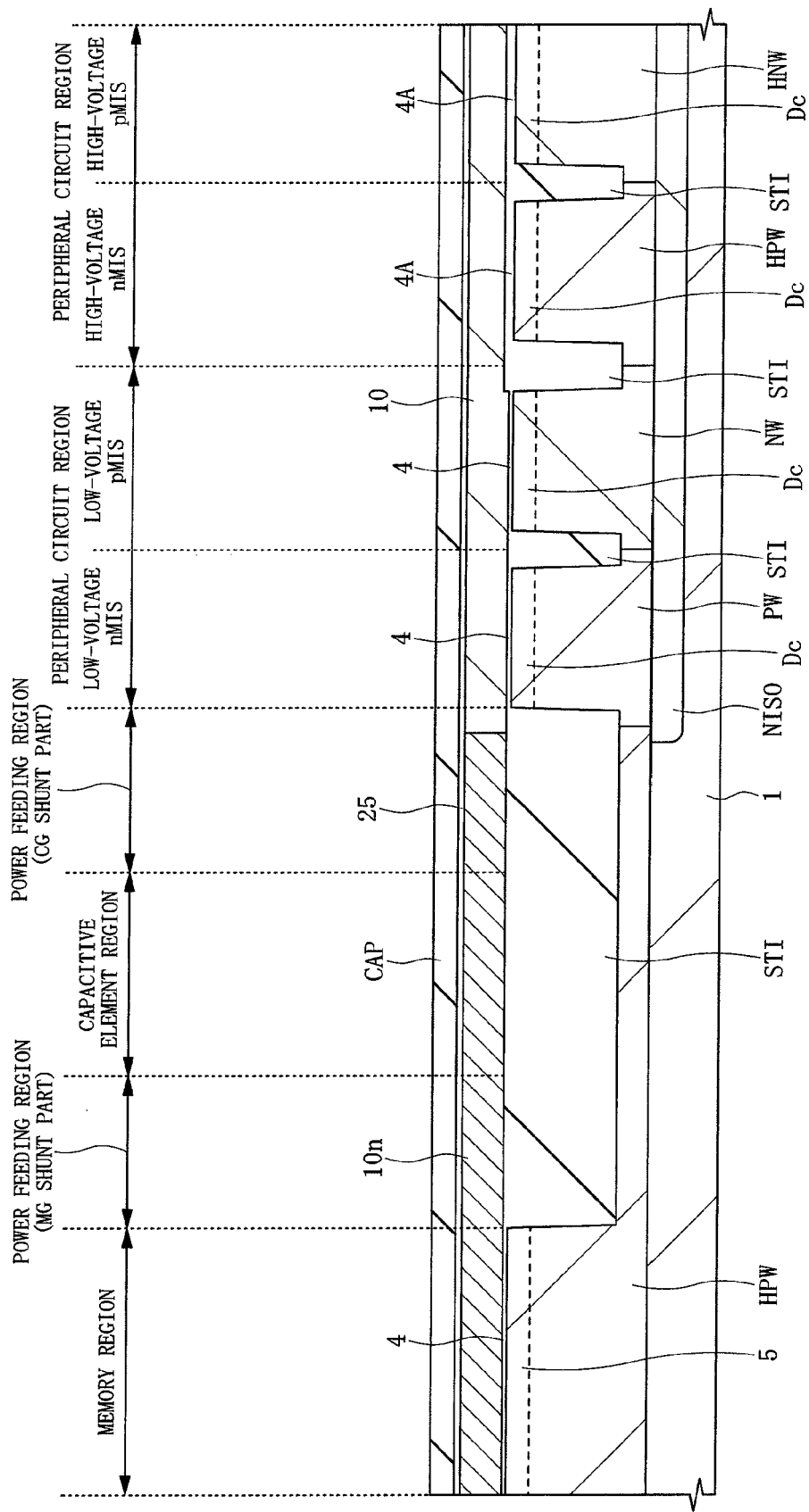
FIG. 28 is a cross-sectional view of a main part of a semiconductor substrate showing a manufacturing process of the semiconductor device having a non-volatile memory cell according to a second embodiment of the present invention.

Next, as shown in FIG. 28, after a conductive film 10 made of, for example, amorphous silicon is deposited on the main surface of the semiconductor substrate 1 by the CVD method, an n-type impurity is introduced into the conductive film 10 of the memory region, the power feeding region and the capacitive element region by the ion implantation method or the like, thereby forming an n-type conductive film 10n. Subsequently, the semiconductor substrate 1 is subjected to thermal oxidation treatment, thereby forming a thermal oxidation film (sixth insulating film) 25 on the surfaces of the conductive films 10 and 10n. The thermal oxidation film 25 is made of, for example, silicon oxide and has a thickness of, for example, 5 to 10 nm. Subsequently, a cap insulating film CAP is deposited on the conductive films 10 and 10n by the CVD method.

The cap insulating film CAP is made of, for example, silicon nitride, silicon oxide, silicon oxide containing nitrogen or silicon carbide and has a thickness of, for example, 50 nm.

Figure 29:
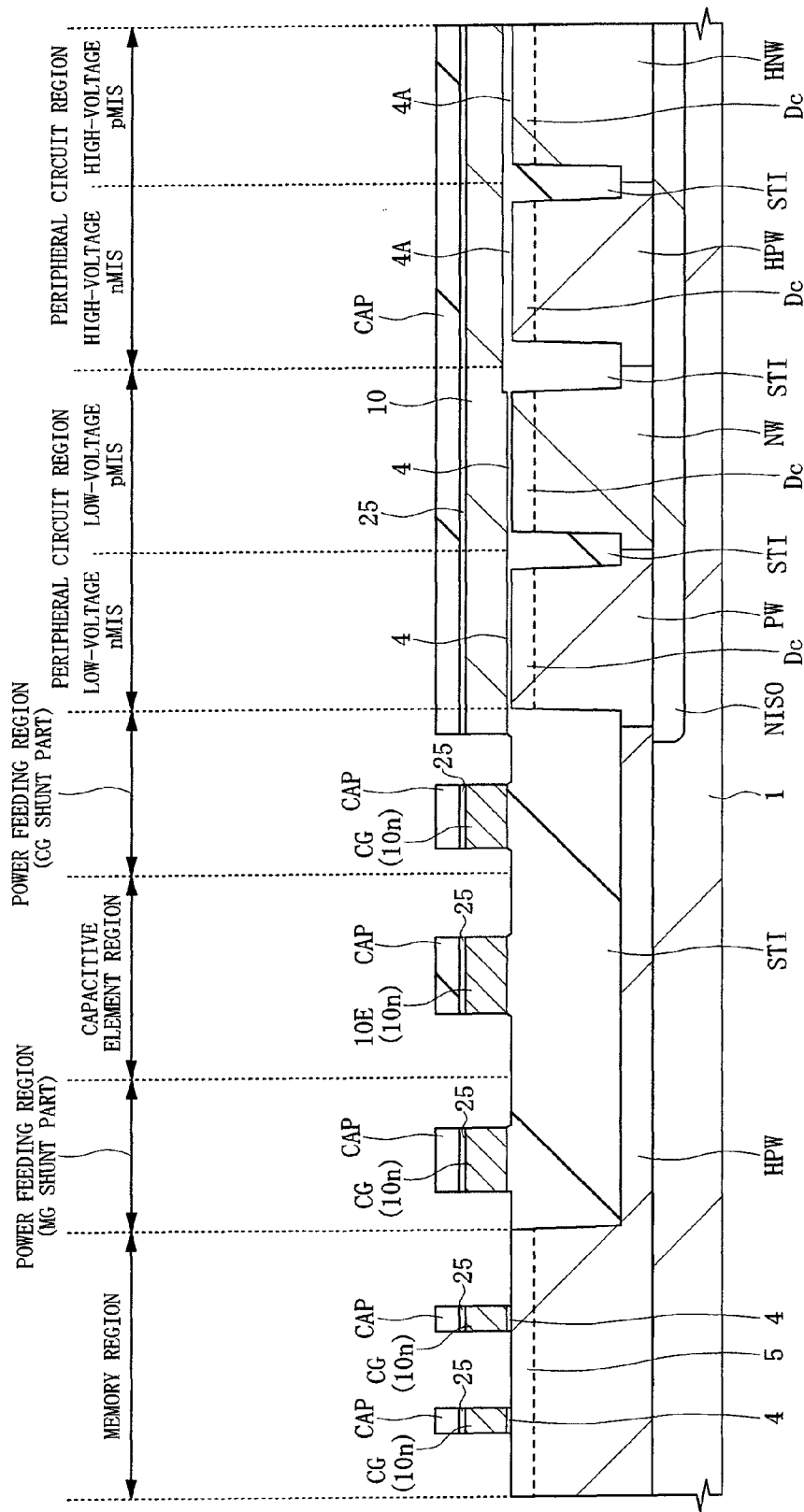
FIG. 29 is a cross-sectional view of a main part showing the same part as that of FIG. 28 in the manufacturing process of the semiconductor device having the non-volatile memory cell continued from FIG. 28.

Next, as shown in FIG. 29, the cap insulating film CAP, the thermal oxidation film 25 and the n-type conductive film 10n of the memory region, the power feeding region and the capacitive element region are sequentially patterned by lithography techniques and dry etching techniques. By this means, selection gate electrodes CG of selection nMIS (Qnc) made of the n-type conductive film 10n are formed in the memory region and the power feeding region. At the same time, a lower electrode 10E made of the n-type conductive film 10n is formed in the capacitive element region.

Figure 30:
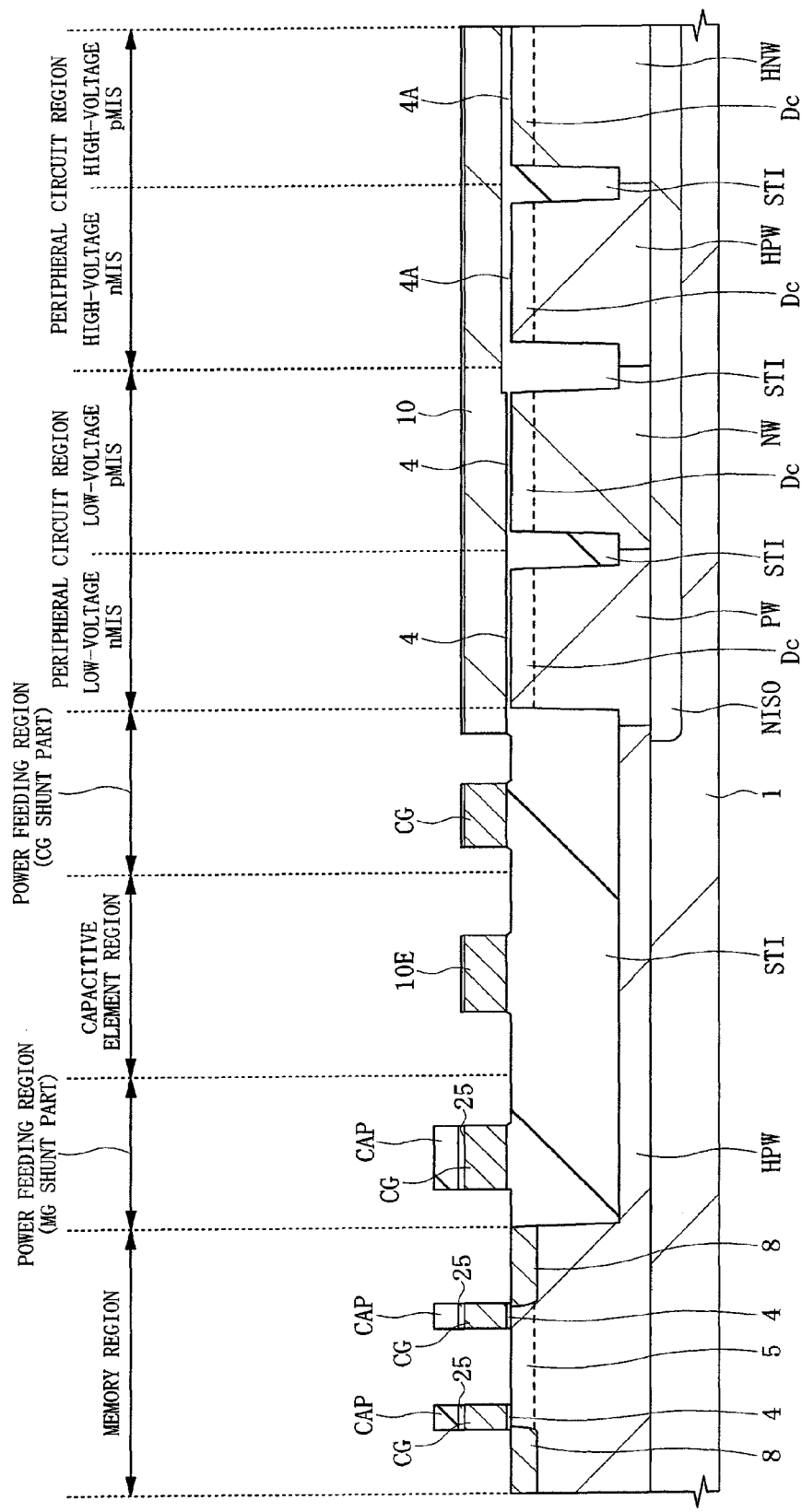
FIG. 30 is a cross-sectional view of a main part showing the same part as that of FIG. 28 in the manufacturing process of the semiconductor device having the non-volatile memory cell continued from FIG. 29.

Next, as shown in FIG. 30, the cap insulating film CAP of the CG shunt part of the power feeding region, the capacitive element region and the peripheral circuit regions is removed. Here, when the cap insulating film CAP is removed, part of the thermal oxidation film 25 of the CG shunt part of the power feeding region, the capacitive element region and the peripheral circuit regions is removed.

At this time, if the cap insulating film CAP is formed of silicon nitride, since it is difficult to obtain selectivity in dry etching between the silicon nitride and the conductive films 10 and 10n made of amorphous or polycrystalline silicon, there is a possibility that the conductive films 10 and 10n are also etched when the cap insulating film CAP is removed. However, in the present second embodiment, since the thermal oxidation film 25 is formed on the conductive films 10 and 10n and selectivity between silicon nitride and silicon oxide in the dry etching can be obtained, the thermal oxidation film 25 functions as an etching stopper film when the cap insulating film CAP is etched.

Next, an n-type impurity such as arsenic or phosphorous is ion-implanted into the main surface of the semiconductor substrate 1 of the memory region with using the cap insulating film CAP, the selection gate electrode CG of the selection nMIS (Qnc) and a resist pattern as a mask, thereby forming n-type semiconductor regions 8 for forming the channels of the memory nMIS (Qnm).

Figure 31:
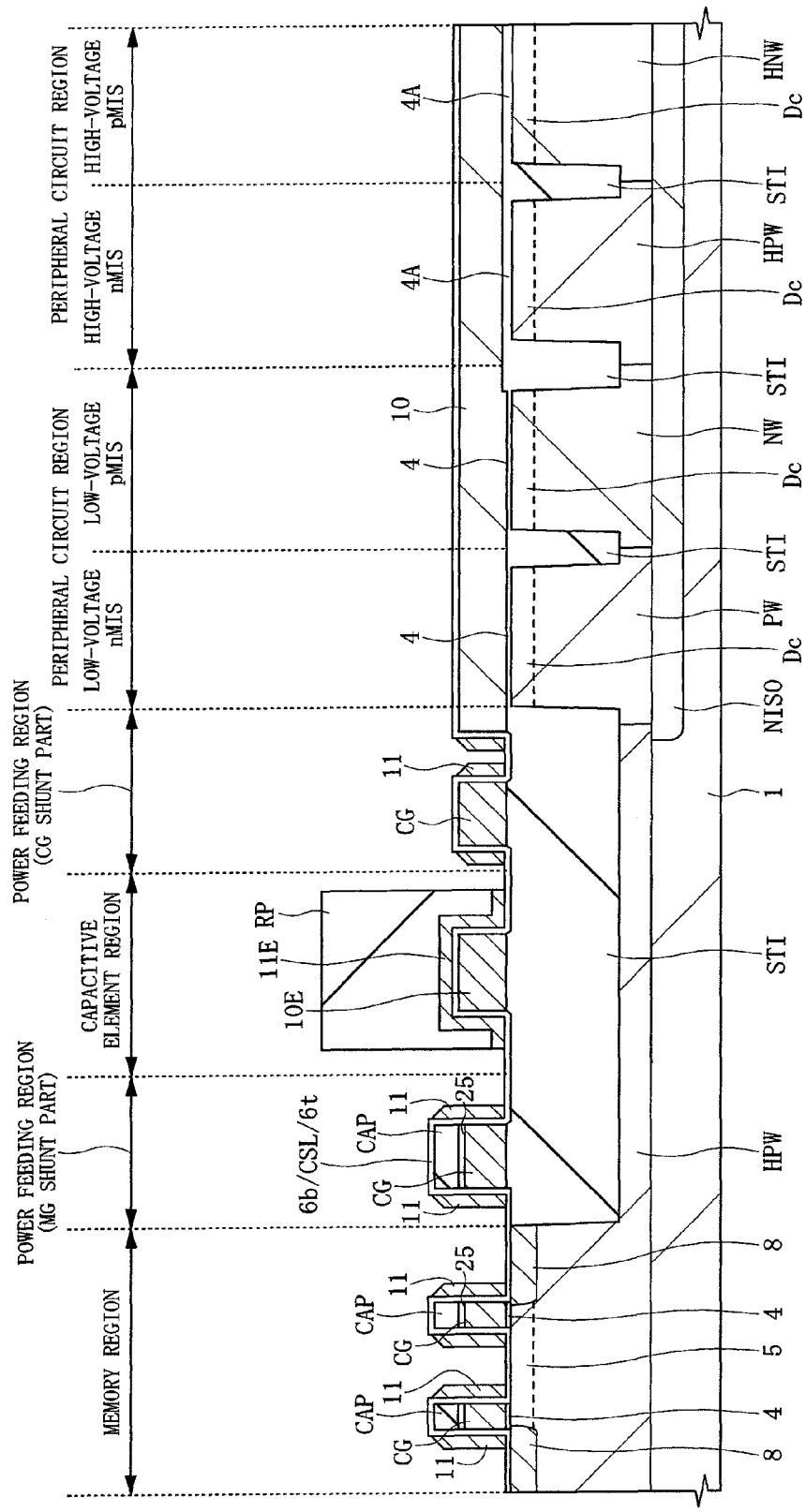
FIG. 31 is a cross-sectional view of a main part showing the same part as that of FIG. 28 in the manufacturing process of the semiconductor device having the non-volatile memory cell continued from FIG. 30.

Next, as shown in FIG. 31, the thermal oxidation film 25 remaining in the CG shunt part of the power feeding region, the capacitive element region and the peripheral circuit regions is completely removed. In the peripheral circuit regions, a silicide layer 3 needs to be formed on the respective gate electrodes of the low-voltage nMIS, the low-voltage pMIS, the high-voltage nMIS and the high-voltage pMIS which are formed in later steps. Therefore, the thermal oxidation film 25 of the peripheral circuit regions has to be removed in this step. Also, if the thermal oxidation film 25 remains in the capacitive element region, a dielectric film between the lower electrode 10E and an upper electrode formed in a later step becomes too thick, and the capacitance value thereof is reduced. Therefore, the thermal oxidation film 25 of the capacitive element region has to be removed in this step.

Next, for example, after an insulating film 6b made of silicon oxide, a charge accumulating layer CSL made of silicon nitride and an insulating film 6t made of silicon oxide are sequentially formed on the main surface of the semiconductor substrate 1, in the memory region and the MG shunt part of the power feeding region, sidewalls 11 are formed on the both side surfaces of the stacked films made up of the cap insulating films CAP and the selection gate electrodes CG of the selection nMIS (Qnc) via the insulating films 6b and 6t and the charge accumulating layer CSL. At the same time, in the CG shunt part of the power feeding region, sidewalls 11 are formed on the both side surfaces of the selection gate electrode CG of the selection nMIS (Qnc) via the insulating films 6b and 6t and the charge accumulating layer CSL. Furthermore, in the capacitive element region, with using a resist pattern RP as a mask, an upper electrode 11E is formed so as to cover the lower electrode 10E.

Next, in accordance with the manufacturing process similar to that of the above-described first embodiment (see FIG. 12 and FIG. 13), in the memory region and the MG shunt part of the power feeding region, the memory gate electrodes MG (sidewalls 11) of the memory nMIS (Qnm) are formed only on the one side surfaces of the stacked films made up of the cap insulating films CAP and the selection gate electrodes CG of the selection nMIS (Qnc), and at the same time, in the CG shunt part of the power feeding region, the memory gate electrode MG (sidewall 11) of the memory nMIS (Qnm) is formed only on the one side surface of the selection gate electrode CG of the selection nMIS (Qnc).

Next, in accordance with the manufacturing process similar to that of the above-described first embodiment (see FIG. 14 and FIG. 15), the conductive film 10 of the low-voltage nMIS region and the high-voltage nMIS region of the peripheral circuit regions is changed to an n-type conductive film 10na, and the conductive film 10 of the low-voltage pMIS region and the high-voltage pMIS region of the peripheral circuit regions is changed to a p-type conductive film 10p. Thereafter, the conductive films 10na and 10p of the peripheral circuit regions are patterned by lithography techniques and dry etching techniques, thereby forming a gate electrode GLn of the low-voltage nMIS made of the conductive film 10na, a gate electrode GLp of the low-voltage pMIS made of the conductive film 10p, a gate electrode GHn of the high-voltage nMIS made of the conductive film 10na and a gate electrode GHp of the high-voltage pMIS made of the conductive film 10p.

Next, in accordance with the manufacturing process similar to that of the above-described first embodiment (see FIG. 15 to FIG. 22), in the memory region, a drain region Drm made up of an n⁻-type semiconductor region 2ad and an n⁺-type semiconductor region 2b and source regions Srm made up of n⁻-type semiconductor regions 2as and n⁺-type semiconductor regions 2b are formed, and in the peripheral circuit regions, source/drain regions SD of the high-voltage nMIS made up of n⁻-type semiconductor regions 13 and n⁺-type semiconductor regions 23 are formed, and source/drain regions SD of low-voltage nMIS made up of n⁻-type semiconductor regions 18 and n⁺-type semiconductor regions 23 are formed. Furthermore, the silicide layers 3 are formed in predetermined regions.

Next, in accordance with the manufacturing process similar to that of the above-described first embodiment (see FIG. 23 and FIG. 24), a silicon nitride film 9a is deposited as an insulating film on the main surface of the semiconductor substrate 1 by the CVD method. The silicon nitride film 9a functions as an etching stopper in the formation of contact holes described later. Subsequently, a silicon oxide film 9b is deposited as an insulating film by the CVD method, thereby forming an interlayer insulating film 9 made up of the silicon nitride film 9a and the silicon oxide film 9b.

Figure 32:
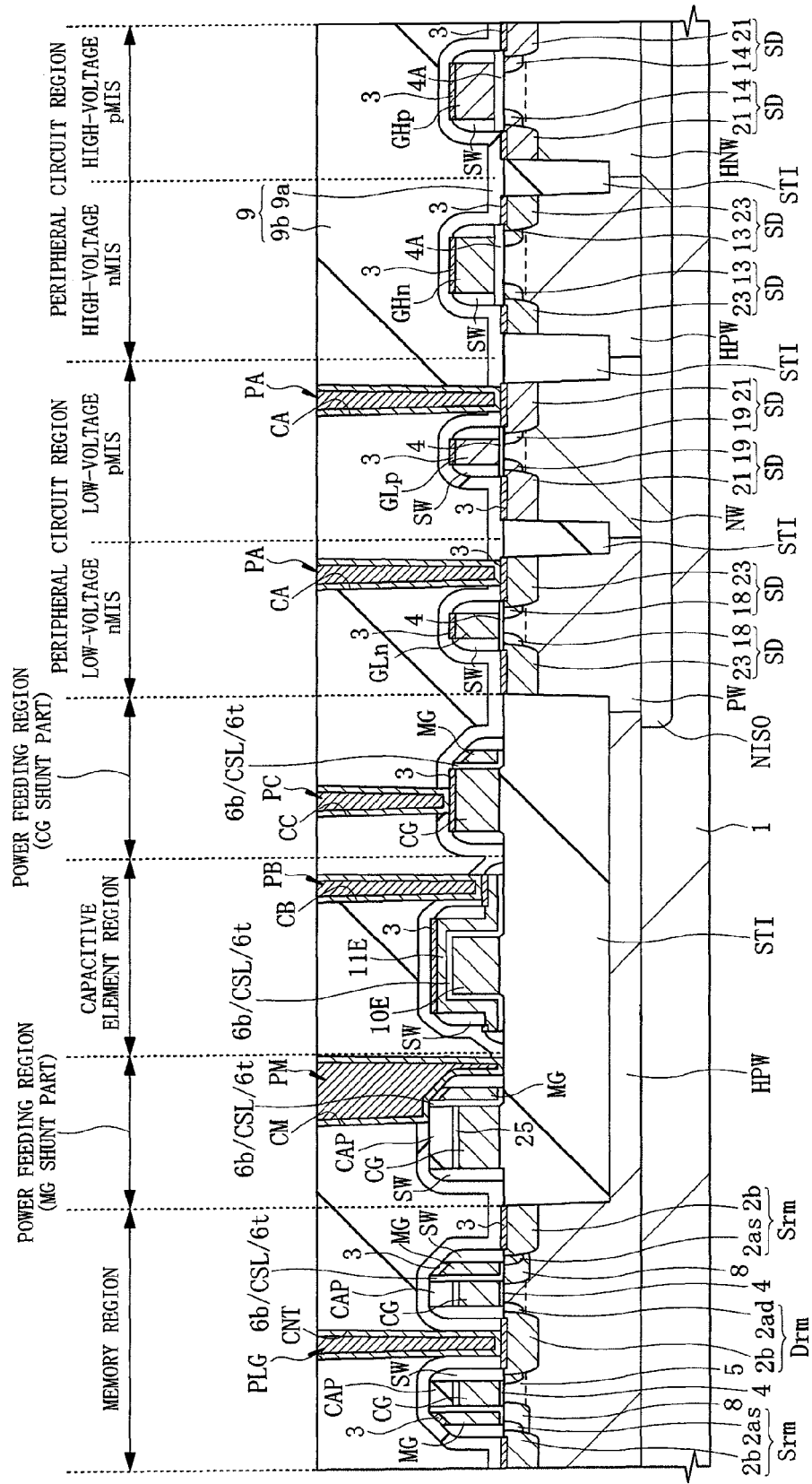
FIG. 32 is a cross-sectional view of a main part showing the same part as that of FIG. 28 in the manufacturing process of the semiconductor device having the non-volatile memory cell continued from FIG. 31.

Next, as shown in FIG. 32, the silicon oxide film 9b and the silicon nitride film 9a are sequentially etched by lithography techniques and dry etching techniques, thereby forming a contact hole CNT, which reaches the silicide layer 3 on the drain region Drm, in the interlayer insulating film 9 in the memory region. At the same time, in the power feeding regions, a contact hole CC which reaches the silicide layer 3 on the selection gate electrode CG of the selection nMIS (Qnc) of the CG shunt part is formed, and a contact hole CM which reaches the silicide layer 3 on the memory gate electrode MG of the memory nMIS (Qnm) of the MG shunt part is formed in the interlayer insulating film 9.

The contact hole CM formed in the MG shunt part has the shape that is placed over the selection gate electrode CG in consideration of the alignment margin, dimension variation margin and others of the memory gate electrode MG and the contact hole CM. However, since the cap insulating film CAP is formed on the upper surface of the selection gate electrode CG, the contact hole CM is not connected to the selection gate electrode CG. Furthermore, since the silicon oxide film 9b and the silicon nitride film 9a constituting the interlayer insulating film 9 are sequentially etched when the contact hole CM is formed, it is supposed that the cap insulating film CAP is etched in the over-etching of the silicon nitride film 9a. However, since the thermal oxidation film 25, which functions as an etching stopper film of the cap insulating film CAP, is formed between the selection gate CG and the cap insulating film CAP of the MG shunt part, the contact hole CM is not connected to the selection gate electrode CG.

Moreover, in the peripheral circuit regions, contact holes CA which reach the silicide layers 3 on the respective gate electrodes (GHn, GHp, GLn and GLp) and source/drain regions SD of the high-voltage nMIS, the high-voltage pMIS, the low-voltage nMIS and the low-voltage pMIS are formed. In FIG. 32, in order to simplify the description, the contact holes CA which reach the source/drain regions SD of the low-voltage nMIS and the low-voltage pMIS are shown as examples.

Moreover, in the capacitive element region, contact holes CB which reach the silicide layers 3 on the respective upper surfaces of the upper electrode 11E and the lower electrode 10E are formed in the parts in which the upper electrode 11E and the lower electrode 10E are not planarly overlapped with each other. In FIG. 32, in order to simplify the description, the contact hole CB which reaches the upper electrode 11E is shown as an example.

Next, the plug PLG (third plug) is formed in the contact hole CNT, the plug PC (second plug) is formed in the contact hole CC, the plug PM (first plug) is formed in the contact hole CM, a plug PA is formed in the contact hole CA, and a plug PB is formed in the contact hole CB. Then, the first-layer wiring (illustration omitted) containing, for example, copper or aluminum as a main component is formed on the interlayer insulating film 9. In this manner, memory cells, capacitive elements and the low-voltage nMIS, the low-voltage pMIS, the high-voltage nMIS and the high-voltage nMIS formed in the peripheral circuit regions are approximately completed.

Thereafter, the semiconductor device having the non-volatile memory is manufactured through the normal manufacturing process of a semiconductor device.

Third Embodiment

A point different from the above-described first embodiment is that the contact hole CNT which reaches the silicide layer 3 on the drain region Drm of the memory region has the shape that is placed over the cap insulating films CAP formed on the upper surfaces of the selection gate electrodes CG.

Figure 33:
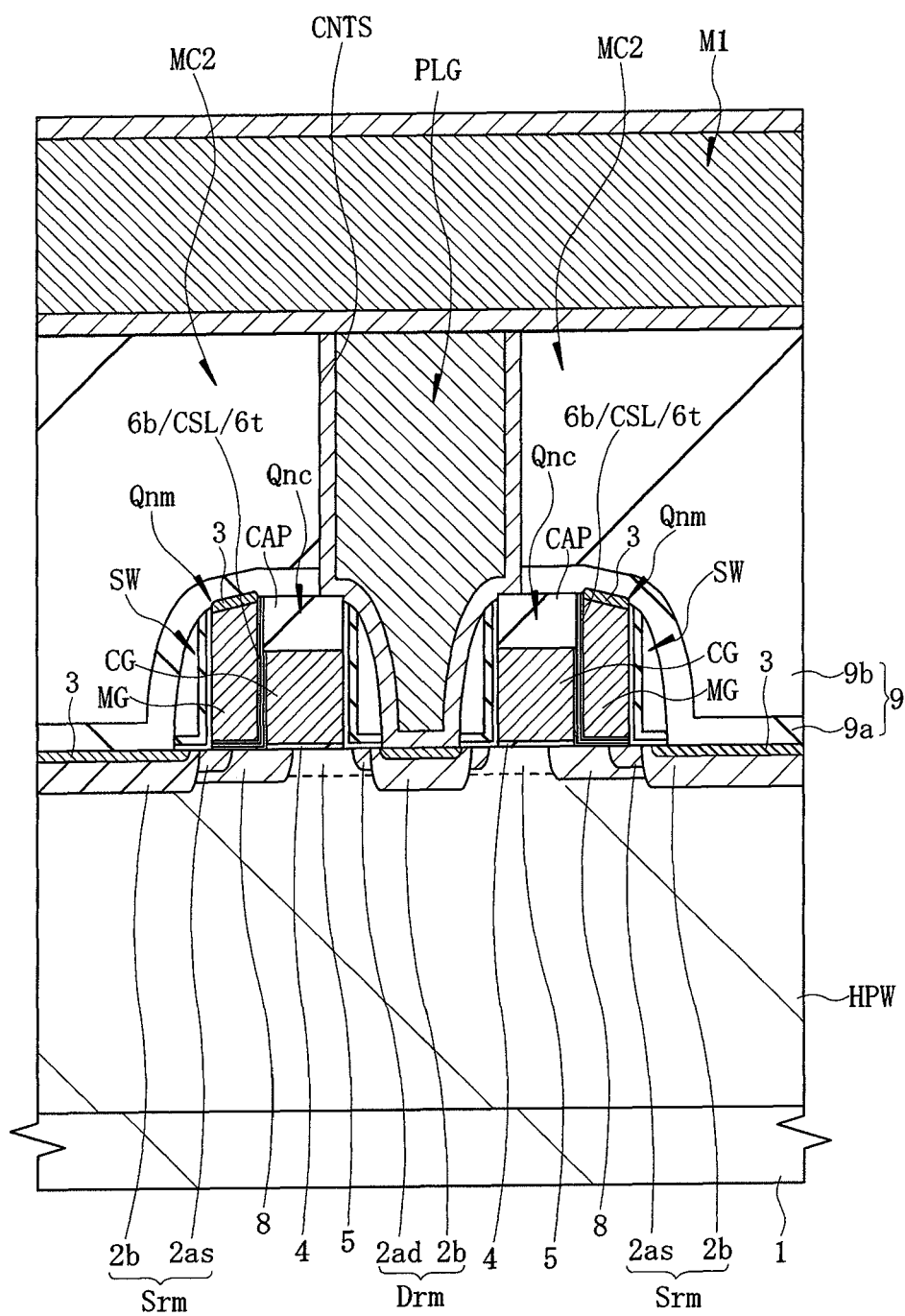
FIG. 33 is a cross-sectional view of a main part of a non-volatile memory cell according to a third embodiment of the present invention showing a section taken by cutting a channel of the non-volatile memory cell along the direction that intersects with a memory gate electrode.

An example of the structure of a non-volatile memory cell according to the present third embodiment will be described with reference to FIG. 33 and FIG. 34. FIG. 33 is a cross-sectional view of a main part of the non-volatile memory cell showing a section taken by cutting a channel along the direction that intersects with a memory gate electrode, and FIG. 34 is a plan view of a main part of the memory region.

Figure 34:
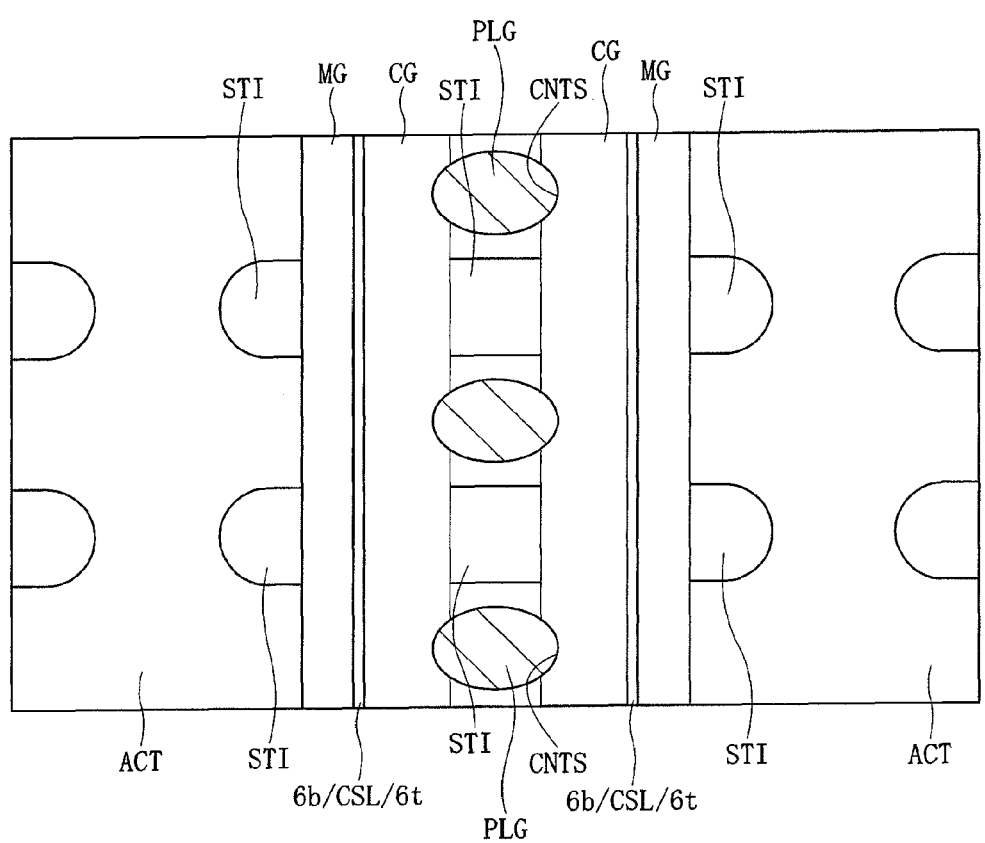
FIG. 34 is a plan view of a main part of a memory region of the non-volatile memory cell according to the third embodiment of the present invention.

As shown in FIG. 33 and FIG. 34, like in the above-described first embodiment (see FIG. 1), selection nMIS (Qnc) and memory nMIS (Qnm) of memory cells MC2 are disposed in an active region of a main surface of a semiconductor substrate 1.

The memory cells MC2 are covered with an interlayer insulating film 9. The interlayer insulating film 9 is made of a third insulating film and is composed of, for example, a stacked film of a silicon nitride film 9a and a silicon oxide film 9b. A contact hole (fourth contact hole) CNTS which reaches the drain region Drm is formed in the interlayer insulating film 9.

In the memory cell according to the present third embodiment, the diameter of the contact hole CNTS formed in the interlayer insulating film 9 is larger than the distance between the selection gate electrodes CG which are adjacent to each other with interposing the drain region Drm therebetween. Therefore, the contact hole CNTS has the shape that is placed over both of the adjacent selection gate electrodes CG. Accordingly, for example, compared with the memory cell (the memory cell in which the contact hole CNT is not placed over the selection gate electrode CG) MC shown in the above-described first embodiment, the memory cell (the memory cell in which the contact hole CNTS is placed over the selection gate electrode CG) MC2 shown in the present third embodiment is capable of shortening the distance between the selection gate electrodes CG which are adjacent to each other with interposing the drain region Drm therebetween because it is not necessary to take into consideration the alignment margin between the drain region Drm and the contact hole CNTS. By this means, the cell size of the memory cell MC2 can be reduced. Note that, since the cap insulating film CAP is formed on the upper surface of the selection gate electrode CG, the contact hole CNTS is not connected to the selection gate electrode CG like the contact hole CM formed in the MG shunt part of the above-described first embodiment.

For example, in the memory cell MC shown in the above-described first embodiment in which the contact hole CNT is not placed over the selection gate electrode CG, assuming that the width of the sidewall SW is 50 nm, the diameter of the part of the contact hole CNT in contact with the drain region Drm is 80 nm and the alignment margin between the drain region Drm and the contact hole CNTS is ±30 nm, 240 nm is required as the distance between the selection gate electrodes CG which are adjacent to each other with interposing the drain region Drm therebetween. On the other hand, in the memory cell MC2 shown in the present third embodiment in which the contact hole CNTS is placed over the selection gate electrode CG, assuming that the width of the sidewall SW is 50 nm, since it is not necessary to take into consideration the alignment margin between the drain region Drm and the contact hole CNTS, the length of the part of the contact hole CNTS in contact with the drain region Drm in the cross-sectional direction shown in FIG. 33 can be shortened to, for example, 50 nm, and the distance between the selection gate electrodes CG which are adjacent to each other with interposing the drain region Drm therebetween can be reduced to 150 nm.

Figure 35:
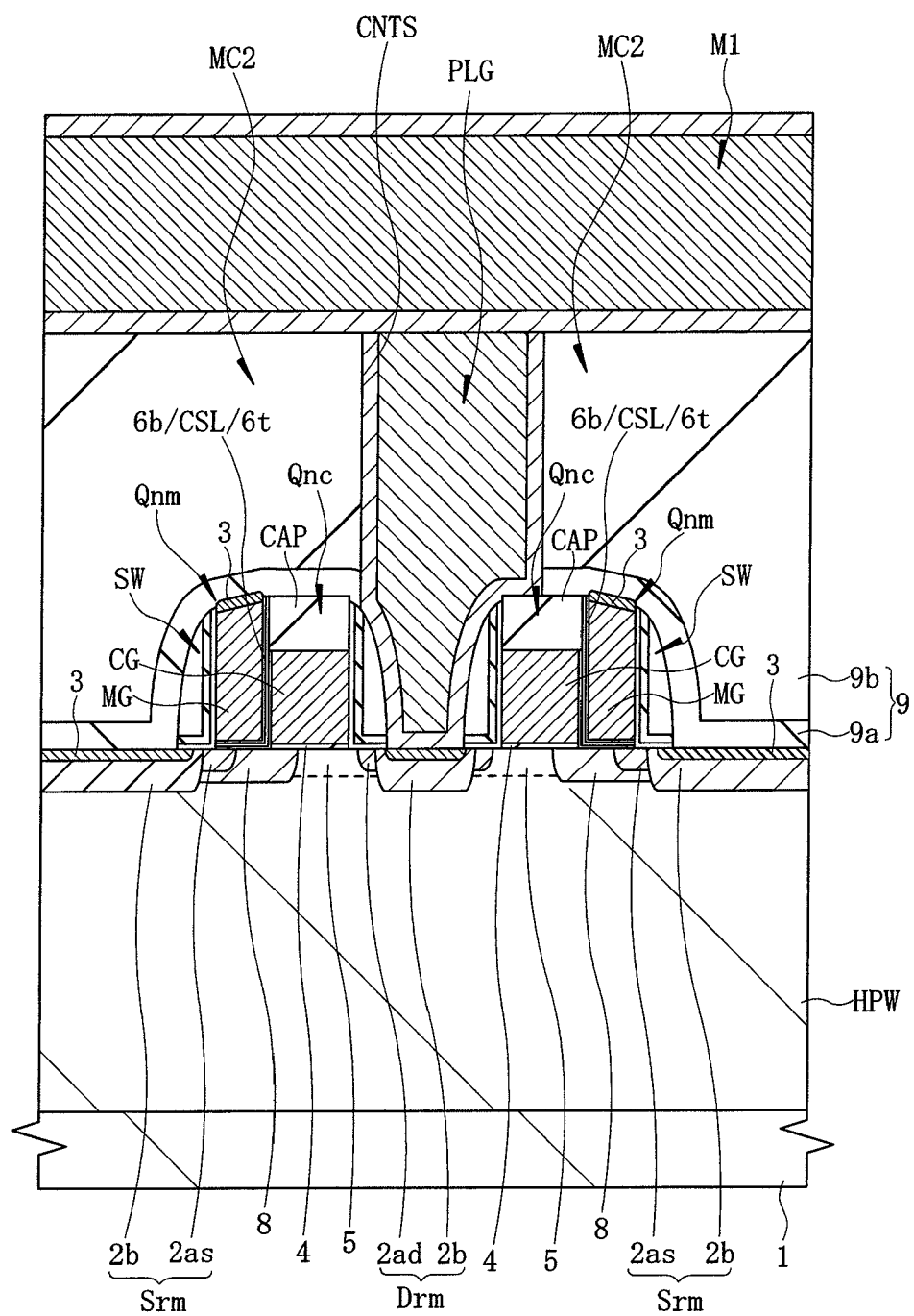
FIG. 35 is a cross-sectional view of a main part showing a first modification example of a contact hole formed in the memory region of the non-volatile memory cell according to the third embodiment of the present invention.

FIG. 35 shows a first modification example of the contact hole CNTS according to the present third embodiment. FIG. 35 is a cross-sectional view of a main part showing the same part as that of the cross-sectional view shown in FIG. 33.

In FIG. 33 shown above, the contact hole CNTS is placed over the cap insulating films CAP formed on both of the upper surfaces of the selection gate electrodes CG of the two memory cells MC2 which are adjacent to each other with interposing the drain region Drm therebetween. On the other hand, in the first modification example shown in FIG. 35, the contact hole CNTS is placed over the cap insulating film CAP formed on the upper surface of one of the selection gate electrodes CG out of the two memory cells MC2 which are adjacent to each other with interposing the drain region Drm therebetween. Even in the shape in which the contact hole CNTS is placed over only one of the selection gate electrodes CG like this, since the other side of the contact hole CNTS is placed over the sidewall SW, the contact hole CNTS is not connected to the selection gate electrode CG.

FIG. 36 shows a second modification example of the contact hole CNTS according to the present third embodiment. FIG. 36 is a plan view of a main part showing the same part as that of the plan view shown in FIG. 34.

In FIG. 34 shown above, rectangular contact holes CNTS are designed, and the planar shape of the actually formed contact holes CNTS is an ellipse. On the other hand, in the second modification example shown in FIG. 36, square contact holes CNTS are designed, and the planar shape of the actually formed contact holes CNTS is a true circle. By this means, the distance between the adjacent selection gate electrodes CG can be further narrowed.

FIG. 37 shows a third modification example of the contact hole CNTS according to the present third embodiment. FIG. 37 is a cross-sectional view of a main part showing the same part as that of the cross-sectional view shown in FIG. 33.

In FIG. 33 shown above, the cap insulating film CAP is formed to be in contact with the selection gate electrode CG. On the other hand, in the third modification example shown in FIG. 37, a thermal oxidation film 25 is formed between the selection gate electrode CG and the cap insulating film CAP. The thermal oxidation film 25 is made of, for example, silicon oxide having a thickness of about 5 to 10 nm, and the etching rate of the thermal oxidation film and the etching rate of the cap insulating film CAP can be set to mutually different values. Therefore, when the contact hole CNTS is formed in the interlayer insulating film 9 made up of the stacked film of the silicon nitride film 9a and the silicon oxide film 9b, even if the cap insulating film CAP is ground down due to over-etching of the silicon nitride film 9a, since the thermal oxidation film 25 can function as an etching stopper film, it is possible to prevent the contact hole CNTS from reaching the selection gate electrode CG and to prevent the electrical connection between the plug PLG in the contact hole CNTS and the selection gate electrode CG.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention can be utilized in a semiconductor device having a semiconductor element provided with a first gate electrode and a second gate electrode formed to be adjacent to each other via an insulating film. Particularly, the present invention can be utilized in a semiconductor device having a memory cell with a two-transistor split gate structure.

The invention claimed is:
1. A semiconductor device having a memory cell,
wherein the memory cell comprises:
a first gate insulating film made of a first insulating film formed on a semiconductor substrate;

a selection gate electrode made of a first conductive film formed on the first gate insulating film;

a cap insulating film made of a second insulating film formed on the selection gate electrode;

a memory gate electrode made of a second conductive film formed in a sidewall shape on one side surface of a stacked film made up of the cap insulating film and the selection gate electrode; and a second gate insulating film formed between the stacked film made up of the cap insulating film and the selection gate electrode and the memory gate electrode and formed also between the memory gate electrode and the semiconductor substrate, in a region in which a first plug supplying a voltage to the memory gate electrode is formed, an interlayer insulating film made of a third insulating film is provided on the semiconductor substrate, the cap insulating film and the memory gate electrode, and the first plug formed by embedding a third conductive film in a first contact hole formed in the interlayer insulating film is formed so as to be electrically connected to the memory gate electrode and cover a part of the cap insulating film.

2. The semiconductor device according to claim 1, wherein the cap insulating film is made of silicon nitride, silicon oxide, silicon oxide containing nitrogen or silicon carbide.

3. The semiconductor device according to claim 1, wherein the second gate insulating film is formed of a stacked film made up of a fourth insulating film, a charge accumulating layer formed on the fourth insulating film and a fifth insulating film formed on the charge accumulating layer.

4. The semiconductor device according to claim 3, wherein the charge accumulating layer is made of silicon nitride.

5. The semiconductor device according to claim 1, wherein a MISFET is formed around the memory cell, and the MISFET includes:

a third gate insulating film made of the first insulating film formed on the semiconductor substrate; and a gate electrode formed on the third gate insulating film and made of the first conductive film.

6. The semiconductor device according to claim 1, wherein, in a region in which a second plug supplying a voltage to the selection gate electrode is formed, the cap insulating film is removed, and the second plug formed by embedding the third conductive film in a second contact hole formed in the interlayer insulating film is electrically connected to a silicide layer formed on an upper surface of the selection gate electrode.

7. The semiconductor device according to claim 1, wherein, in a region in which the memory cell is formed, a height of the selection gate electrode from a main surface of the semiconductor substrate is lower than a height of the memory gate electrode from the main surface of the semiconductor substrate.

8. The semiconductor device according to claim 1, wherein a height of the memory gate electrode from a main surface of the semiconductor substrate in a region in which the memory cell is formed and in the region in which the first plug supplying a voltage to the memory gate electrode is formed is higher than a height of the memory gate electrode from the main surface of the semiconductor substrate in the region in which a second plug supplying a voltage to the selection gate electrode is formed.

9. The semiconductor device according to claim 1, wherein, in the region in which the first plug supplying the voltage to the memory gate electrode is formed and in a region in which a second plug supplying a voltage to the selection gate electrode is formed, a device isolation part made of an insulating film is formed in the semiconductor substrate.

10. The semiconductor device according to claim 1, wherein the memory cell further comprises a drain region in the semiconductor substrate on a side of the selection gate electrode opposite to the memory gate electrode, in a region in which the memory cell is formed, the interlayer insulating film made of the third insulating film is provided on the semiconductor substrate, the cap insulating film and the memory gate electrode, and a third plug formed by embedding the third conductive film in a third contact hole formed in the interlayer insulating film is electrically connected to the drain region, and the third plug is formed also on the cap insulating film.

11. The semiconductor device according to claim 10, wherein two of the memory cells sharing the drain region are symmetrically disposed in a channel direction, and the third plug is formed on the cap insulating films of both of the two memory cells.

12. The semiconductor device according to claim 10, wherein a planar shape of the third contact hole is an ellipse or a true circle.

13. The semiconductor device according to claim 10, wherein a silicide layer is formed on the drain region, and the third plug is connected to the silicide layer.

14. The semiconductor device according to claim 1, wherein, in a region in which the memory cell is formed and in the region in which the first plug supplying the voltage to the memory gate electrode is formed, a thermal oxidation film made of a sixth insulating film is formed between the selection gate electrode and the cap insulating film.

15. The semiconductor device according to claim 14, wherein the sixth insulating film is made of silicon oxide.

* * * * *